(12) United States Patent
Almeida et al.

(10) Patent No.: US 7,409,666 B2
(45) Date of Patent: Aug. 5, 2008

(54) AUTOMATED PCB MANUFACTURING DOCUMENTATION RELEASE PACKAGE SYSTEM AND METHOD

(75) Inventors: Richard A. Almeida, Gilmanton Iron Works, NH (US); William F. Newhard, Westford, MA (US); Sergey Nikiforenko, Ayer, MA (US)

(73) Assignee: Downstream Technologies, LLC, Bolton, MA (US)

( * ) Notice: Subject to any disclaimer, the term of this patent is extended or adjusted under 35 U.S.C. 154(b) by 157 days.

(21) Appl. No.: 11/062,098

(22) Filed: Feb. 18, 2005

(65) Prior Publication Data

US 2006/0190116 A1    Aug. 24, 2006

(51) Int. Cl.
*G06F 17/50* (2006.01)
*G06F 3/00* (2006.01)
(52) U.S. Cl. .................... 716/15; 716/11; 715/700
(58) Field of Classification Search .............. 716/8, 716/15, 11; 715/200, 700
See application file for complete search history.

(56) References Cited

U.S. PATENT DOCUMENTS

2003/0221172 A1* 11/2003 Brathwaite et al. ............ 716/1
2004/0268283 A1* 12/2004 Perry et al. .................... 716/11
2005/0197807 A1*  9/2005 Nelson et al. ................... 703/1

OTHER PUBLICATIONS

AOL, "AOLserver ADP Development", Sep. 26, 2006. http://www.aolserver.com/docs/devel/tcl/adp-overview.html, pp. 1-8.*
CAD User, EDA View and Mark-up, Apr. 2004. http://www.cimmetry.com/brochures/CAD_User_AutoVue_for_EDA.pdf, pp. 1-2.*
EMSNOW, "Downstream technologies announces CAM350 release 8.6", Aug. 19, 2004. http://www.emsnow.com/newsarchives/archivedetails.cfm?ID=6081, pp. 1-3.*

* cited by examiner

*Primary Examiner*—Stacy A Whitmore
(74) *Attorney, Agent, or Firm*—Iandiorio Teska & Coleman

(57) ABSTRACT

An automated PCB manufacturing documentation release package system including a PCB database including PCB CAD data associated with a CAD file of a PCB design, and a shape engine configured to display simultaneous views of a given PCB from the PCB database including different views of the PCB and configured to retrieve the data in the PCB database and create reconfigurable objects displayable simultaneously in the forms of different views of the PCB such that any change in the design of the PCB is reflected in the different views.

34 Claims, 44 Drawing Sheets

AUTOMATED PCB MANUFACTURING DOCUMENTATION RELEASE PACKAGE SYSTEM AND METHOD

FIELD OF THE INVENTION

This invention relates to an automated documentation system for providing a manufacturing documentation release package for the fabrication and assembly of printed circuit boards (PCBs).

BACKGROUND OF THE INVENTION

A manufacturing documentation release package of a PCB typically includes, inter alia, drawings with title blocks, revision blocks, note blocks, different board views, board parts lists or components and their placement, callouts for the various parts, drill patterns, drill charts, layer stacking, and the like. The various drawings of the manufacturing documentation release package may include various board views with part reference designators, a parts list (e.g., a bill of materials) cross linked to the reference designators, note blocks for detailed assembly instructions, and callouts for detailed notes of the assembly of specific parts.

Conventional methods and systems for generating a manufacturing documentation release package for PCBs typically utilize CAD programs that are not specifically designed for creating the documentation needed for the release package. These conventional techniques typically rely on CAD programs wherein various views of the PCB circuit board are translated between CAD programs to create multiple static images of the various PCB views. The various details of documentation for the fabrication and assembly of the PCB are then often manually entered on the translated image. This process typically requires a separately copied design for each view of the PCB board which must be separately documented. A skilled PCB engineer must ensure the accuracy of the documentation release package and therefore the process of creating a single manufacturing documentation release package can take weeks to complete.

Moreover, any design changes to the PCB board mandates that the entire process be repeated (e.g., re-creating each separate image) and the supporting documentation manually re-entered because there is no link between the static images and the PCB database. The static images have no structured hierarchy for the selection and annotation of the documentation. The PCB views, chart, notes, and the like, of these images cannot be re-positioned within the document. Prior art systems and methods for creating manufacturing documentation also have no modem document authoring functionality and do not provide electronic file sharing or internet access. Moreover, the final release package is typically prepared in paper format or delivered via a PDF® file format. Finally, existing CAD systems are clearly not designed for providing documentation to create a complete manufacturing documentation release package. Prior art CAD programs such as AUTOCAD®, and the like, are cumbersome and difficult to use. In summary, there really is no automated computerized PCB manufacturing documentation release package system available in the marketplace.

SUMMARY OF THE INVENTION

It is therefore an object of this invention to provide an automated PCB manufacturing documentation release package system and method.

It is a further object of this invention to provide such a system and method which is easy to use.

It is a further object of this invention to provide such a system and method which reduces the time required to generate a manufacturing documentation release package.

It is a further object of this invention to provide such a system and method which eliminates the need to manually re-process the manufacturing documentation release package after a change has been made to the design of the PCB.

It is a further object of this invention to provide such a system and method which provides increased authoring functionality to the PCB manufacturing documentation release package process.

It is a further object of this invention to provide such a system and method which eliminates the need to copy and annotate separate static images for each separate view of the PCB.

It is a further object of this invention to provide such a system and method in which multiple views of a PCB image can be easily re-positioned.

It is a further object of this invention to provide such a system and method which provides for electronic file sharing and internet access of the manufacturing documentation release package for a PCB design.

It is a further object of this invention to provide such a system and method which links different views of the PCB and the manufacturing documentation release package to a PCB CAD database.

The subject invention results from the realization that a truly innovative automated PCB manufacturing documentation release package system can be achieved with a PCB database that includes PCB CAD data associated with a CAD file of a PCB design, a shape engine that reads the PCB database and displays simultaneous views of a given PCB design that includes different views of the PCB and generates reconfigurable objects that are displayed simultaneously in the different views such that any change in the design of the PCB is reflected in the different views, and an authoring tools module interfaced with the shape engine that provides for interactively adding and modifying the reconfigurable objects to create a manufacturing documentation release package such that any change in the design of the PCB is also reflected in the manufacturing documentation release package.

The subject invention, however, in other embodiments, need not achieve all these objectives and the claims hereof should not be limited to structures or methods capable of achieving these objectives.

This invention features an automated PCB manufacturing documentation release package system including a PCB database including PCB CAD data associated with a CAD file of a PCB design, and a shape engine configured to display simultaneous views of a given PCB from the PCB database including different views of the PCB and configured to retrieve the data in the PCB database and create reconfigurable objects displayable simultaneously in the forms of different views of the PCB such that any change in the design of the PCB is reflected in the different views.

In one embodiment, the system may further include an authoring tools module interfaced with the shape engine for interactively adding and modifying the reconfigurable objects to create a manufacturing documentation release package such that any change in the design of the PCB is reflected in the manufacturing documentation release package. The reconfigurable objects may include one or more drawing elements chosen from the group consisting of: a title block, a revision block, a note block, a top view, a bottom view, a side view, a board outline, assembly components, component placement on a view, callout for the components, notes for the components, a drill pattern, a drill chart, a layer stack-up, a v-score, a finger chamfer, reference designators for the components, a parts list, assembly instructions, mechanical components, a variant list, parts list items, an integral parts list, hyperlinks between drawings, and hyperlinks to external resources. The manufacturing documentation release package may further include a number of template elements for defining how the data in the PCB database may be represented in drawing elements. The authoring tools module may interface with the shape engine to provide for interactively adding and modifying the template elements. The template elements may be linked to the PCB database. The PCB database may include one or more data tables. The template elements may be populated with the PCB CAD data in the PCB database. The manufacturing documentation release package may include one or more documents each including one or more drawing sheets that include one or more of the drawing elements. The one or more drawing elements may be re-positioned, re-sized, re-oriented, and annotations added thereto on the one or more drawing sheets. The one or more drawing sheets may include one or more fabrication drawing sheets, or one or more assembly drawing sheets. The shape engine may link the different views and the manufacturing documentation release package to the PCB database. The manufacturing documentation release package may be stored as a file. The file may include an ADP file. The manufacturing documentation release package may be exported in the form of a file chosen from the group consisting of DXF®, PDF®, XML®, HTML, IGES, and HPGL. The manufacturing documentation release package and the different views may include views chosen from the group consisting of: a title block, a revision block, a note block, a top view, a bottom view, a side view, a board outline, assembly components, component placement on a view, callout for the components, notes for the components, a drill pattern, a drill chart, a layer stack-up, a v-score, a finger chamfer, reference designators for the components, a parts list, assembly instructions, mechanical components, a variant list, parts list items, an integral parts list, hyperlinks between drawings, and hyperlinks to external resources. The PCB database may include shape data of the drawing elements, OLE objects, externally imported files, and/or ancillary data tables. The system may further include an import module for importing the CAD file. The system may include an export module for exporting the manufacturing documentation release package. The system may further include an element gallery module for storing user-defined documentation for a desired drawing element. The system may include a graphical user interface framework interfaced with the authoring tools module, an import module, an export module, and a mechanical components gallery module. The framework may include a main window, a taskbars and menus window, a task pane, and a workspace window. The framework may include a plurality of selectable drawing element icons for generating the one or more drawing elements. The one or more drawing elements and/or one or more template elements may be included on one or more fabrication drawing sheets and/or one or more custom drawing sheets of the manufacturing documentation release package. The framework may include a plurality of buttons for selecting a common elements pane and the associated drawing element icons for the common elements predetermined by the selectable drawing element icons to generate the one or more drawing elements. The framework may include a plurality of buttons for selecting a fabrication drawing sheet and the associated drawing element icons for the common elements predetermined by the selectable drawing element icons to generate the one or more drawing elements. The framework may include a plurality of buttons for selecting an assembly drawing sheet and the associated drawing element icons for the common elements predetermined may include a plurality of buttons for selecting an assembly drawing sheet and the associated drawing element icons for the common elements predetermined by the selectable drawing element icons to generate the one or more drawing elements. The different views and the manufacturing documentation release package may include fabrication and assembly views of a PCB design.

This invention also features an automated PCB manufacturing documentation release package system including a PCB database including PCB CAD data of a PCB CAD file of a PCB design, a shape engine configured to display simultaneous views of a given PCB from the PCB CAD data including different views of the PCB and configured to retrieve the PCB CAD data in the PCB database and create reconfigurable objects displayable simultaneously in the forms of different views of the PCB such that any change in the design of the PCB is reflected in the different views, and an authoring tools module interfaced with the shape engine for interactively adding and modifying the reconfigurable objects to create a manufacturing documentation release package linked to the PCB database.

This invention further features an automated PCB manufacturing documentation release package system including a GUI framework module for providing graphical interface, an import module for importing a CAD file of a PCB design into a PCB database, and a shape engine configured to read the PCB database and generate a hierarchy of objects including methods which interface with an authoring tools module to provide reconfigurable drawing elements displayable simultaneously in the form of different views of the PCB wherein the reconfigurable drawing elements are interactively added and modified to create a manufacturing documentation release package such that any change in the design of the PCB is reflected in the manufacturing documentation release package.

This invention further features an automated PCB manufacturing documentation release package system including a PCB database including PCB CAD data associated with a CAD file of a PCB design, and a shape engine configured to display simultaneous views of a given PCB from the PCB database including different views of the PCB and configured to retrieve the data in the PCB database and create reconfigurable drawing elements displayable simultaneously in the forms of different views of the PCB such that any change in the design of the PCB is reflected in the different views.

In one embodiment the system may further include an authoring tools module interfaced with the shape engine for interactively adding and modifying the reconfigurable drawing elements to create a manufacturing documentation release package such that any change in the design of the PCB is reflected in the manufacturing documentation release package. The reconfigurable drawing elements may include a drawing element chosen from the group consisting of: a title bloc, a revision block, a note block, a top view, a bottom view, a side view, a board outline, assembly components, component placement on a view, callout for the components, notes for the components, a drill pattern, a drill chart, a layer stack-up, a v-score, a finger chamfer, reference designators for the components, a parts list, assembly instructions, mechanical components, a variant list, parts list items, an integral parts list, hyperlinks between drawings, and hyperlinks to external resources.

This invention further features an automated PCB manufacturing documentation release package system including a PCB database including PCB CAD data associated with a PCB design, and a shape engine configured to read the PCB CAD data and create one or more reconfigurable drawing elements that are displayable as one or more views of the PCB such that any change in the design of the PCB is reflected in the one or more views.

In one embodiment the reconfigurable drawing elements may be used to create the manufacturing documentation release package.

This invention also features an automated PCB manufacturing documentation release package system including a PCB database including PCB CAD data associated with a CAD file of a PCB design, and a shape engine configured to retrieve the PCB CAD data in the PCB database to create reconfigurable objects displayable simultaneously in the forms of different views of the PCB wherein the reconfigurable objects are modified and annotated to crate a manufacturing documentation release package linked to the PCB CAD data such that a change in the design of the PCB is reflected in the manufacturing documentation release package and the different views.

This invention further features a method for providing automated PCB documentation and a release package, the method comprising the steps of importing a CAD file of a PCB design into a PCB database, displaying simultaneous views of a given PCB from the PCB database including different views of the PCB, retrieving the data in the PCB database, and generating reconfigurable objects displayable simultaneously in the different views of the PCB such that any changes in the design of the PCB are reflected in the different views.

In one embodiment the method may include the step of interactively modifying and annotating the reconfigurable objects to create a manufacturing documentation release package.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1A:
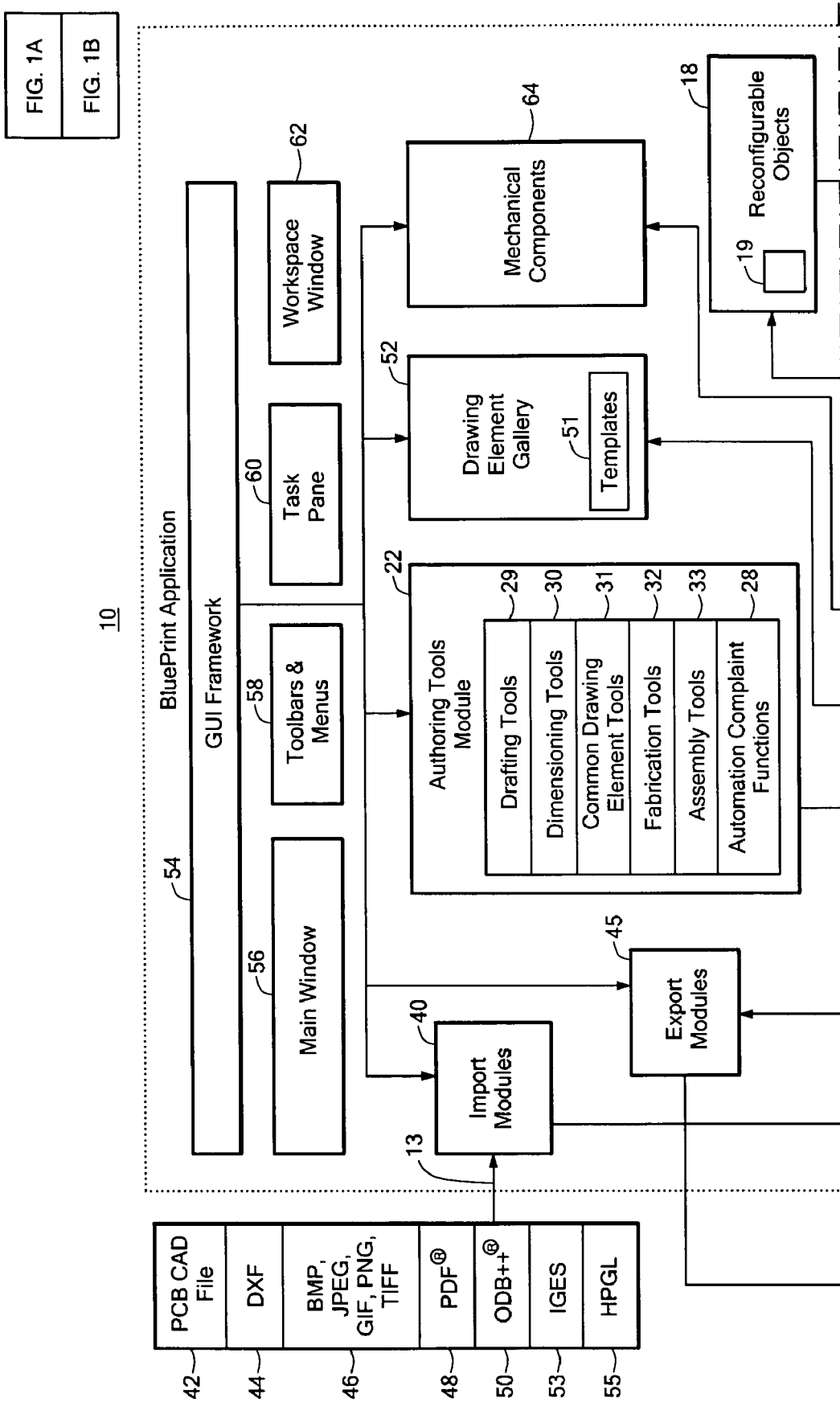
FIG. 1 is a schematic block diagram of one embodiment of the automated PCB manufacturing documentation release package system of this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1B:
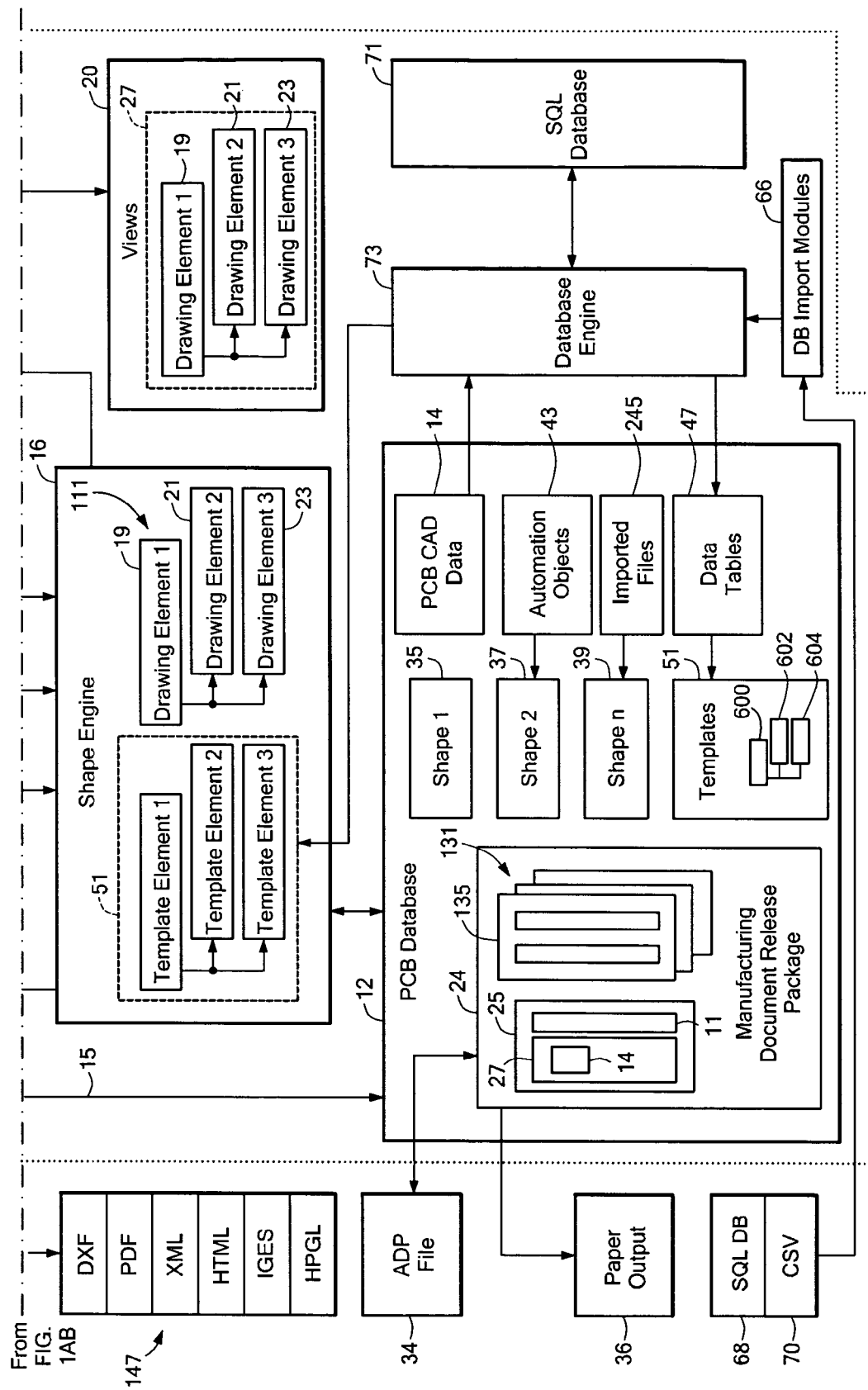

Automated PCB manufacturing documentation release package system 10, FIG. 1, of this invention, includes PCB database 12 that includes PCB CAD data 14 associated with PCB CAD file 42 of a PCB design. PCB CAD data 14 includes all the relevant CAD data in PCB CAD file 42 of a PCB design and is typically created in PCB database 12 by importing PCB CAD file 42 with import module 40, as indicated by arrows 13 and 15. Shape engine 16 reads PCB CAD data 14 and displays simultaneous views 20 of a given PCB design that includes different views of the PCB, e.g., drawing elements 19, 21, and 23 (discussed below) of the PCB design in PCB CAD data 14. Shape engine 16 also generates reconfigurable objects 18 from PCB database 12 that are simultaneously displayed in the views 20 such that any change in the design of the PCB is reflected in views 20. As disclosed herein, a drawing element is a generic term that covers all types of specific drawing elements, e.g., drill patterns, drill charts, board outlines, assembly components, note blocks, callouts, and the like (discussed below) that are used to display views of the PCB, e.g., drawing elements 19, 21, and 23, and create manufacturing documentation release package 24. A drawing element provides a filtered view of PCB CAD data 14 in views 20. For example, drawing element 19 may be a drill pattern drawing element that is displayed in views 20 as a view of the drill pattern that was presented in the original PCB design in PCB CAD file 42 and loaded into PCB CAD data 14 (discussed in further detail below). A specific type of drawing element (e.g., a drill pattern) is implemented by shape engine 16 as a reconfigurable object in reconfigurable objects 18. Hence, reconfigurable objects 18 include the specific type of drawing element or elements discussed above. A drawing element implemented as a reconfigurable object in reconfigurable objects 18 is how a specific type of drawing element can be interactively added or modified using authoring tools module 22 (discussed below) to create the necessary documentation (e.g., re-sizing, re-positioning, and adding annotations, and the like) for manufacturing documentation release package 24. That is, a drawing element is an object that may be placed on the screen (e.g., drawing sheet) to provide a filtered view of PCB CAD data 14 on views 20 that can be interactively modified. Hence, a drawing element that is implemented as reconfigurable object in reconfigurable objects 18 is also referred to as a "reconfigurable drawing element". System 10 is designed such that any change in the design of the PCB is automatically reflected in the drawing element (e.g., drawing element 19) in views 20 and manufacturing documentation release package 24 by re-loading a new PCB CAD file 42 into PCB database 12 and linking PCB database 12 to views 20.

Authoring tools module 22 interfaces with shape engine 16 to provide for interactively adding or modifying the various drawing elements implemented as reconfigurable objects 18 to create manufacturing documentation release package 24. Some examples of the various drawing elements that may be implemented as a reconfigurable object (reconfigurable drawing element) in reconfigurable objects 18 include, inter alia, a title block and a revision block, a note block, a board outline, a top view, a bottom view, a side view, assembly components and their placement on the board view, a callout, notes for the various components, drill patterns, drill charts, a layer stack-up, a v-score, a finger chamfer, reference designators for the components, a parts list, assembly instructions, mechanical components, a variant list, parts list items, integral parts list, and the like, all discussed in detail infra. Hence, the drawing elements provide a simple and easy way to display a wide variety of commonly used views in views 20 of the PCB data 14. The drawing elements can then be interactively modified (discussed in detail below) to create a complete manufacturing documentation release package. Hence, the imported CAD files, e.g., PCB CAD file 42, and the like, is intelligently parsed then edited using the various drawing elements in conjunction with shape engine 16 and authoring tools module 22. The data in PCB CAD data 14 is dynamically linked to the drawing elements that are displayed in views 20.

In a preferred embodiment, system 10 includes templates 51. A template is an object/shape that includes template elements, e.g., template elements 600, 602, and 604. Template elements 600-604 can be customized by a user to define how the data in PCB database 12 (e.g., data tables 47 or PCB CAD data 14) is represented within particular drawing elements. Template elements are used to specify the "look" of a particular drawing element. That is, how the data in PCB database 12 is represented within the drawing element. The template elements do not actually contain the data, only how the data will be represented in the various drawing elements. Many of the drawing elements described above are created from template elements and are often referred to as template-based drawing elements. The template-based drawing elements include, inter alia, the drill chart drawing element, the layer stack-up drawing element, the via stack-up drawing element, the finger chamfer drawing element, the minimum trace width drawing element, the v-score drawing element and the integral parts list drawing element. Authoring tools module 22 interfaces with shape engine 16 to provide for interactively creating and modifying template elements 600-604. The result is that a user can create and modify a template element for virtually any type of drawing element. The user-defined templates can then be saved in drawing element gallery 52. The saved template based drawing element can then be re-used when needed. Template elements 600-604 are typically linked to data tables 47. Data tables 47 provide an interface to all data contained in the imported PCB design, e.g., PCB CAD data 14. Data tables 47 are similar to a data table in a relational database. It is comprised of data rows (records) and data columns (fields). Columns define the field values that the data table stores. Rows contain actual data values for the given set of columns. The intersection of a column and a row is a data field that contains a value. A template-based drawing element is created from its template by an execute operation (discussed below) that connects the actual data source (e.g., data tables 47 or PCB CAD data 14) to the template-based drawing element using database engine 73. The template based drawing element is then populated with the appropriate PCB data. Database engine 73, shape engine 16 and authoring tools module 22 allow the user to modify the predefined table as well as create and link user-defined tables to PCB database 12 and external files.

Manufacturing documentation release package 24 typically includes at least one drawing 25 that includes one or more drawing sheets 11 and 27, e.g., fabrication and assembly drawings, to which the manufacturing documentation is created and modified using the various drawing elements, e.g., drawing element 19. In practice, manufacturing documentation release package 24 typically includes a plurality of drawings 131 that each includes a plurality of drawing sheets 133.

Authoring tools module 22 typically includes Automation compliant functions 28 (e.g., Microsoft® Excel®, Microsoft® Word, Microsoft® Visio®, and the like), drafting tools 29, dimensioning tools 30, common drawing element tools 31, fabrication tools 32, and assembly tools 33 that with shape engine 16 provide for interactively creating the manufacturing documentation release package 24 and/or the template elements (discussed below). For example, drawing element 19, e.g., a drill pattern drawing element, is implemented as drawing element 19 in reconfigurable objects 18 by shape engine 16 to allow a user using authoring tools module 22 to interact with drawing element 19 to modify the drawing element, e.g., re-size or re-position the drawing element on the drawing sheet, add annotations and/or modify the drill pattern or add a new drill pattern, and the like, (discussed in further detail below) to create manufacturing documentation release package 24. Modified drawing element 19 is also simultaneously displayed in views 20, e.g., on fabrication drawing sheet 27. Because drawing element 19 is implemented as a reconfigurable object and the documentation is made to drawing element 19, the original PCB design remains intact in PCB CAD data 14 in PCB database 12.

Once manufacturing documentation release package 24 is complete it can be saved as a file, such as active document package (ADP) file 34, or printed as paper output 36. Manufacturing documentation release package 24 may also be exported by export module 45 as export file 147 in a number of various file formats, such as DXF®, PDF®, XML, HTML, IGES®, and HPGL®, and the like.

When the design of the PCB changes, e.g., with an engineering change order, a new PCB CAD file 42 reflecting the changes is loaded into PCB CAD data 14 in PCB database 12 with import module 40. ADP file 34 is then loaded into PCB database 12 and the previously saved manufacturing documentation release package 24 is linked by shape engine 16 to PCB CAD data 14 in PCB database 12. Hence, the changes in the PCB design in PCB CAD file 42 are automatically included in manufacturing documentation release package 24 and simultaneously displayed in views 20. The result is the elimination of the need to manually re-enter the manufacturing documentation when a change is made to the design of the PCB. There is no need to re-generate and recreate separate static images of CAD files then re-enter the documentation and have a skilled engineer ensure the accuracy of the manufacturing documentation release package. System 10 can also electronically export manufacturing documentation release package 24 in a variety of electronic formats, as discussed above, to provide for internet access, file sharing and the like. The result is a significant savings of time and money. The innovative template elements allow a user to create and customize reusable drawing elements which further saves time and money. Moreover, system 10 is easy to use.

In a preferred embodiment, a hyperlink may be utilized that is attributed with a location (URL/UNC or link to an internal object) of associated data which can be displayed when the text or other drawing element is selected. A selected hyperlink displays the associated data in a popup window next to the selected text or other drawing element. The URL/UNC can include references to any types of data, including bitmaps, videos and audio files, and the like. An example of the hyperlink feature of this invention is discussed in detail below.

As discussed above, import module 40 can import PCB CAD file 42. However, this is not a necessary limitation of this invention, as import module 40 may import a variety of files that contain CAD data in various other formats, such as DXF file 44, graphic file 46 (e.g., BMP, JPEG, GIF, PNG, or TIFF graphic files), PDF® file 48, ODB++® file 50, IGES file 53, or HPGL file 55 into PCB database 12. Similarly, DB import module 66 may be used to import database files, such as SQL compliant DB file 68 or comma separated value file (CSV) 70 into data tables 47 in PCB database 12 (discussed above) or into SQL database 71 using database engine 73. Database engine 73 also links PCB database 12 with SQL database 71 as well as data tables 47 and templates 51 to shape engine 16.

Drawing element gallery 52 may be used to store various user-defined drawing elements, e.g., custom title blocks, note blocks, a custom board outline, and the like, that are often repeated for a preferred customer. As discussed above, drawing element gallery 52 also stores customized template elements. Shape engine 16 stores the user-defined drawing elements and template elements in PCB database 12.

GUI framework 54 includes main window 56, toolbars and menus 58, tasks pane 60, and workspace window 62 that provide a graphic interface with import module 40, export module 45, authoring tools module 22, drawing element gallery 52 and mechanical components 64, as discussed in detail below. Mechanical components 64 are used to create user-defined parameters for selected mechanical components of a PCB, e.g., a mechanical part on the PCB with a particular user-defined dimension. Similarly, shape engine 16 stores the user-defined mechanical component in PCB database 12.

Shape engine 16 is typically configured to read PCB database 12 and generate a hierarchy of objects, e.g., drawing elements 19, 21 and 23, in the hierarchy indicated by arrow 111, that include methods, e.g., subroutines, that interface with authoring tools module 22 to generate reconfigurable objects 18, to which the manufacturing documentation is added and simultaneously displayed in views 20. PCB database 12 typically includes shape data, e.g., shape data 35, shape data 37, and shape data 39, of the various drawing elements discussed above, e.g., shape data for drawing elements 19, 21 and 23. For example, shape data 35 may include line data (e.g., line thickness) for drawing element 19 and shape data 37 may include line location data for drawing element 21 (discussed below). PCB database 12 may also include Automation objects 43, imported files 245, data tables 47 and templates 51.

Figure 2:
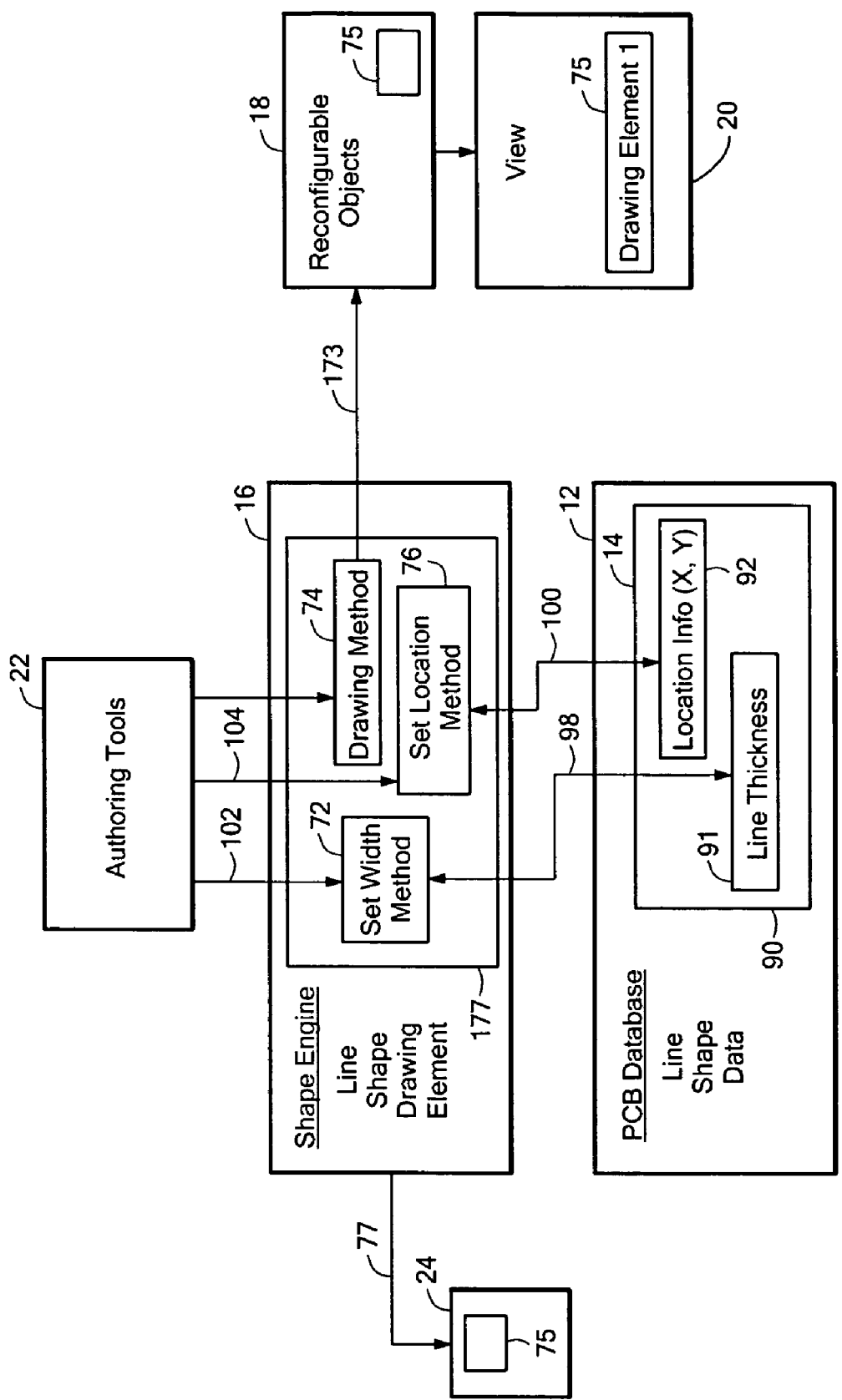
FIG. 2 is a schematic block diagram showing in further detail the primary components associated with the automated PCB manufacturing documentation release package system shown in FIG. 1.

For example, as shown in FIG. 2, where like parts have been given like numbers, shape engine 16 retrieves the shape data in PCB database 12 to generate line shape drawing element 177. Line shape drawing element 177 includes set width method 72, drawing method 74, and set location method 76. Set width method 72 and set location method 76 read line thickness data 91 and location data 92 (e.g., shape data) in PCB database 12, as indicated by lines 98 and 100. Authoring tools module 22 interfaces with set width method 72, set location method 76, and drawing method 74 to create drawing element 75 in reconfigurable objects 18, as indicated by arrow 173. The line thickness and location line shape of drawing element 177 can be interactively modified with authoring tools module 22 (discussed in further detail below) and simultaneously displayed in views 20. The results of the interactive modification to drawing element 75 are also reflected in manufacturing documentation release package 24, as indicated by arrow 77.

Figure 3A:
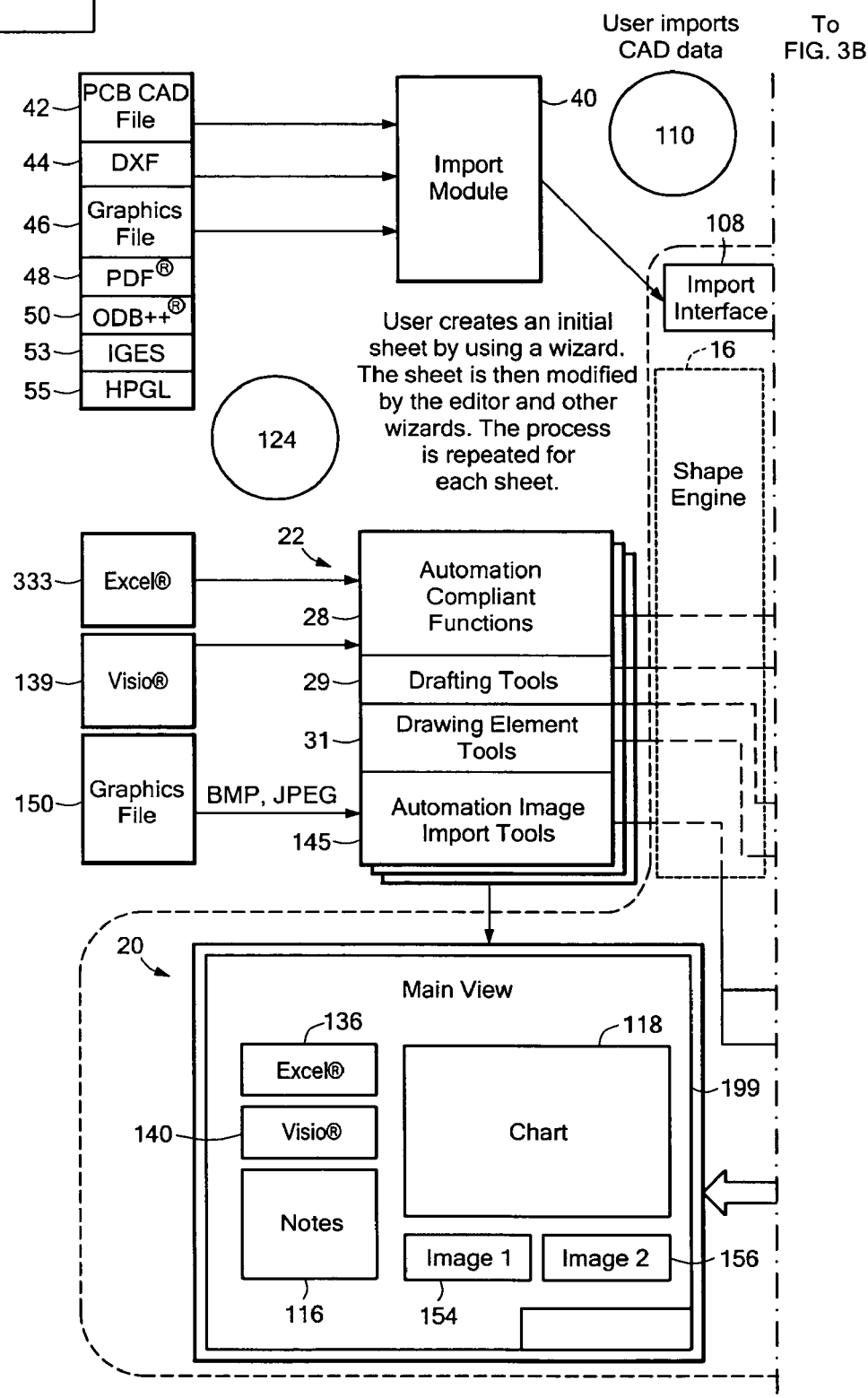
FIG. 3 is a schematic block diagram showing an example of the automated PCB system and method for creating a manufacturing documentation release package of this invention.
Figure 3B:
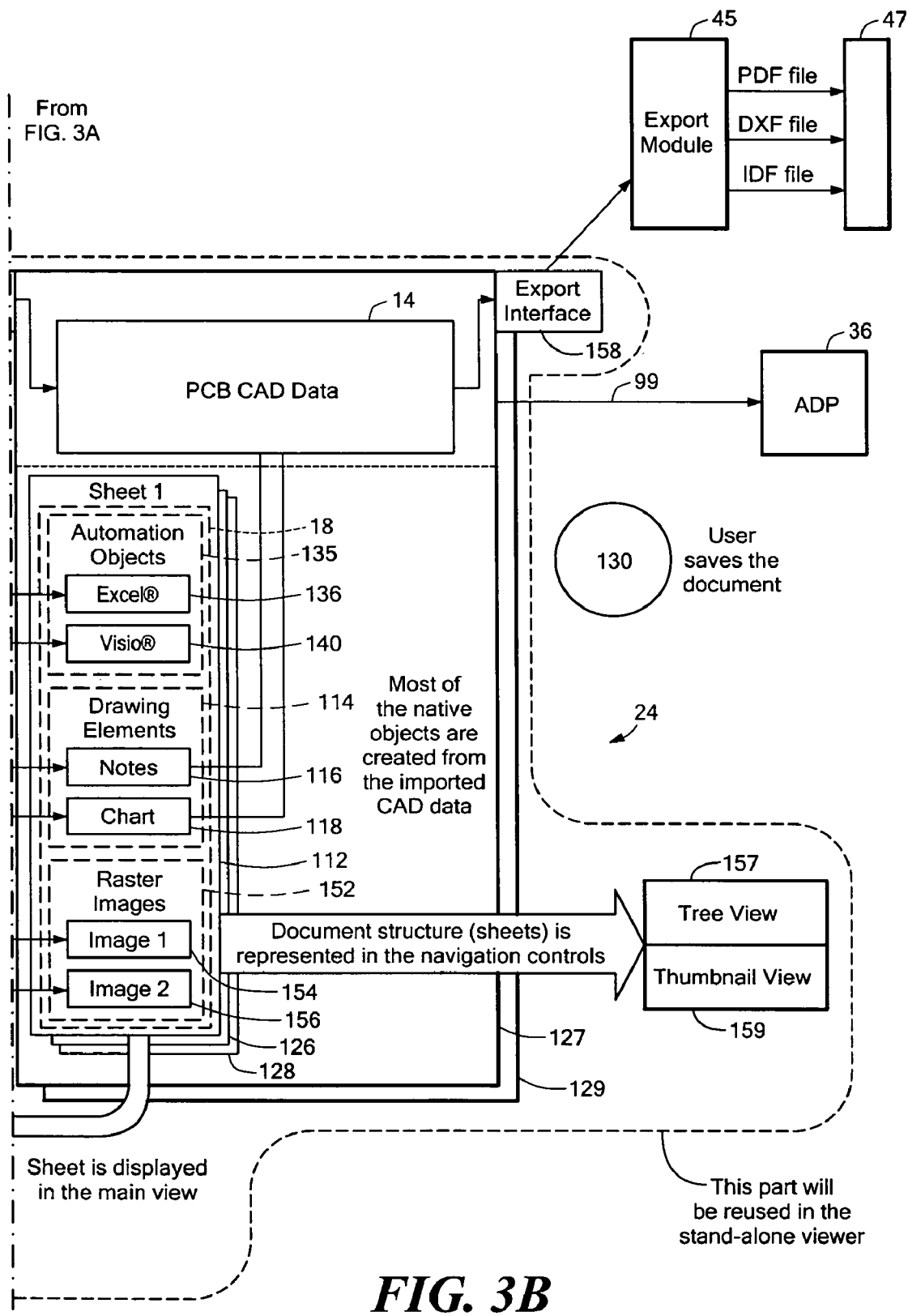

An example of the operation of automated PCB manufacturing documentation release package system 10 of this invention is shown in FIG. 3, where like parts have been given like numbers. The process begins with a user importing CAD data, e.g., PCB CAD file 42, DXF file 44, graphic file 46, PDF® file 48, ODB++® file 50, IGES file 53, or HPGL file 55 into PCB CAD data 14 in PCB database 12, e.g., using graphical user import interface 108 and import module 40, step 110. New drawing sheet 112, e.g., a fabrication or assembly drawing sheet, in drawing 127 is generated using one of various tools of authoring tools module 22 and the various buttons and icons of the GUI framework (described in further detail below). Shape engine 16 then reads PCB CAD data 14 in PCB database 12 to generate reconfigurable objects 18 that include drawing elements 114. In this example, drawing elements 114 include notes drawing element 116 and chart drawing element 118 that are native drawing elements, e.g., included in the original PCB design in PCB CAD file 42 created by the user, as indicated by lines 120 and 122. Drawing sheet 112 is then interactively modified to create manufacturing documentation release package 24, step 124 using the various editors and tools of authoring tools module 22, discussed above, e.g., Automation compliant functions 28, drawing elements tools 31, drafting tools 29, and/or automation image import tools 145. The various tools of authoring tools module 22 allows for adding or modifying drawing elements 114, embedded Automation objects 135, and raster images objects 152 on drawing sheet 112. Any number of additional drawing sheets may be created and/or modified to drawing 127 as needed for a particular manufacturing documentation release package 24, e.g., drawing sheets 126 and 128 in drawing 127. Any number of additional drawings, e.g., drawing 129 with any number of additional drawing sheets may also be added to manufacturing documentation release package 24 as needed. Manufacturing documentation release package 24 is then saved as ADP file 34, as indicated by line 99, step 130.

For example, Automation compliant functions 28 may open, create or modify Excel® file 333. Shape engine 16 then generates Excel® object 136 (typically an embedded Automation object) that is now part of reconfigurable objects 18 on drawing sheet 112. Excel® object 136 is automatically included on manufacturing documentation release package 24 and simultaneously displayed on main view 199 of views 20. Similarly, Automation compliant functions 28 may open, create, or modify Visio® file 139. Shape engine 16 then generates Visio® object 140 (also typically an embedded OLE object) that is now part of reconfigurable objects 18 on drawing sheet 112 and included on manufacturing documentation release package 24 and simultaneously displayed on main view 199 of views 20.

Drawing element tools 31 provide for interactively creating and modifying, inter alia, notes and drawing properties of notes drawing element 116 and chart drawing element 118 implemented as part of reconfigurable objects 18. Any changes to drawing elements 116 and 118 are reflected in manufacturing documentation release package 24 and simultaneously displayed in main view 199 of views 20. Additional drawing elements as described above may be added as needed to drawing sheet 112 (described in detail below) to create a complete manufacturing documentation release package 24. Template elements as discussed above may also be utilized to create reusable, customized drawing elements. Automation image import tools 149 provide for automatically importing graphical file 150 (e.g., BMP, JPEG and the like) and, with shape engine 16, generates raster images objects 152 that includes image objects 154 and 156 that are included in manufacturing documentation release package 24 and simultaneously displayed as images objects 154 and 156 on main view 199 of views 20.

After the modification of drawing sheet 112 (and any other fabrication and assembly sheets on any number of documents) is completed using the tools of authoring tools module 22, manufacturing documentation release package 24 is saved as ADP file 34, step 130. Manufacturing document release package 24 may also be exported via export interface 158 and export module 45 as export file 147, in a format such as PDF®, DXF, or XML, or HTML, or the like.

Drawing sheet 112 (as well as any other drawing sheets that have been created, e.g., sheets 126 and 128) may be represented as tree view 157 or thumbnail view 159, as indicated by arrow 161 (discussed below).

Figure 4:
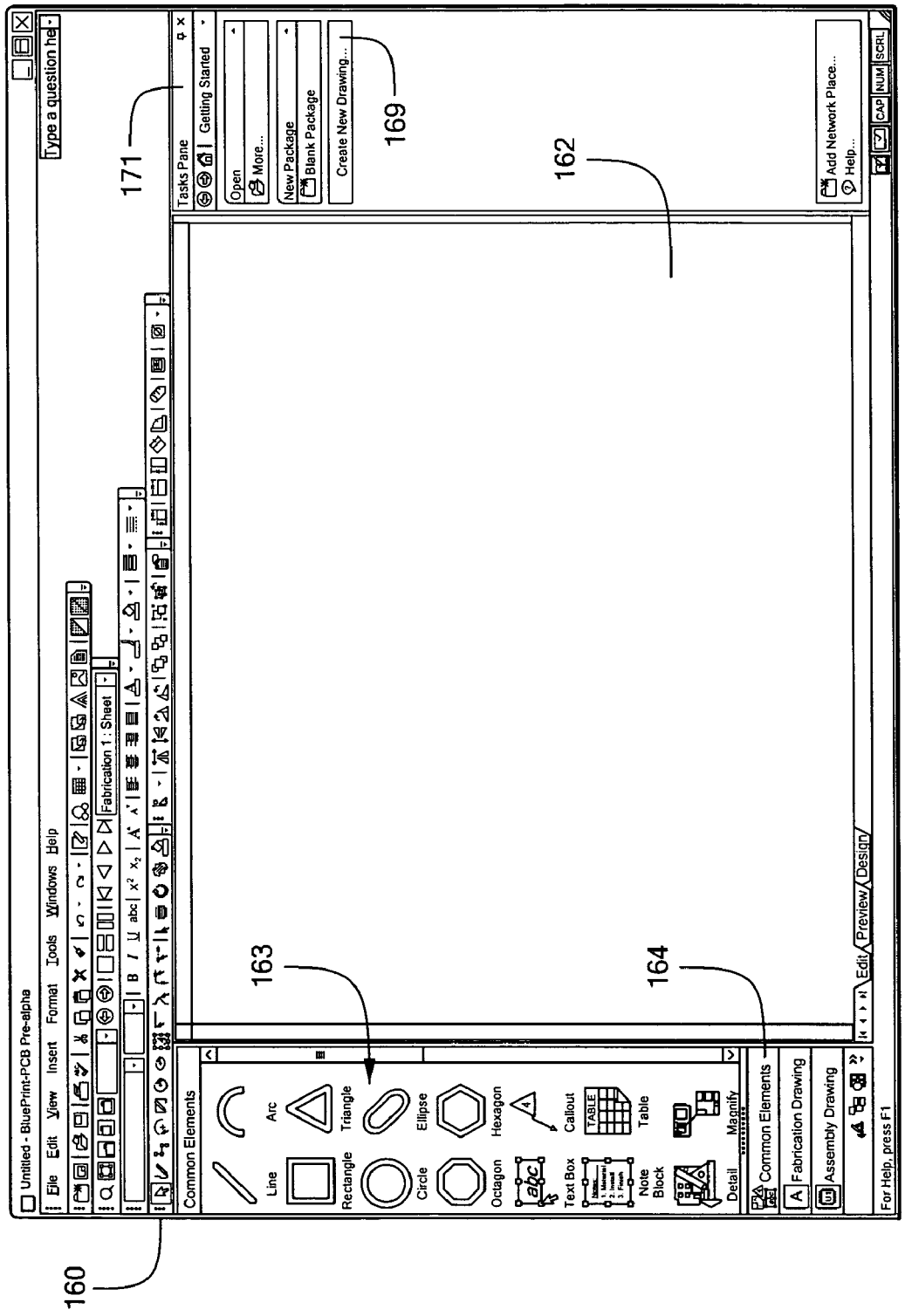
FIG. 4 is a view of an example start screen of the automated PCB manufacturing documentation release package system of this invention showing the selection of the create new drawing button.
Figure 5:
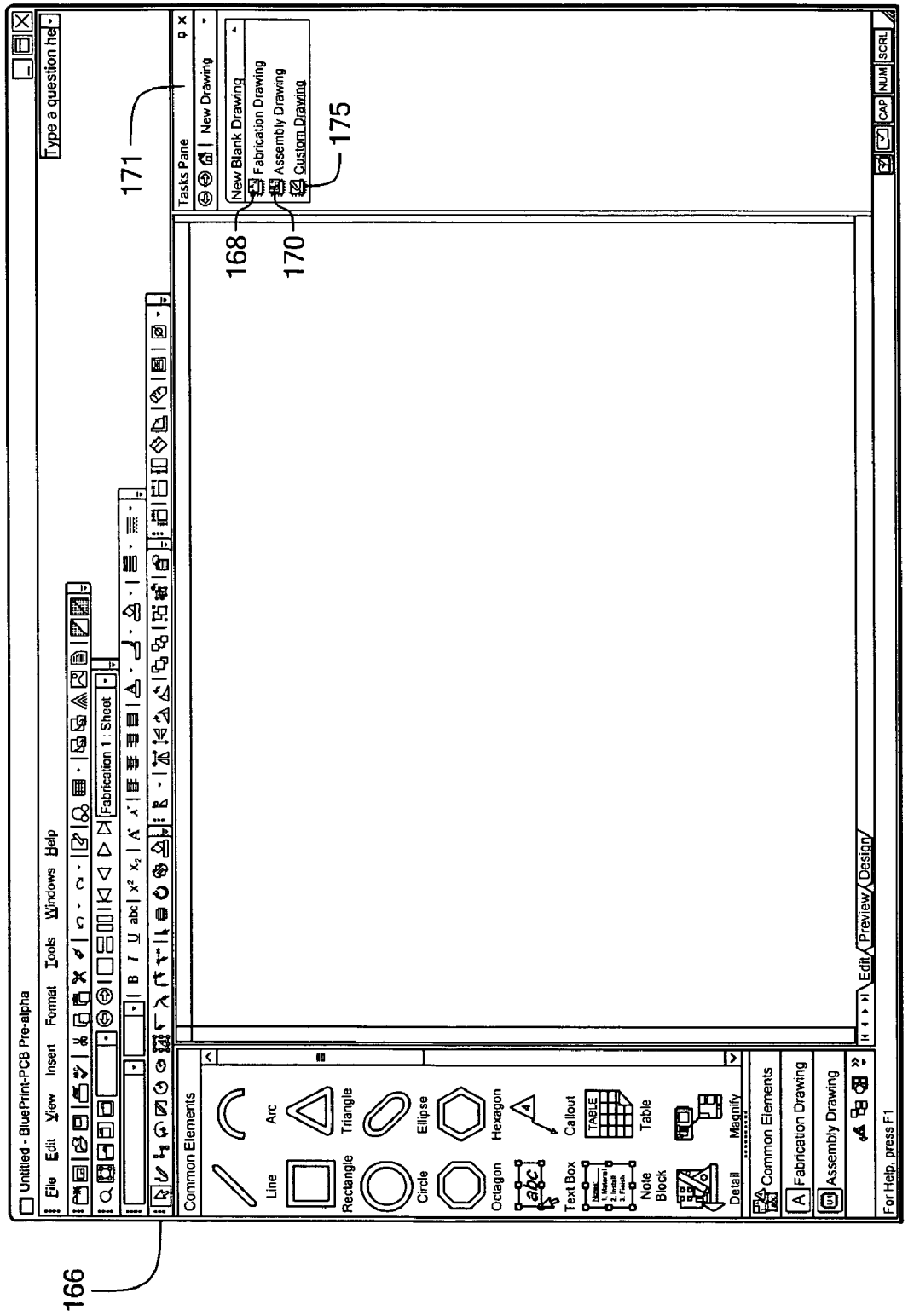
FIG. 5 is a view showing the selection of a fabrication drawing button to create a new fabrication drawing.
Figure 6:
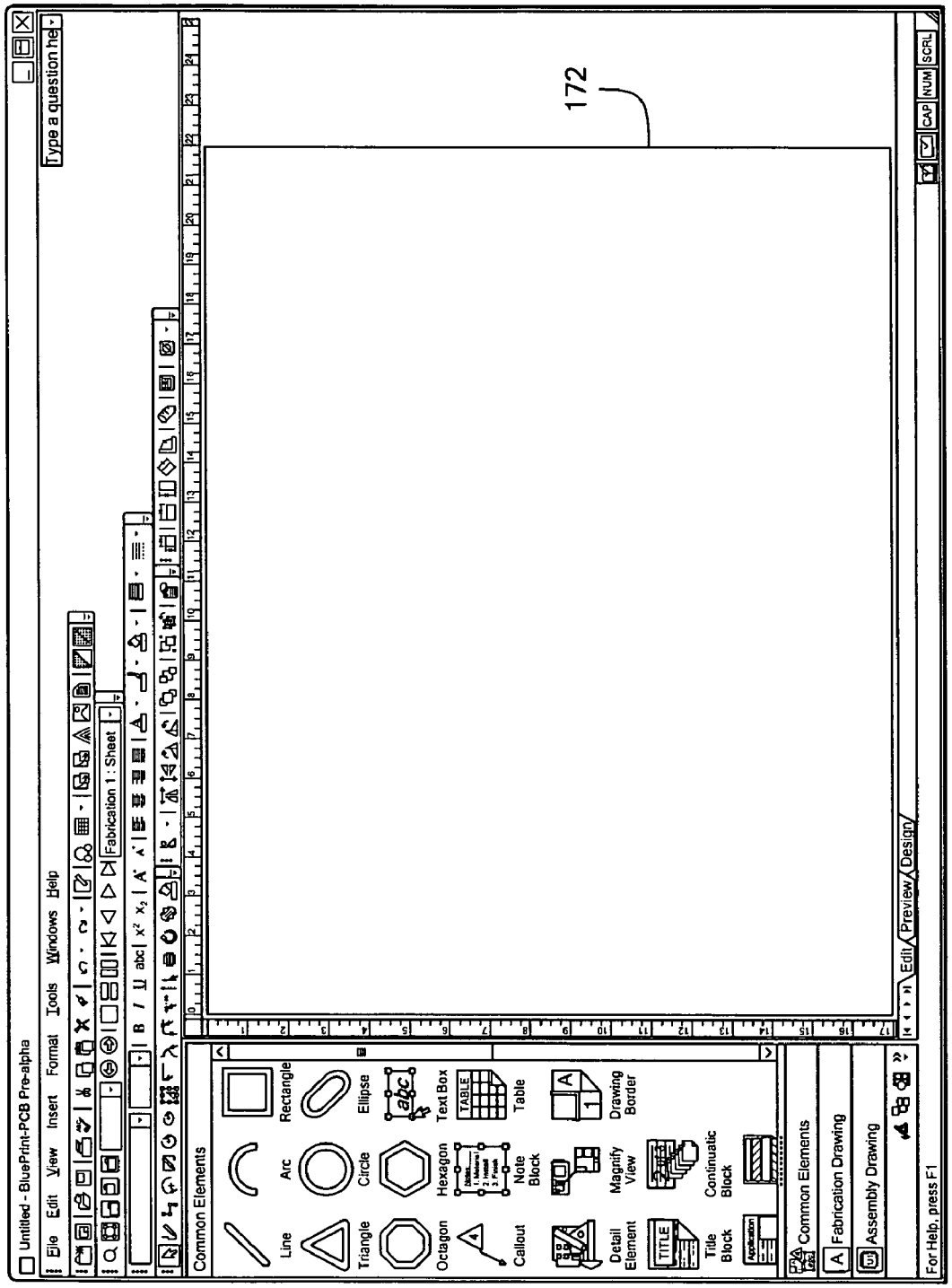
FIG. 6 is a view showing an example of the fabrication drawing created in FIG. 5 with one blank sheet.
Figure 7:
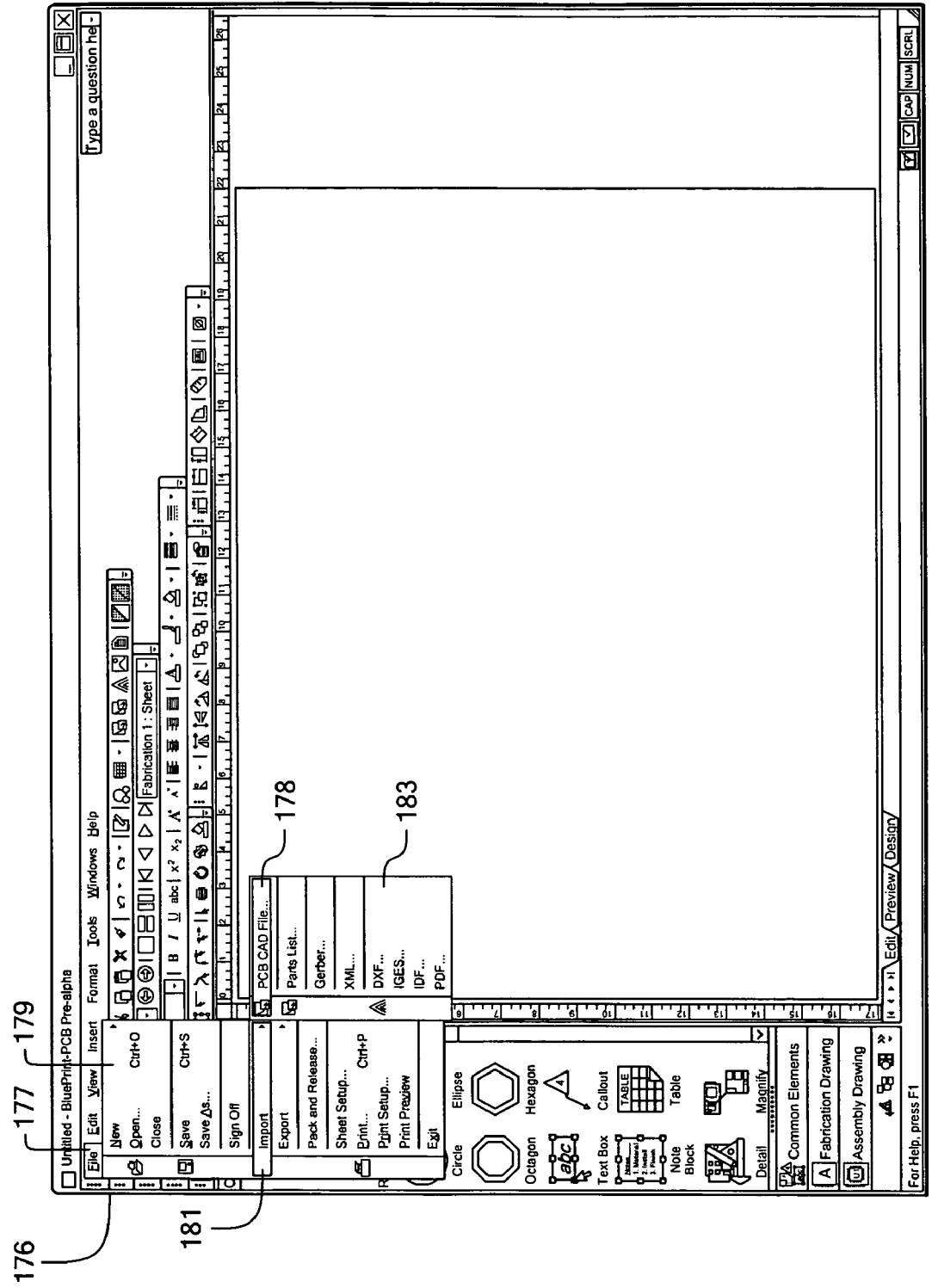
FIG. 7 is a view showing the import PCB CAD file menu and the associated submenu.
Figure 8:
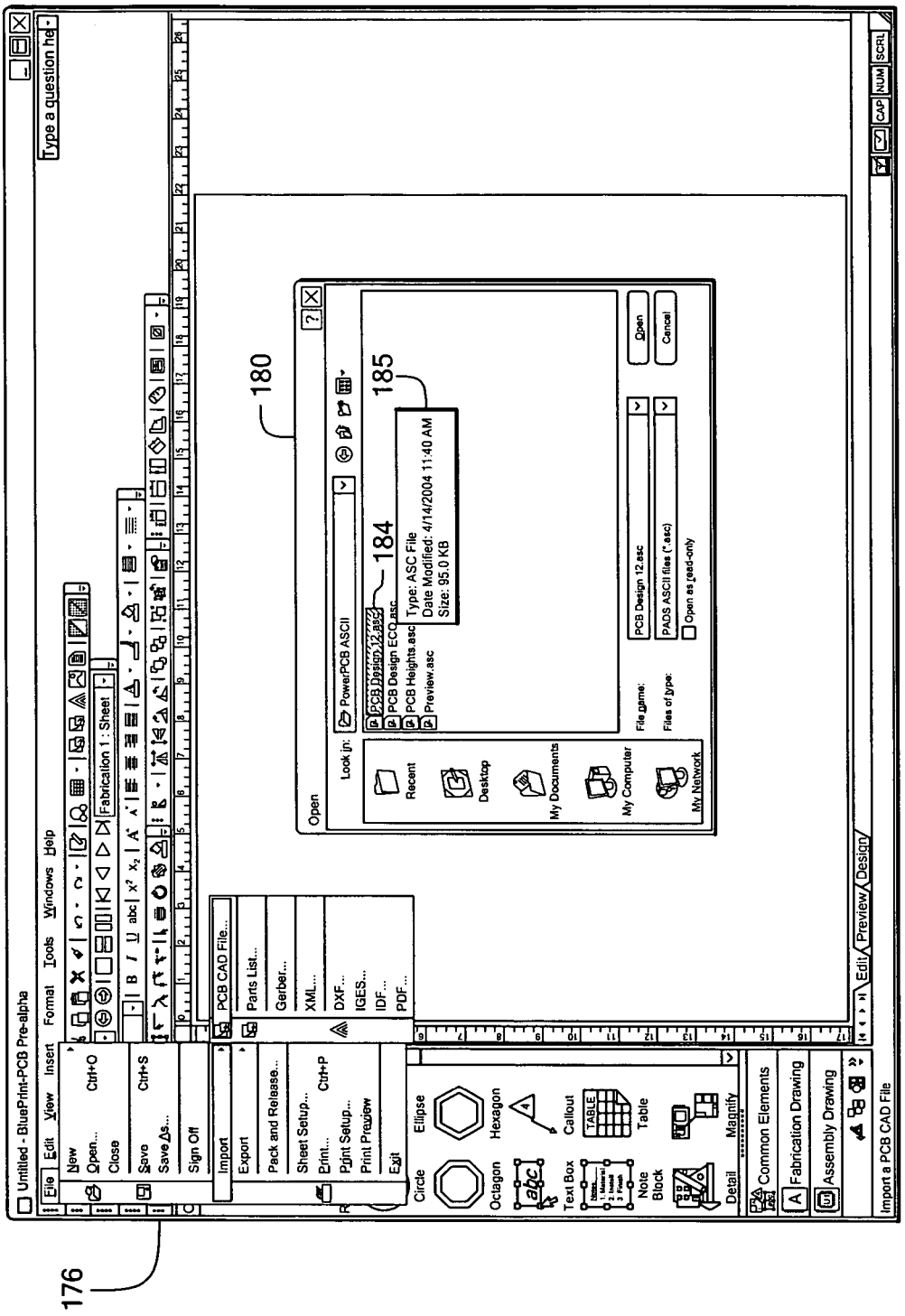
FIG. 8 is a view showing the import PCB file dialog box and the available PCB CAD files that may be selected to be imported.
Figure 9:
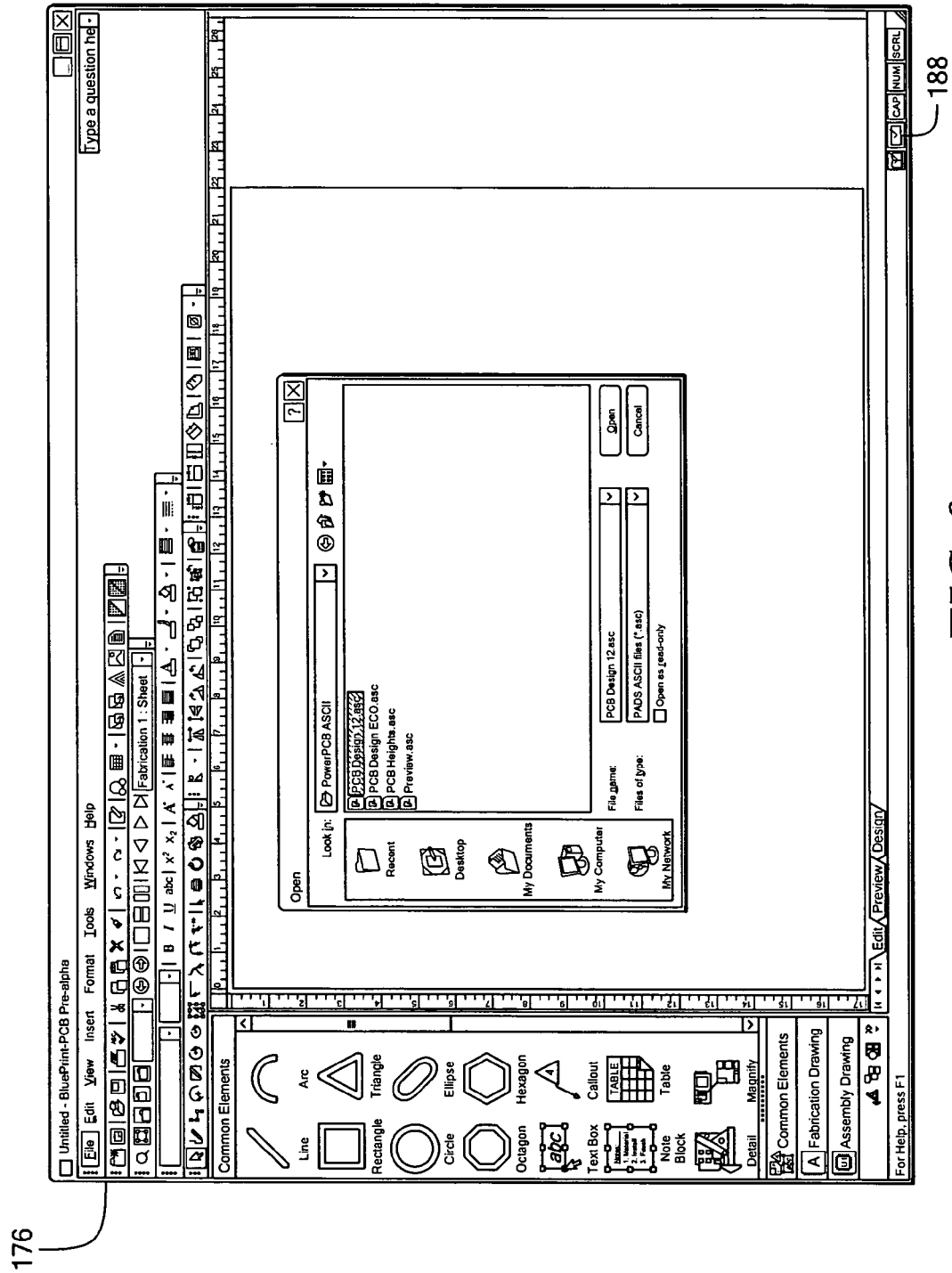
FIG. 9 is a view showing the selection of a desired PCB CAD file from the available files shown in FIG. 8.
Figure 10A:
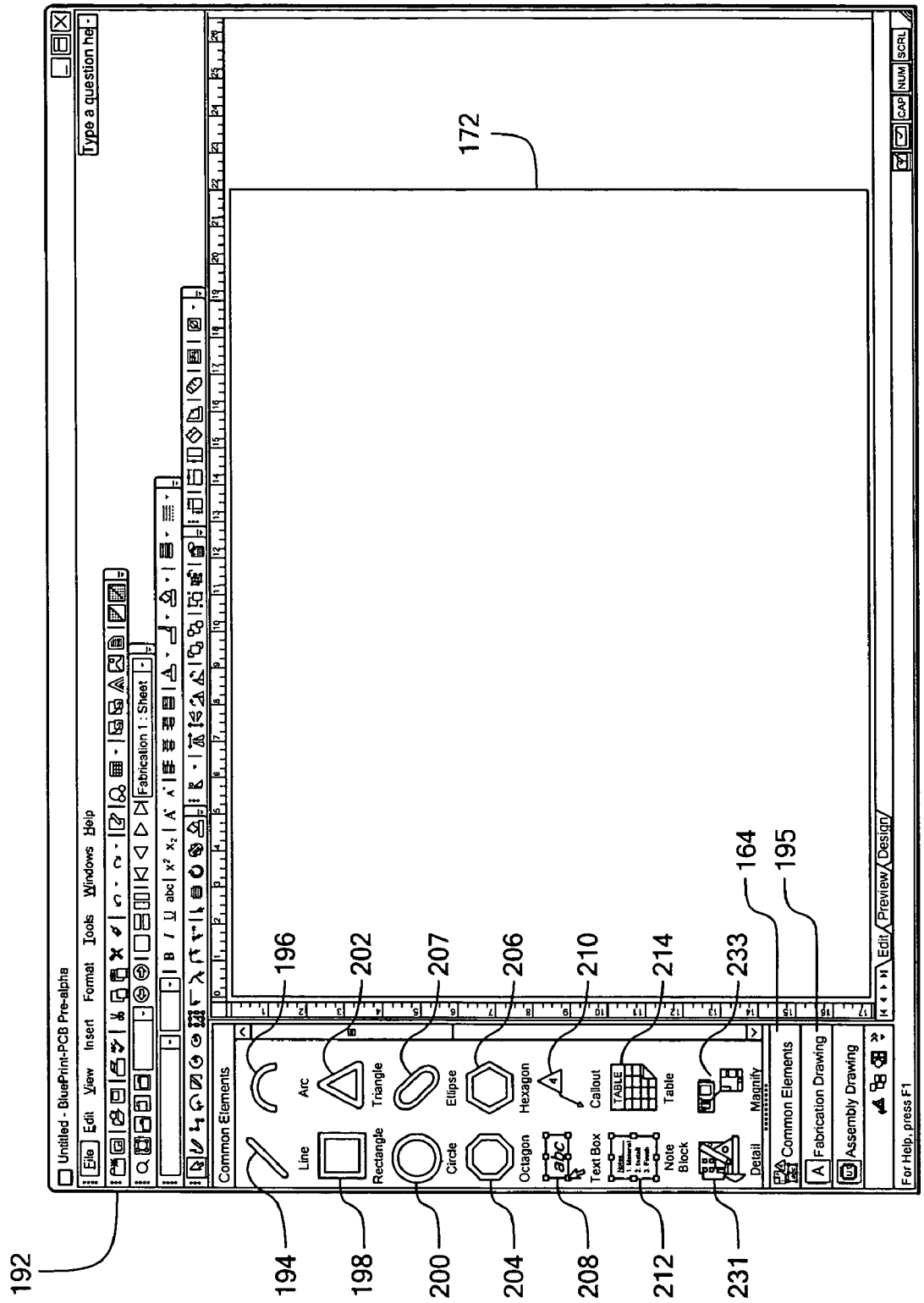
FIG. 10A is a view showing the selection of the common elements button and some of the associated common elements drawing element icons.
Figure 10B:
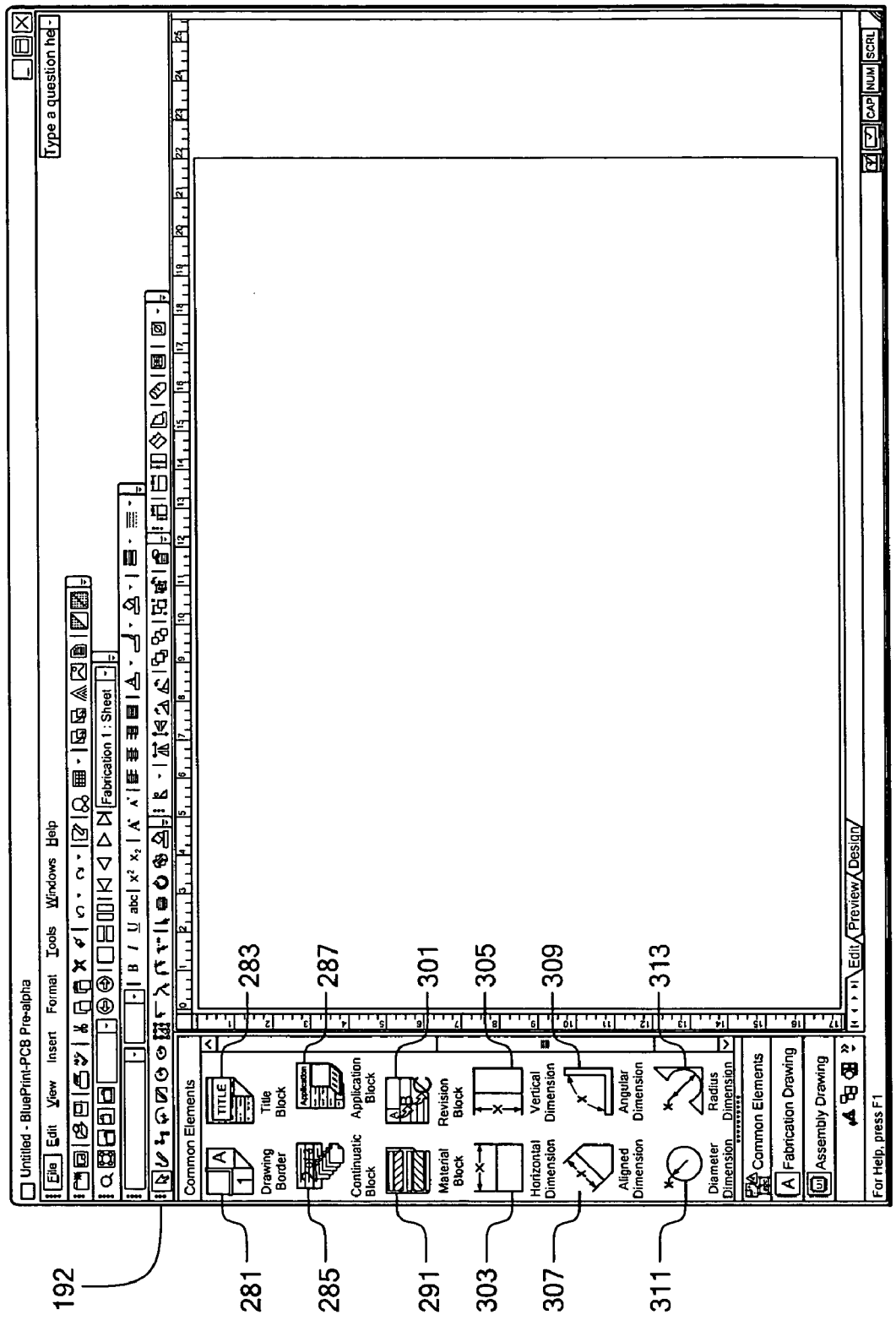
FIG. 10B is a continued view of FIG. 10A showing more of the common elements drawing element icons.
Figure 10C:
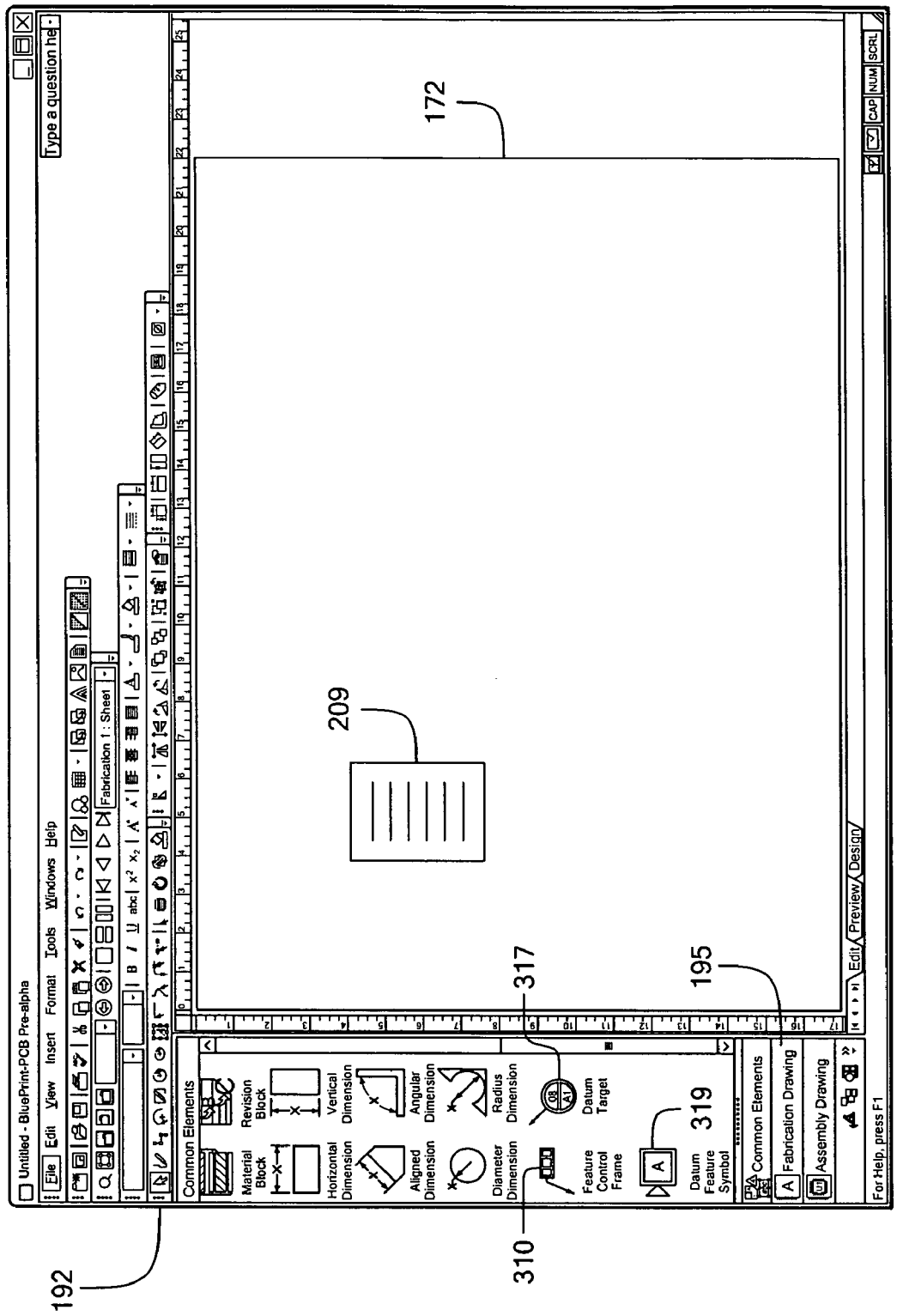
FIG. 10C is a continued view of FIG. 10B showing the remaining common elements drawing element icons and the selection of the text box drawing element icon shown in FIG. 10A to create a text box drawing element on the fabrication drawing sheet.
Figure 11:
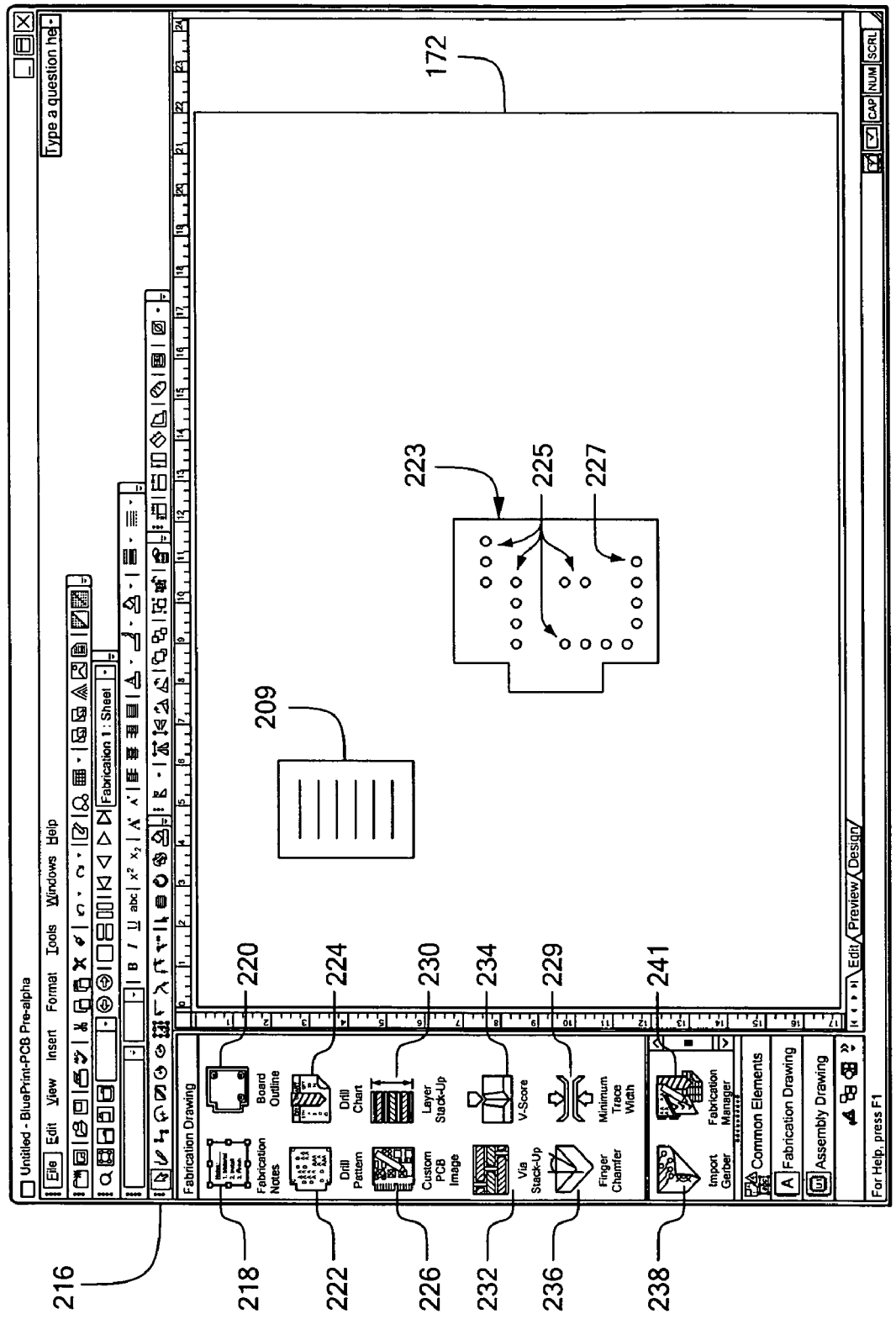
FIG. 11 is a view showing the selection of a drill pattern drawing element icon and the associated drill pattern drawing element on the fabrication drawing sheet.

In one design of this invention, shape engine 16 is configured to generate view 160, FIG. 4, that includes start screen 162 of automated PCB documentation system 10 of this invention. View 160 shows common elements button 164 has been selected to display icons for common drawing elements, e.g., a line, an arc, a rectangle, and the like, indicated generally by arrow 163. In this example, create new drawing button 169 in tasks pane 171 is selected to generate view 166, FIG. 5, that includes fabrication drawing button 168, assembly drawing button 170 and custom drawing button 175 in tasks pane 171 for choosing the type of new blank drawing to be created. In this example, fabrication drawing button 168 is selected to create a new fabrication drawing with one blank sheet 172, FIG. 6. FIG. 7 shows view 176 wherein the file menu item 174 is selected to generate file menu 179. Selection of import menu item 181 shows submenu 183. PCB CAD file menu item 178 is then selected to generate open dialog box 180, FIG. 8. Open dialog box 180 allows a user to select a desired PCB CAD file to be loaded into the PCB CAD data in the PCB database and to view the properties associated with a selected file. In this example, the user has right clicked on PCB Design 12.asc file 184 and the properties associated with file 184 are displayed in file attributes box 185. As shown in FIG. 9, PCB Design 12.asc file 184 has been selected and loaded into the PCB database. PCB data loaded icon 188 indicates that PCB Design 12.asc file 184 is now loaded into the PCB data in the PCB database. View 192, FIG. 10A, shows the selection of common elements button 164 and the associated common elements drawing element icons that may be used with fabrication drawing sheet 172 and the loaded PCB data in the PCB database. The drawing elements include, inter alia, line drawing element icon 194, arc drawing element icon 196, rectangle drawing element icon 198, circle drawing element icon 200, ellipse drawing element icon 207, triangle drawing element icon 202, octagon drawing element icon 204, hexagon drawing element icon 206, text box drawing element icon 208, callout drawing element icon 210, note block drawing element icon 212, table drawing element icon 214, detail element drawing element icon 231, magnifying view drawing element icon 233. Other common element drawing element icons may include drawing border drawing element icon 281, FIG. 10B, title block drawing element icon 283, continuation block drawing element icon 285, application block drawing element 287, material block drawing element icon 291, revision block icon 301, horizontal dimension drawing element icon 303, vertical dimension drawing element icon 305, aligned dimension drawing element icon 307, angular dimension drawing element icon 309, and diameter dimension drawing element icon 311 and radius dimension drawing element icon 313, feature control frame drawing element icon 310, FIG. 10C, datum target drawing element icon 317 and datum feature symbol drawing element icon 319. The common elements drawing element icons described above can be selected by "dragging and dropping" the selected drawing element icon onto fabrication drawing sheet 172 to add documentation thereto to create the documentation needed for the manufacturing documentation release package. For example, text box drawing element icon 208, FIG. 10A, can be selected to generate text block drawing element 209, FIG. 10C, on fabrication drawing sheet 172. User-defined text notes can be then interactively added to drawing element 209 to create the manufacturing documentation release package (discussed in further detail below). Fabrication drawing button 195 is then selected to generate view 216, FIG. 11. View 216 shows the various fabrication drawing element icons that can be selected to add fabrication drawing elements to fabrication drawing sheet 172 that can then be interactively modified to create the documentation needed for the manufacturing documentation release package. Some examples of the various fabrication drawing element icons that may be utilized to add documentation to fabrication drawing sheet 172 include, inter alia, fabrication notes drawing element icon 218, board outline drawing element icon 220, drill pattern drawing element icon 222, drill chart drawing element icon 224, custom PCB image drawing element icon 226, layer stack-up drawing element icon 230, via stack-up drawing element icon 232, v-score drawing element icon 234, finger chamfer drawing element icon 236, minimum trace width icon 228, import gerber drawing tool icon 238, and fabrication manager drawing tool icon 241. When one of the fabrication drawing element icons is selected, the shape engine reads and parses the PCB CAD data in the PCB database that includes the design of a PCB and provides a "filtered" view that is displayed as the drawing element on fabrication drawing sheet 172. The drawing element may then be interactively modified, and the changes are simultaneously displayed on fabrication drawing sheet 172, e.g., as the different views discussed above. For example, selecting a drill pattern drawing element icon 222 will generate drawing element 223 that provides a filtered view on fabrication drawing sheet 172 that includes drill pattern 225 present in the original PCB design that was loaded into the PCB CAD data in the PCB database. The user can then modify drawing element 223 as needed, as well as text block drawing element 209, e.g., add a new drill pattern 227 to drill pattern 225 or modify drill pattern 225, to create and/or modify the documentation needed for the manufacturing documentation release package. The modified drawing element is automatically displayed on the screen as fabrication drawing sheet 172. After all the necessary manufacturing documentation is created, typically by adding numerous drawing elements to several fabrication and assembly drawing sheets in one or more documents (as shown below), the results can be saved as a complete manufacturing documentation release package as an ADP file, as discussed above, printed on traditional paper format, or exported in a variety of formats as discussed above.

Figure 12:
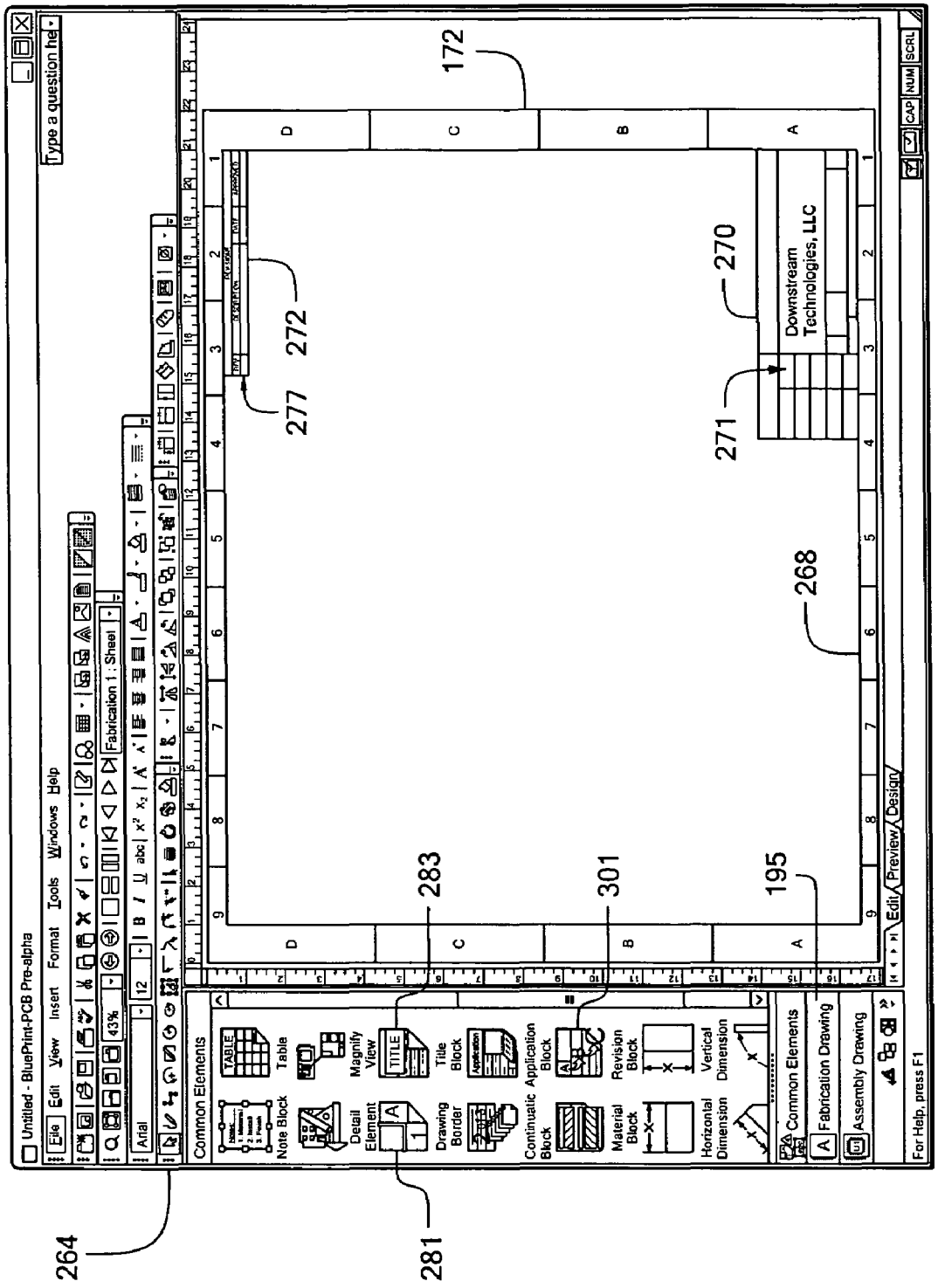
FIG. 12 is a view showing creation of a drawing border drawing element, a title block drawing element, and a revision block drawing element on the fabrication drawing sheet.
Figure 13:
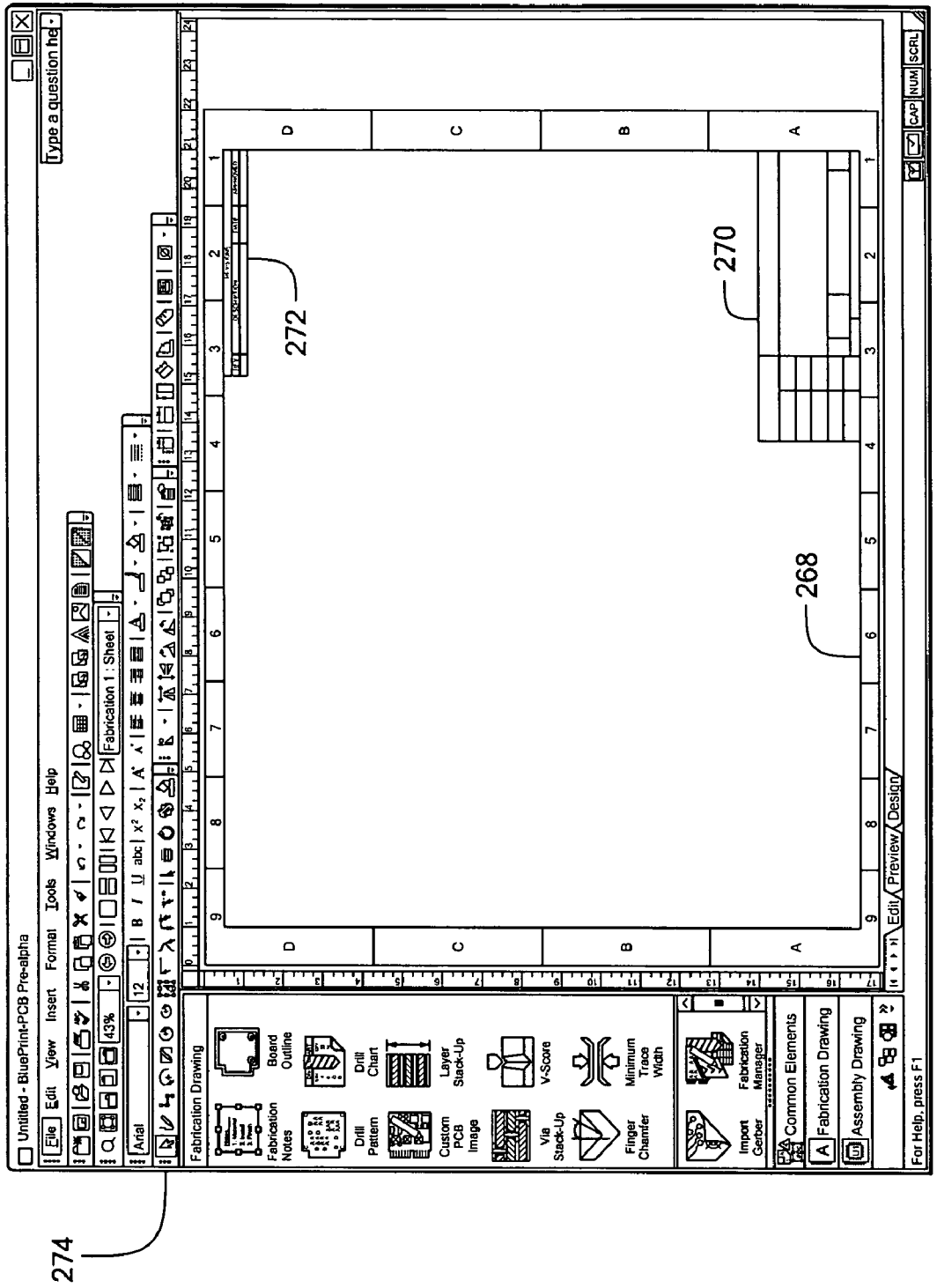
FIG. 13 is a view showing the selection of the fabrication drawing button and the associated fabrication drawing element icons.

View 264, FIG. 12, shows an example of the selection of drawing border drawing element icon 281 to generate drawing border drawing element 268 on fabrication drawing sheet 172. Drawing border drawing element 268 can then be interactively customized as needed. Similarly, the selection of title block drawing element icon 283 generates title block drawing element 270 to which the various user-defined documentation, e.g., document title, company name, and the like, can be annotated as indicated by arrow 271. Selection of revision block drawing element icon 301 generates revision block drawing element 272 that provides for entering revision documentation, as indicated by arrow 277. Selecting fabrication drawing button 195 generates view 274, FIG. 13, similar to view 216, FIG. 11, that shows the added drawing border drawing element 268, title block drawing element 270, and revision block drawing element 272 as described above.

Figure 14:
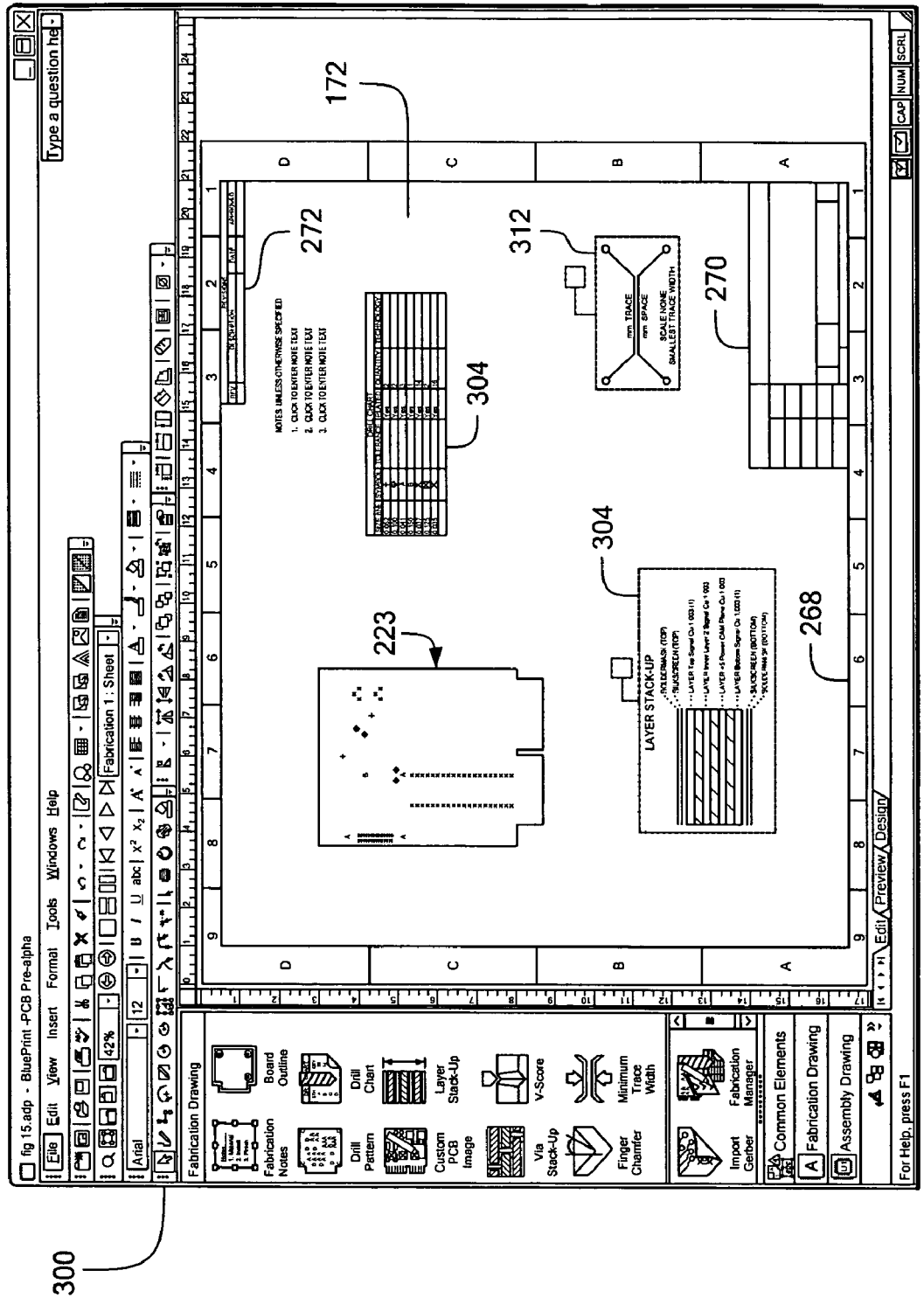
FIG. 14 is a view showing an example of various drawing elements that have been created on the fabrication drawing sheet associated with a PCB design.
Figure 15:
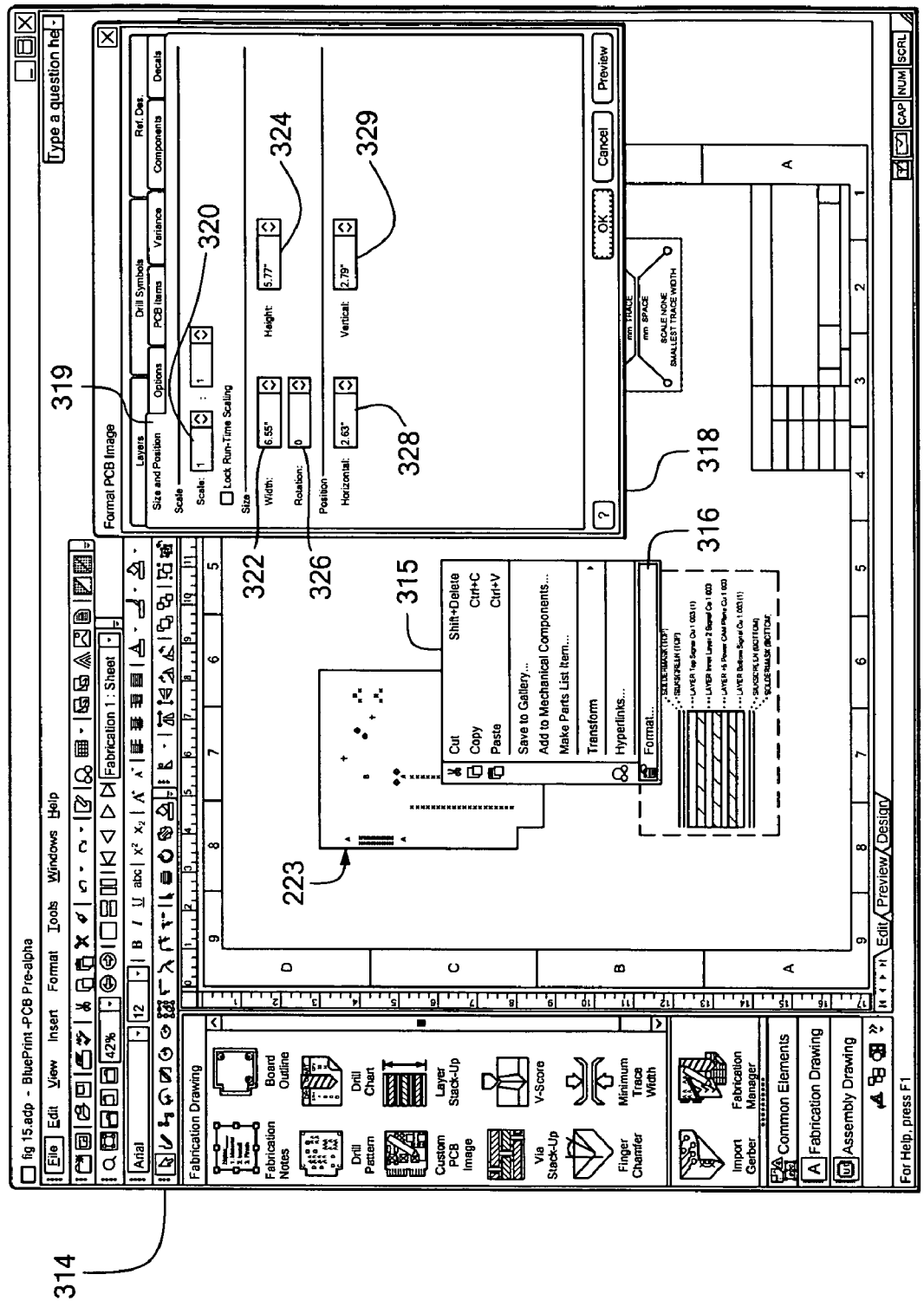
FIG. 15 is a view of a format PCB image dialog box showing the selection of the size and position tab to display the various size and position properties associated with a drill pattern drawing element.

FIG. 14 shows view 300 with fabrication drawing sheet 172 that now includes drawing border drawing element 268, title block drawing element 270, and revision block drawing element 272. In this example, fabrication drawing sheet 172 also includes drill pattern drawing element 223, drill chart drawing element 304, layer stack-up drawing element 306, and minimum trace width drawing element 312. As discussed above, the various reconfigurable drawing elements on fabrication drawing sheet 172 can be interactively modified as needed to create the complete manufacturing documentation release package. The drawing elements on fabrication drawing sheet 172 provide views of the PCB data for a particular PCB design that has been imported into the PCB database that can be re-sized, re-positioned, and oriented on fabrication drawing sheet 172. For example, as shown in view 314, FIG. 15, the properties associated with drill pattern drawing element 223 may be selected by right clicking on drawing element 223. This generates context menu 315 wherein format menu item 316 is selected to generate PCB image dialog box 318. Size and position tab 319 is selected to modify the size and position properties of drill pattern drawing element 223, e.g., the scale, indicated at 320, the width and height, as indicated at 322 and 324, respectively, the rotation of drill pattern drawing element 223, indicated at 326, and the horizontal and vertical position of drawing element 223, indicated at 328, and 329, respectively. The result is the ability to easily reconfigure drawing element 223 on fabrication drawing sheet 172 to create and modify the necessary documentation for a complete manufacturing documentation release package.

Figure 16:
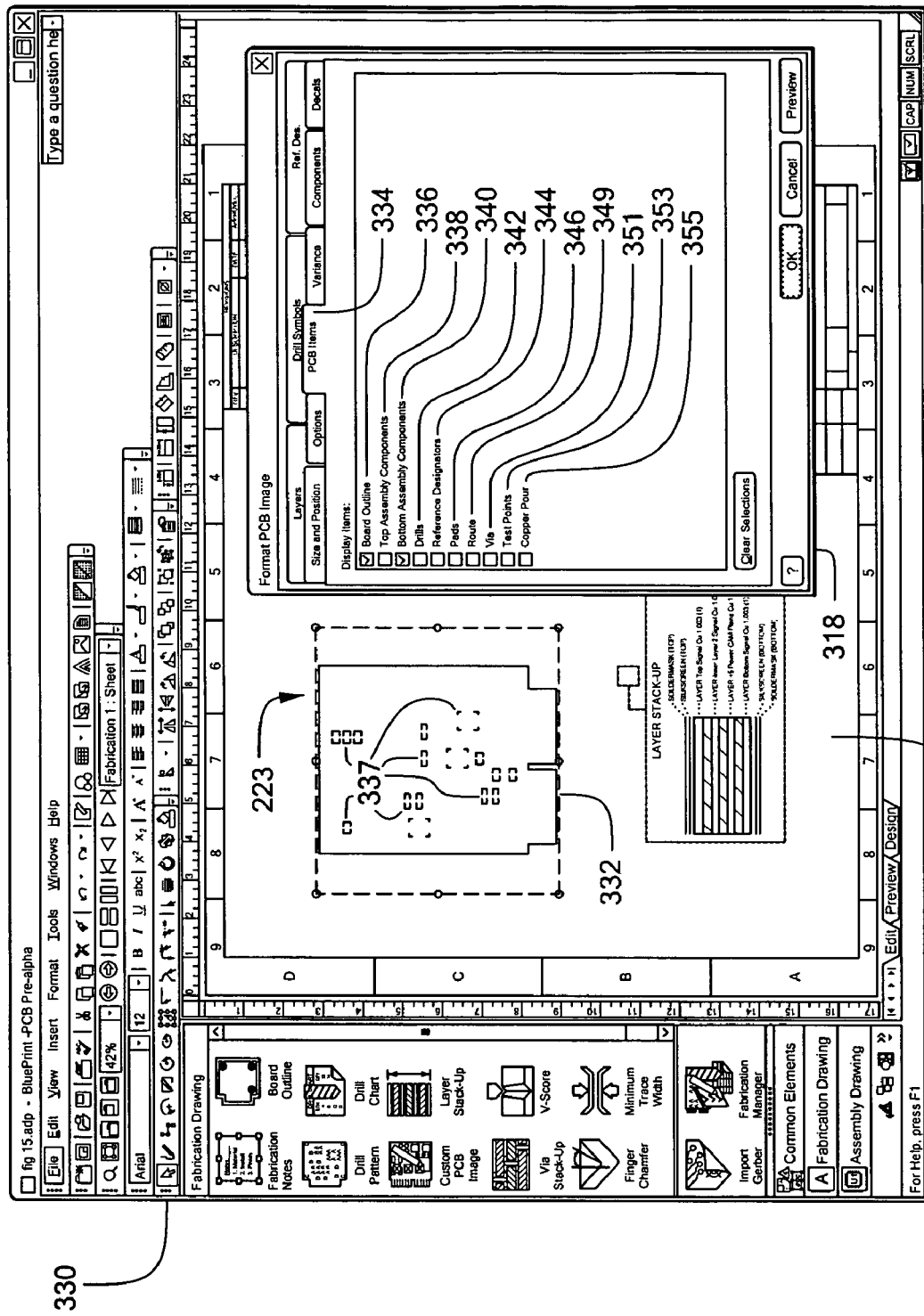
FIG. 16 is a view of a format PCB image dialog box showing the selection of the PCB items tab and the board outline object and the bottom assembly components object for a drawing element.
Figure 17:
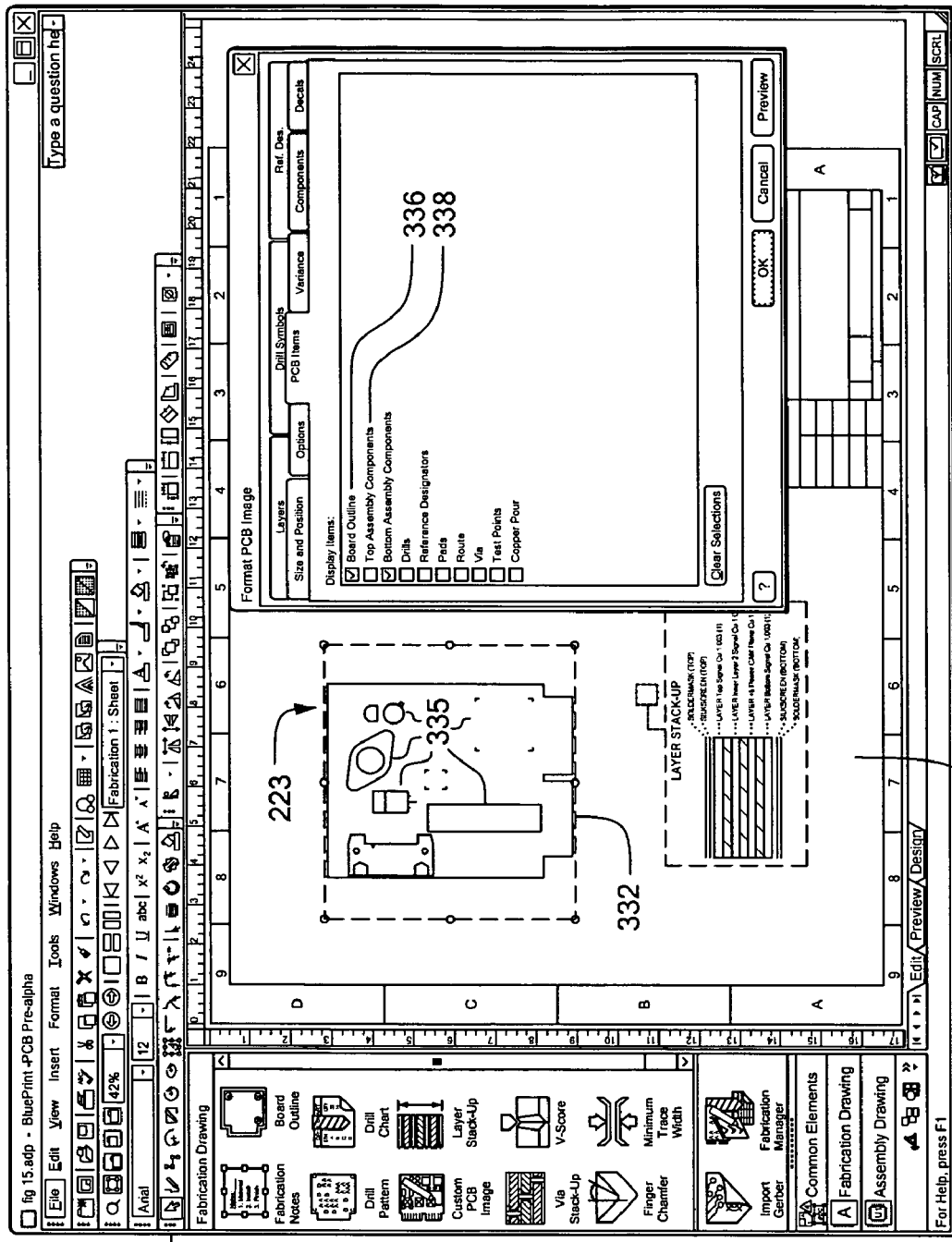
FIG. 17 is another view of the format PCB image dialog box shown in FIG. 16 depicting the selection of the board outline and top assembly components object for the drawing element.

View 330, FIG. 16, shows an example of the selection of PCB items tab 334 in format PCB image dialog box 318 for drawing element 223. PCB items tab 334 includes checkboxes for selecting various drawing element objects that will generate drawing element 223 that includes the specific type of drawing element objects that is selected. The drawing element objects in this example include board outline 336, top assembly components 338, bottom assembly components 340, drills 342, reference designators 344, pads 346, route 349, via 351, test points 353, and copper pour 355. Selecting one or more of the checkboxes for drawing element objects 336-355 results in that type of drawing element object being included in drawing element 223. For example, selecting board outline 336 and bottom assembly components 340 generates drawing element 223 that will include board outline drawing element 332 and bottom assembly components drawing element 337. FIG. 17 shows view 348 depicting drawing element 223 wherein board outline 336 and top assembly components 338 are selected (checked) to generate drawing element 223 that now includes board outline drawing element 332 and top assembly components drawing element 339. Hence, drawing element 223 acts as an interactive filter to display a desired view of a specific type of drawing element or drawing element on fabrication drawing sheet 172 for the PCB CAD data in the PCB database. As discussed above, the selected drawing elements can then be interactively modified as needed to create the manufacturing documentation release package.

Figure 18A:
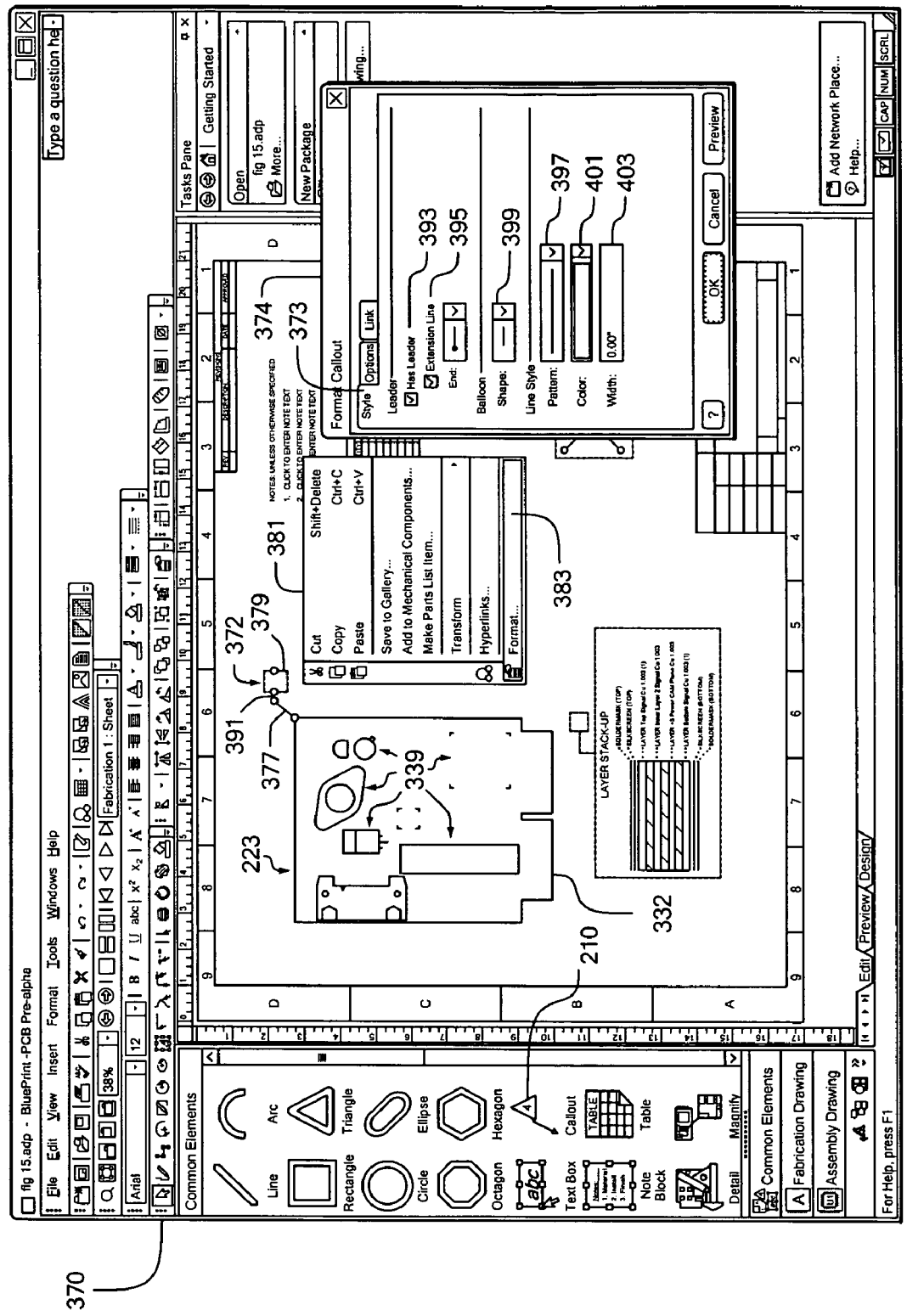
FIG. 18A is a view showing a context menu and the associated format callout dialog box for a callout drawing element.

View 370, FIG. 18A, shows an example in which callout drawing element 372 has been added to drawing element 223 by selecting callout drawing element icon 210. In this example, drawing element 223 includes board outline drawing element 332 and top assembly components drawing element 339, discussed above. The style properties associated with callout drawing element 372 may be modified by right clicking on callout drawing element 372 to generate context menu 381 and then selecting format item 383 in context menu 381. Style tab 373 in format callout dialog box 374 is then selected. The style properties associated with callout drawing element 372 typically include whether to include lead line 377 and extension line 391 (by selecting checkboxes 393 and 395), the shape of balloon 379 (by selecting a shape from drop-down box 399), and the style of lead line 377 and extension line 391, e.g., line pattern, color and width, indicated at 397, 401, and 403, respectively.

Figure 18B:
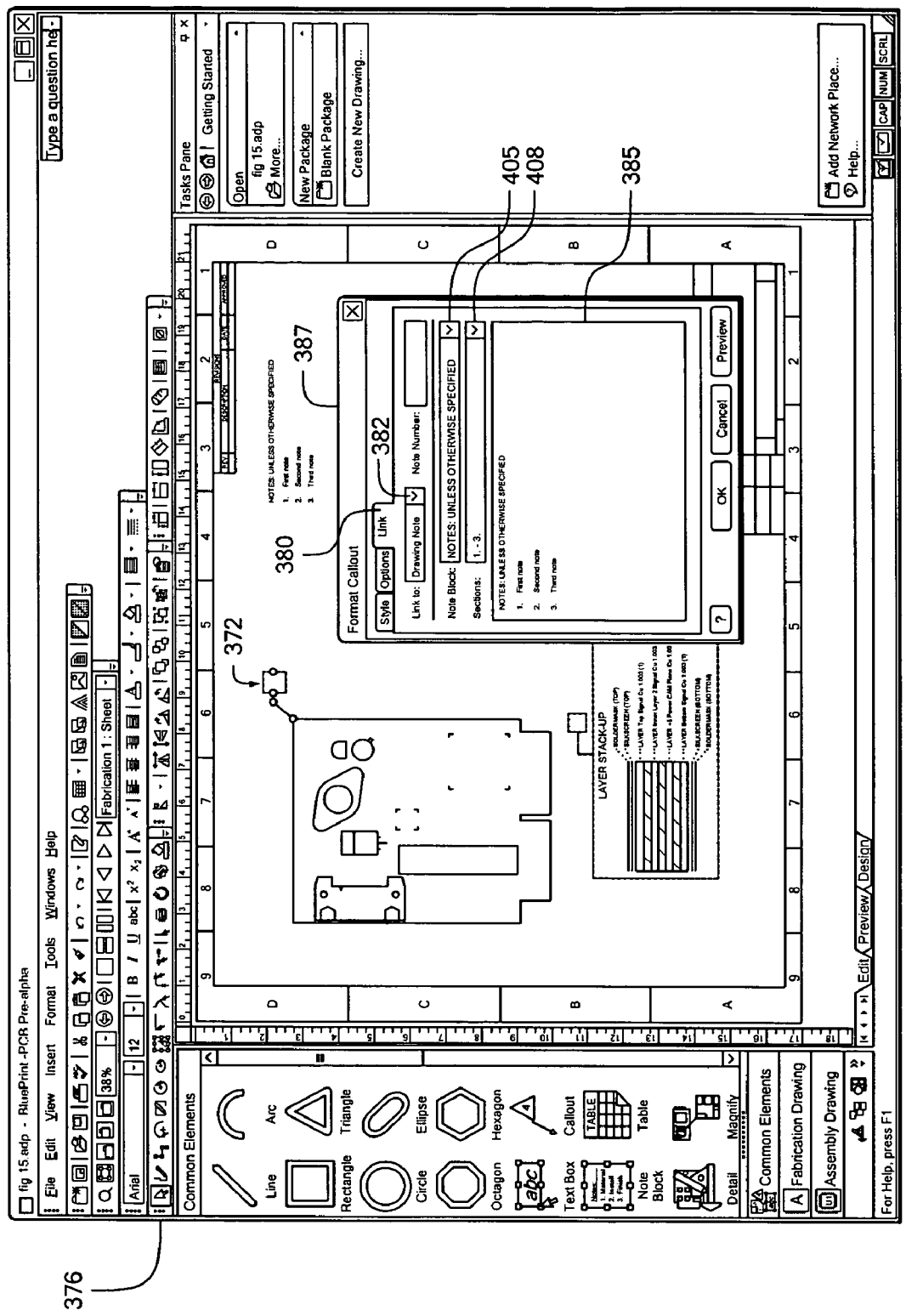
FIG. 18B is a view of the format callout dialog box shown in FIG. 18A showing the selection of the link tab to create a link between a note number of a note block and the callout.
Figure 18C:
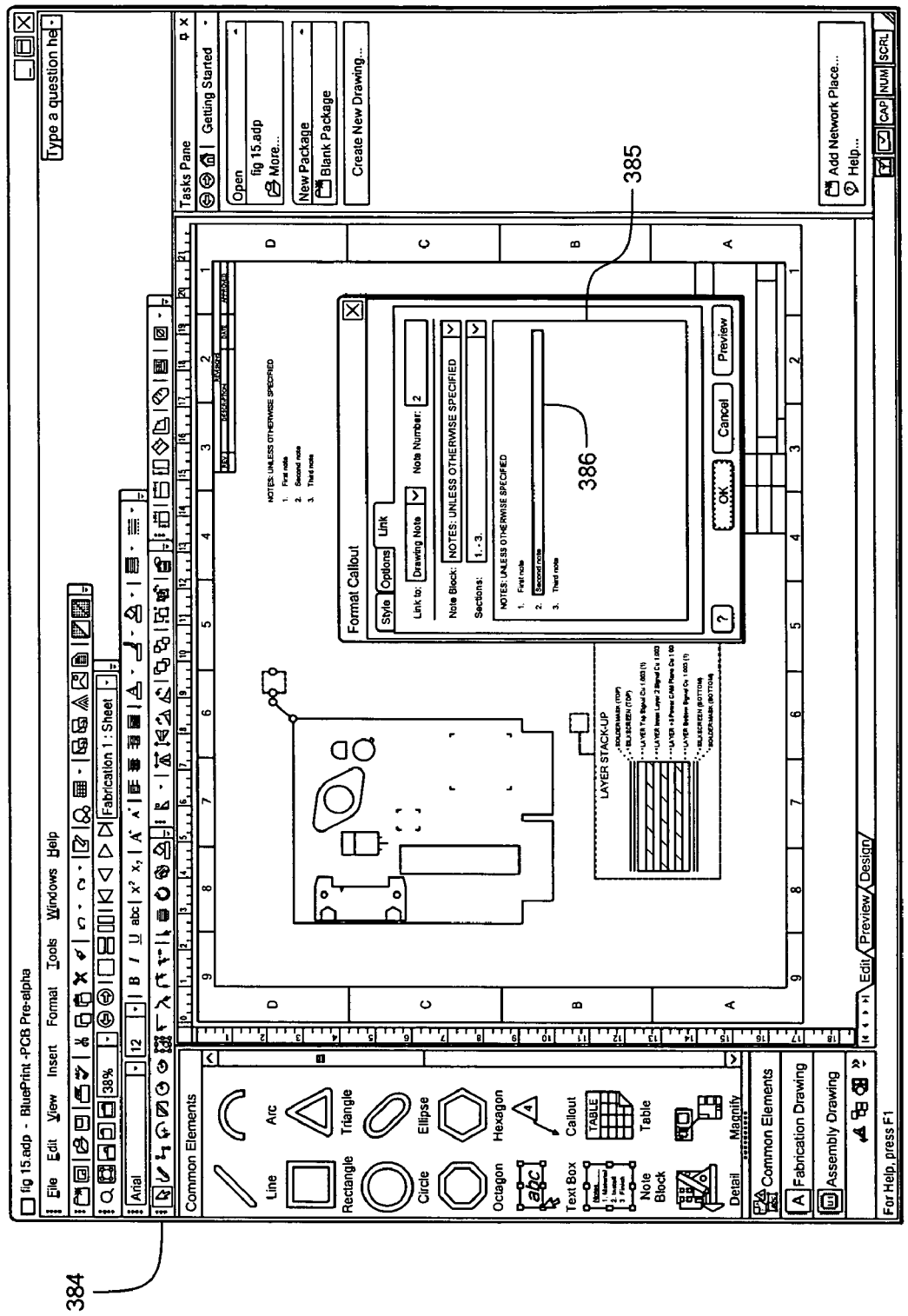
FIG. 18C is a view showing the selection of a desired note number from the note block to be linked to the callout.
Figure 18D:
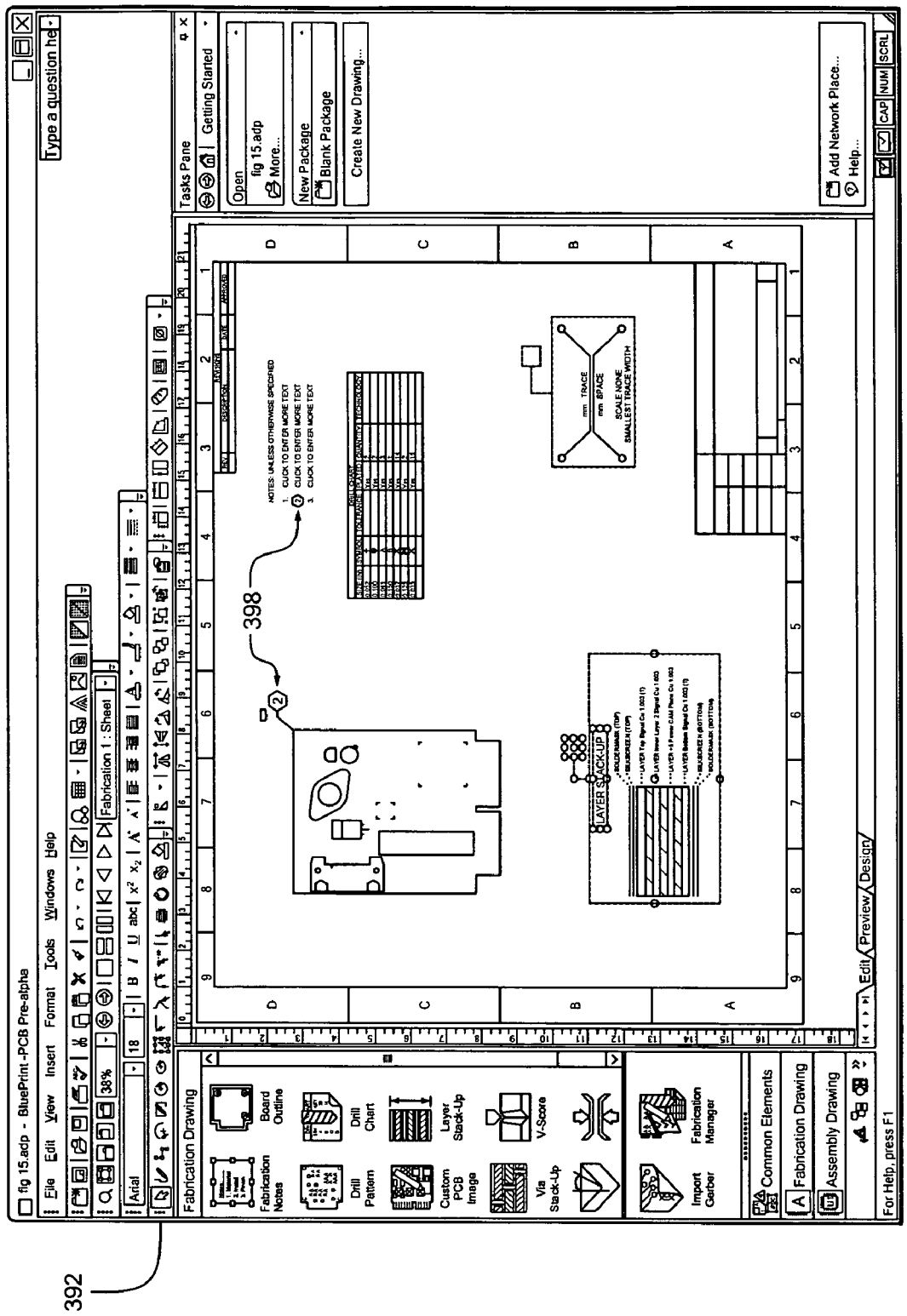
FIG. 18D is a view showing the completed link of the note number from the note block to the callout.

View 376, FIG. 18B, shows an example of the creation of a link between callout drawing element 372 and a note number in note block 385. The user first right clicks on callout drawing element 372 which generates format callout dialog box 387. Link tab 380 is then selected. Drop-down box 382 is used to select a drawing note. Drop-down note block box 405 selects a particular note block, e.g., note block 385, and section drop-down box 408 selects the desired section of the selected note block (e.g., sections 1-3). The desired note number from note block 385 is selected by clicking on the desired note number. The selected note number is then linked to callout drawing element 372. For example, as shown in view 384, FIG. 18C, note number "2" has been selected, as indicated at 386, for callout drawing element 372. View 392, FIG. 18D, shows that callout drawing element 372 is now linked to note number "2" of note block 385, as indicated by arrow 398.

Figure 19:
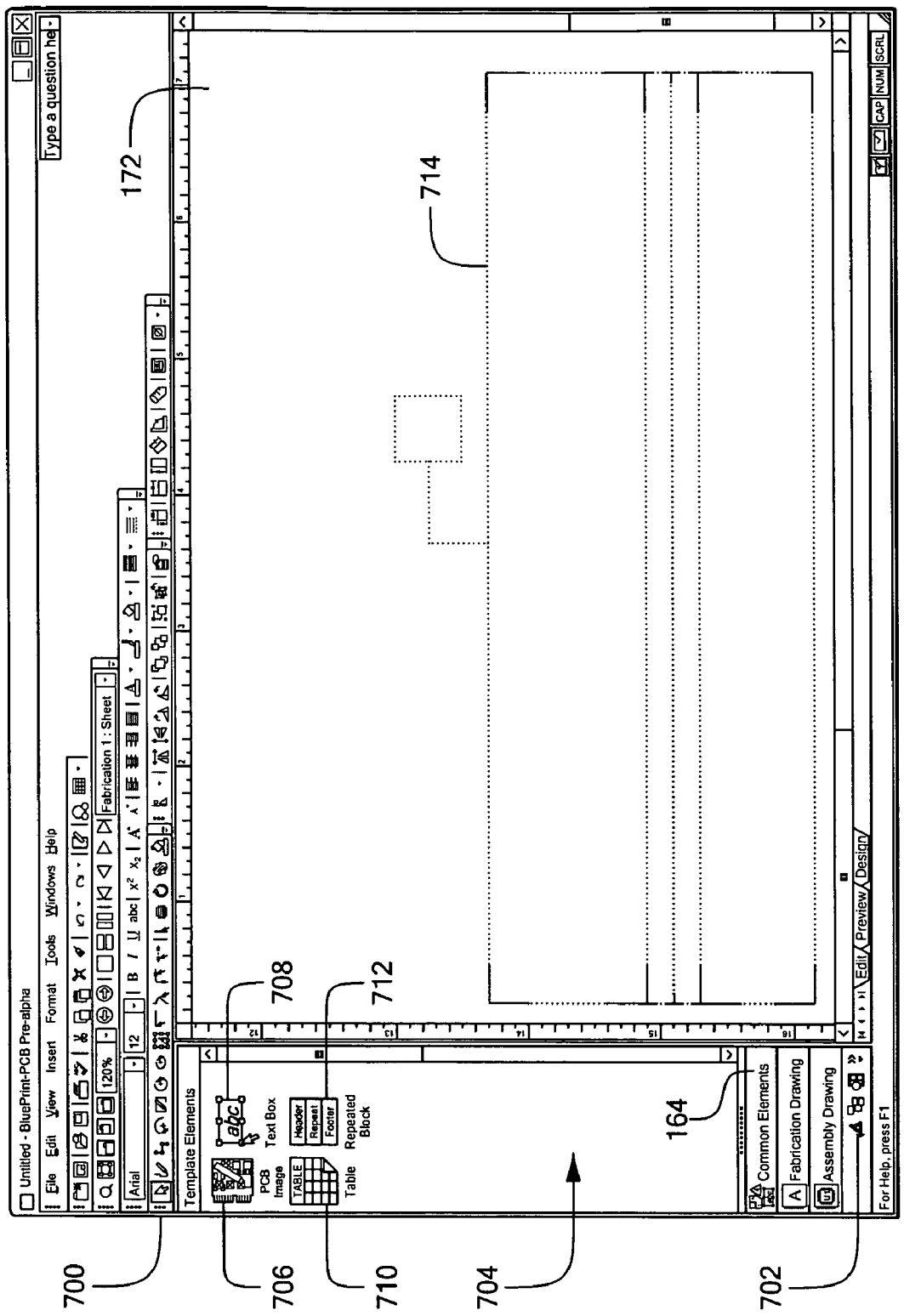
FIG. 19 is a view showing the selection of the template elements button and the selection of the repeated block template element icon to create a user-defined template element.
Figure 20:
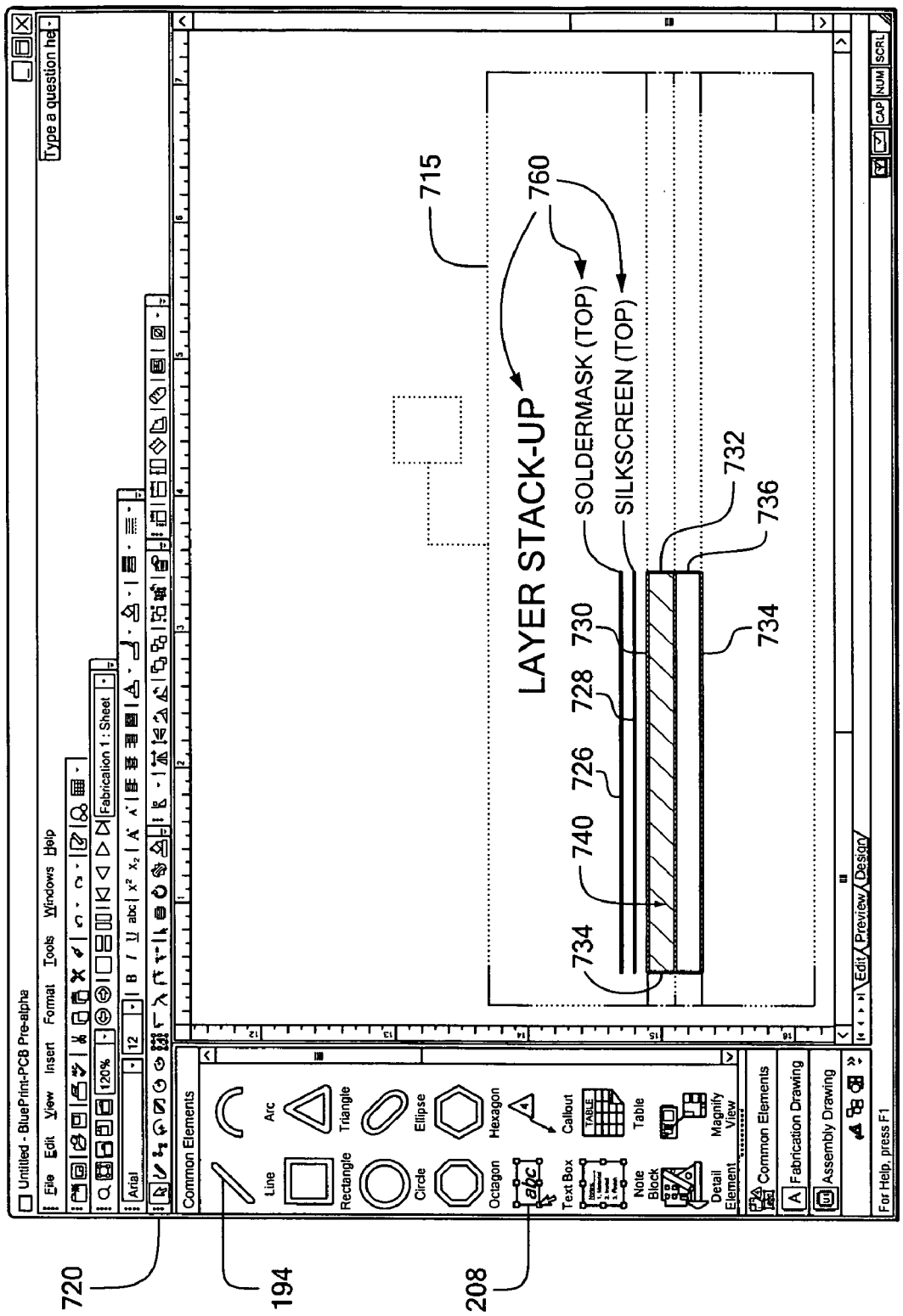
FIG. 20 is a view showing an example of a completed user-defined template element.

View 700, FIG. 19, shows a template button 702 is selected that opens template elements category 704. Template elements category 704 includes PCB image template element icon 706, text block template element icon 708, table template element icon 710 and repeated block template element 712. In this example, repeated block template element 712 has been selected to generate repeated block template element 712 on drawing sheet 172. Selection of common elements button 164 generates view 720, FIG. 20. In this example, a user-defined, customized layer stack-up template element 715 is created using line drawing element icon 194 to create the need line drawing elements, e.g., line drawing elements 726, 728, 730, 732, 734, 736, 738 and 740. Similarly, text box drawing element icon 208 is selected to generate the various text drawing elements, indicated at 760.

Figure 21:
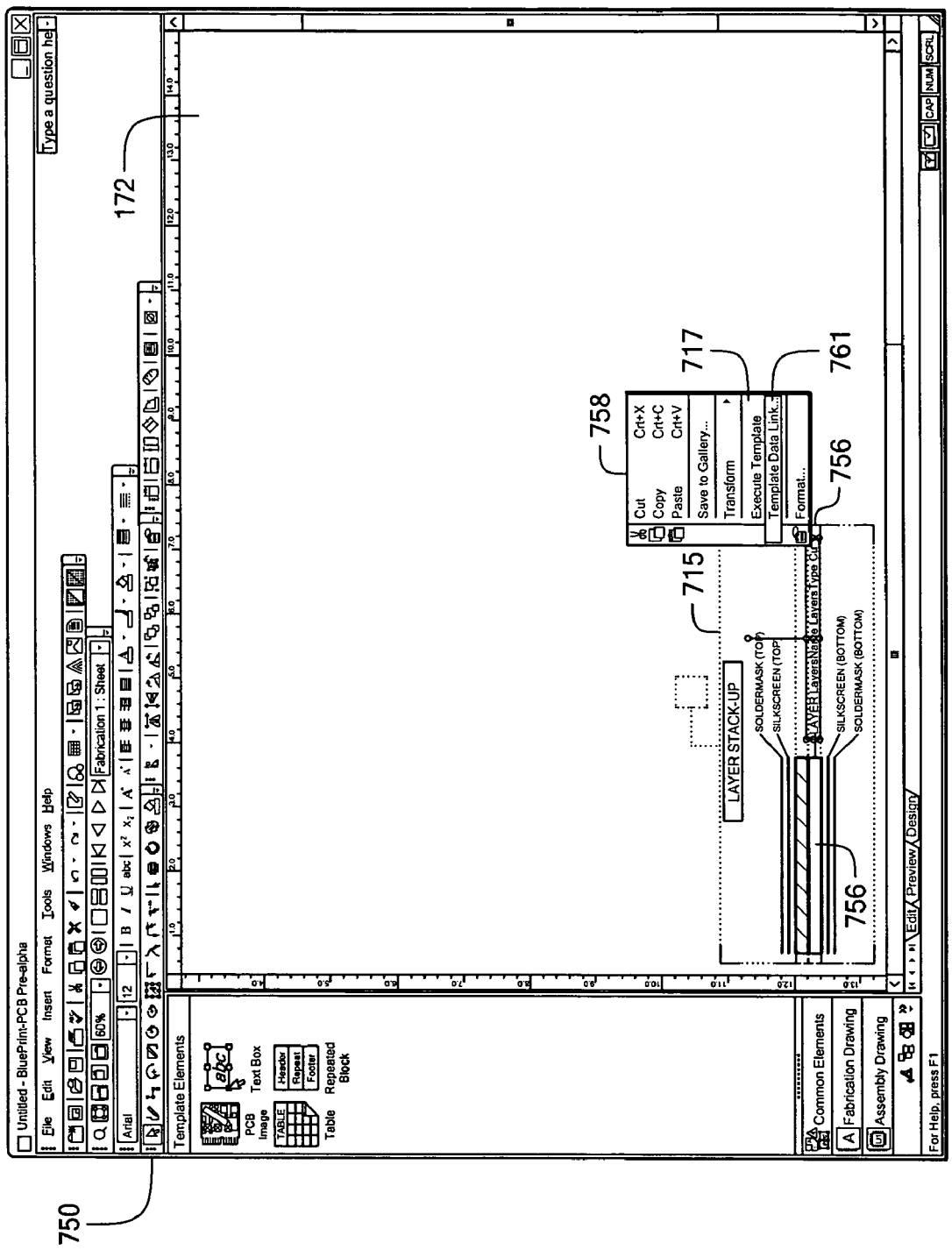
FIG. 21 is a view showing the process of linking the layer stack-up template element shown in FIG. 20 to the PCB database.
Figure 22:
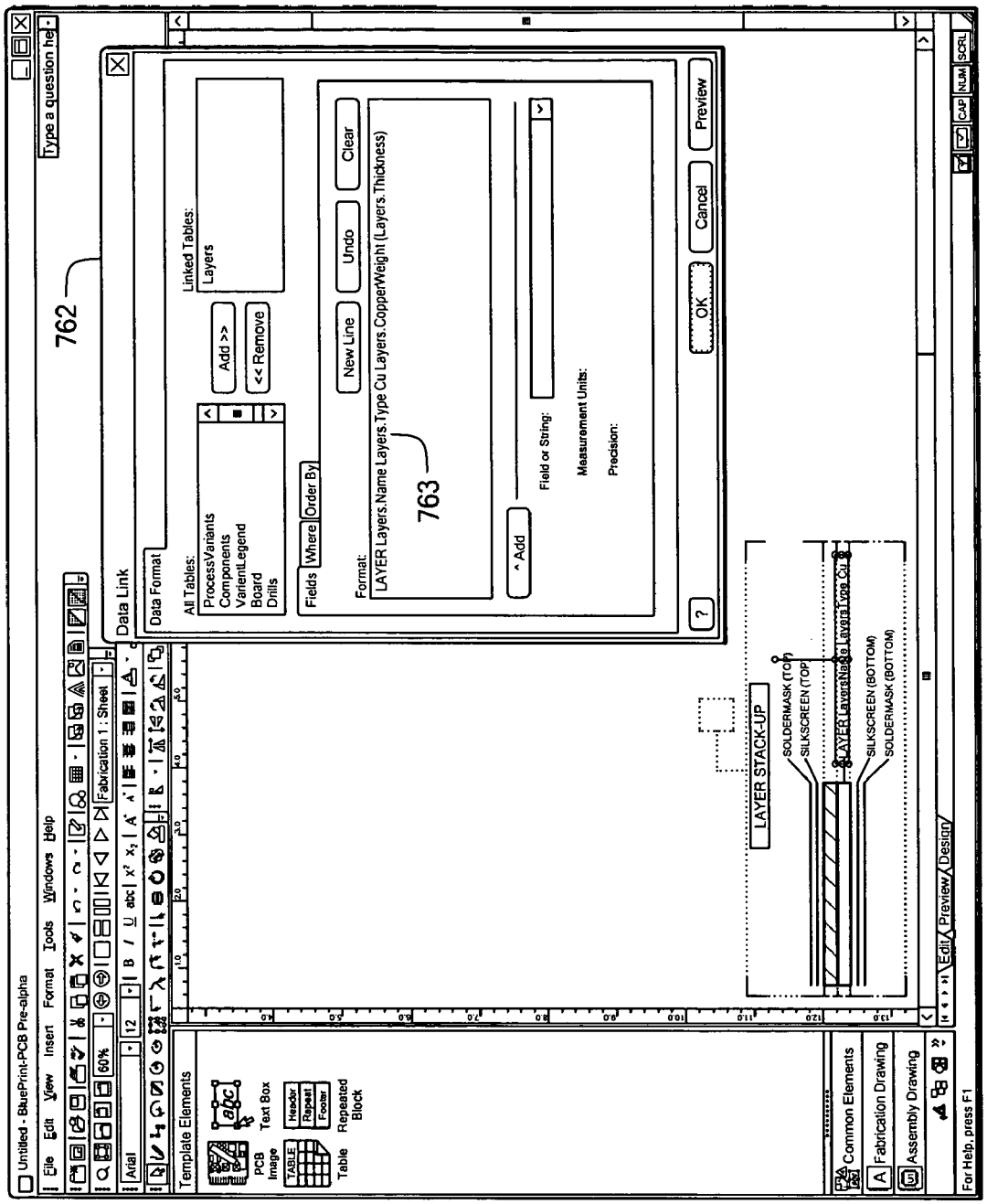
FIG. 22 is a view showing a data link dialog box used to link the template element shown in FIG. 21 to the PCB database.

As discussed above, customized template-based drawing elements may be created using templates that include template elements that display how the data in the PCB CAD database is represented with a drawing element. The various templates can be stored in the element gallery and later reused as needed. View 750, FIG. 21, shows an example of the completed customized layer stack-up template element 715 on fabrication drawing sheet 172. Template element 715 is linked to the data in the PCB CAD database by right clicking on the desired drawing element, e.g., layer drawing element 756 to generate context menu 758. Selection of template data link item 761 generates data link context menu 762, FIG. 22, wherein the desired PCB data link is selected, indicated at 763. Selection of execute template menu item 717 populates template element 715 with the data in the PCB CAD database, e.g., data tables and/or PCB CAD data discussed above.

Figure 23:
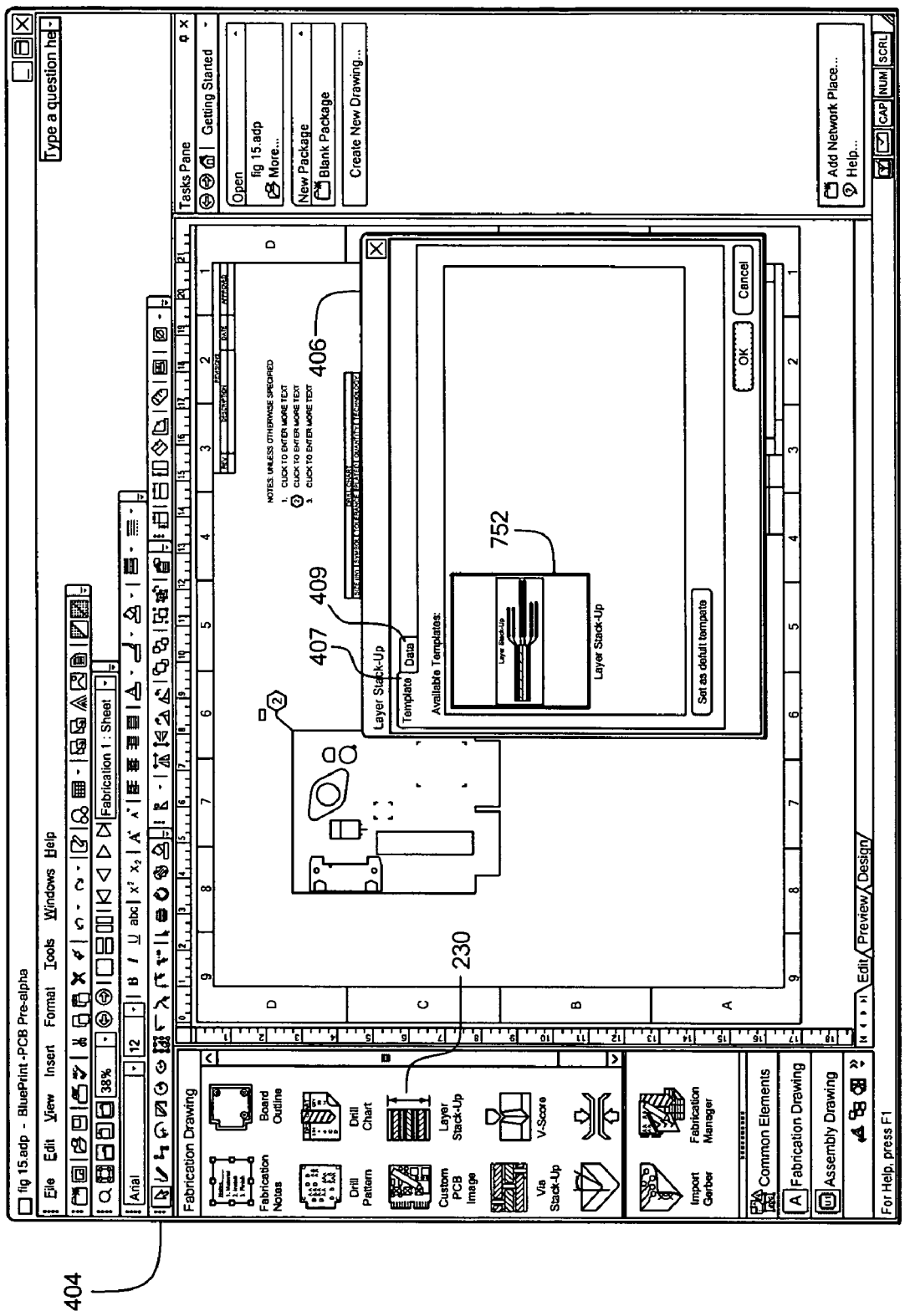
FIG. 23 is a view depicting the selection of a layer stack-up drawing element and the associated layer stack-up dialog box showing the available template elements.

FIG. 23 shows view 404 in which layer stack-up drawing element icon 230 has been selected to generate layer stack-up dialog box 406 that includes template tab 407 and data tab 409. In this example, template tab 407 is selected that display the available user-defined templates, e.g., template element 715 described above.

Figure 24:
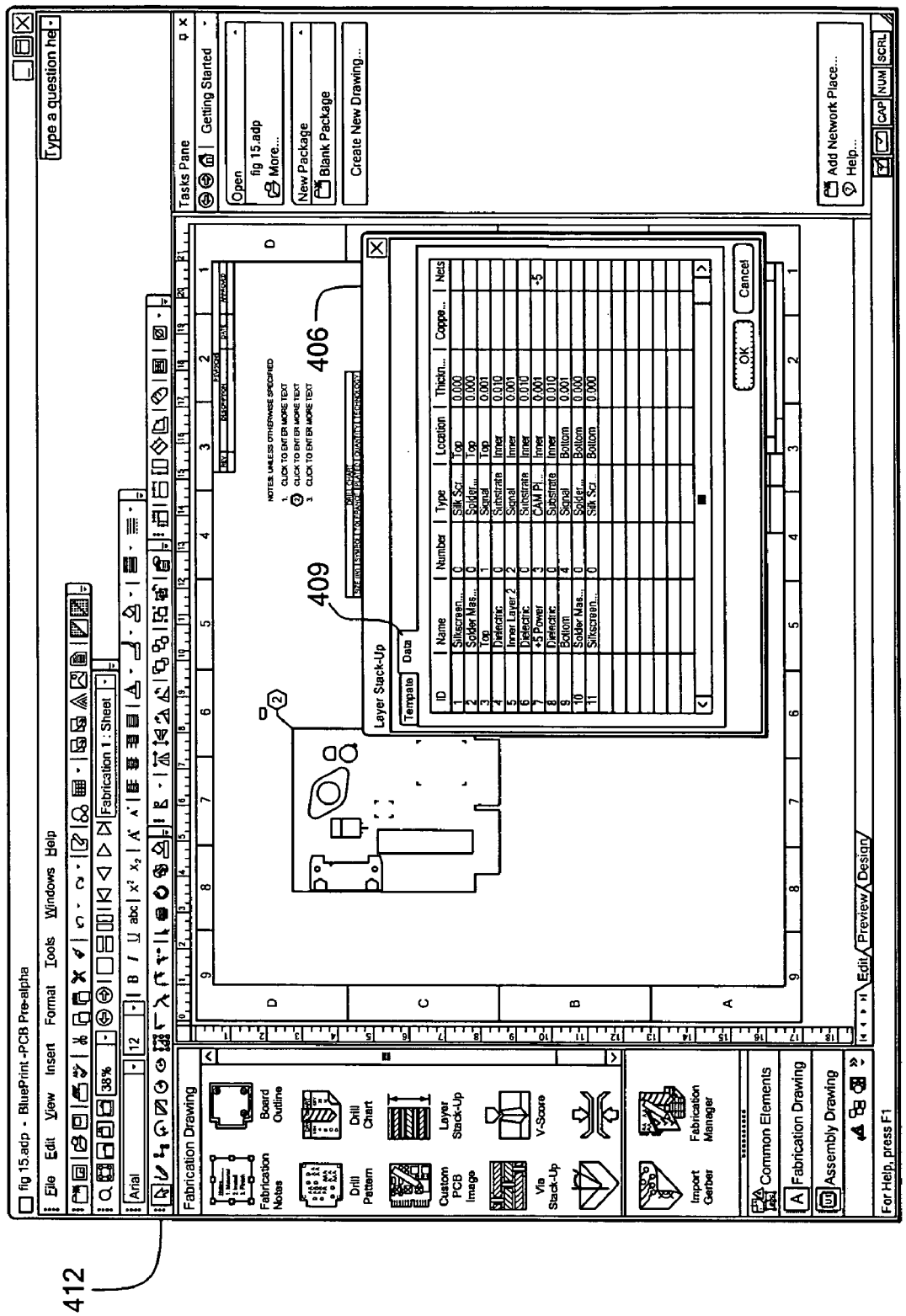
FIG. 24 is a view showing the selection of the data tab on the layer stack-up dialog box and the associated details of the layer stack-up drawing element.
Figure 25:
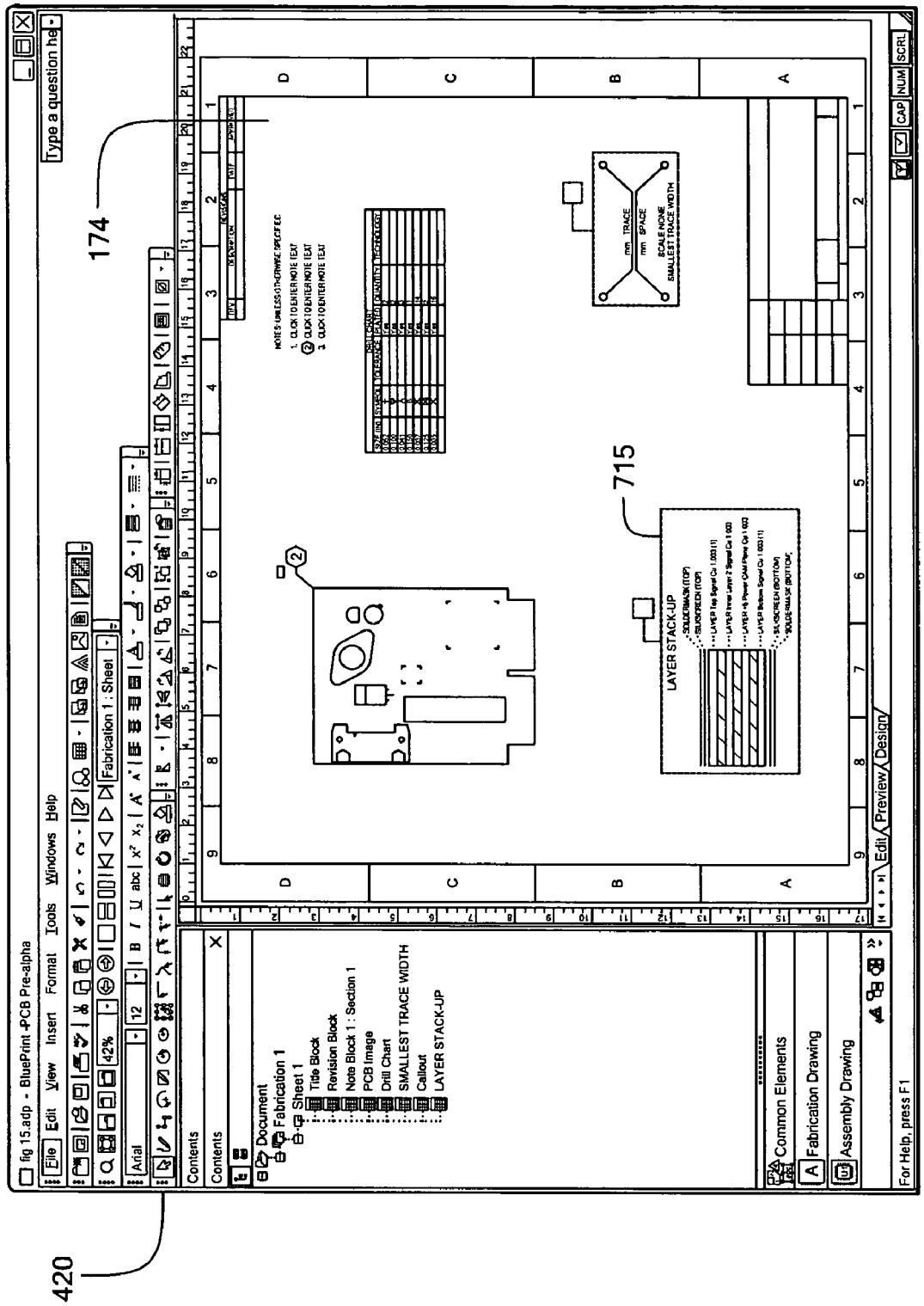
FIG. 25 is a view showing the placement of the layer stack-up drawing element on the fabrication drawing sheet.

View 412, FIG. 24, shows the selection of data tab 409 in layer stack-up dialog box 406 to display the details associated with a layer stack-up template element 715, e.g., the layer name, type, and location. FIG. 25 shows view 420 with the placement of layer stack-up template element 715 now included on fabrication drawing sheet 172.

Figure 26:
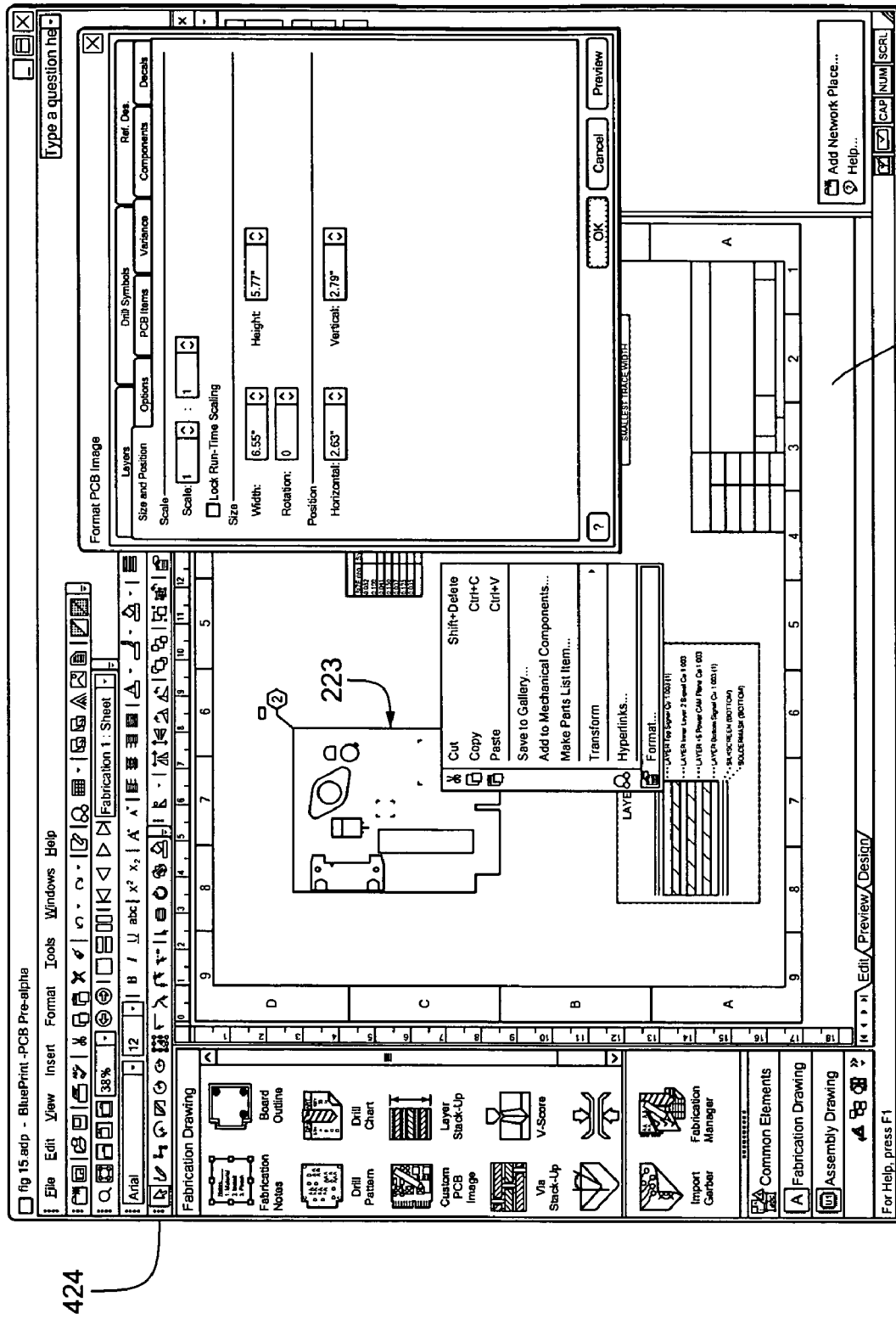
FIG. 26 is another view of the size and position properties of a top-side view drawing element.

View 424, FIG. 26, shows another example of the selection of the size and position tab to display the various size and position properties associated with drill pattern drawing element 223 discussed above.

Figure 27:
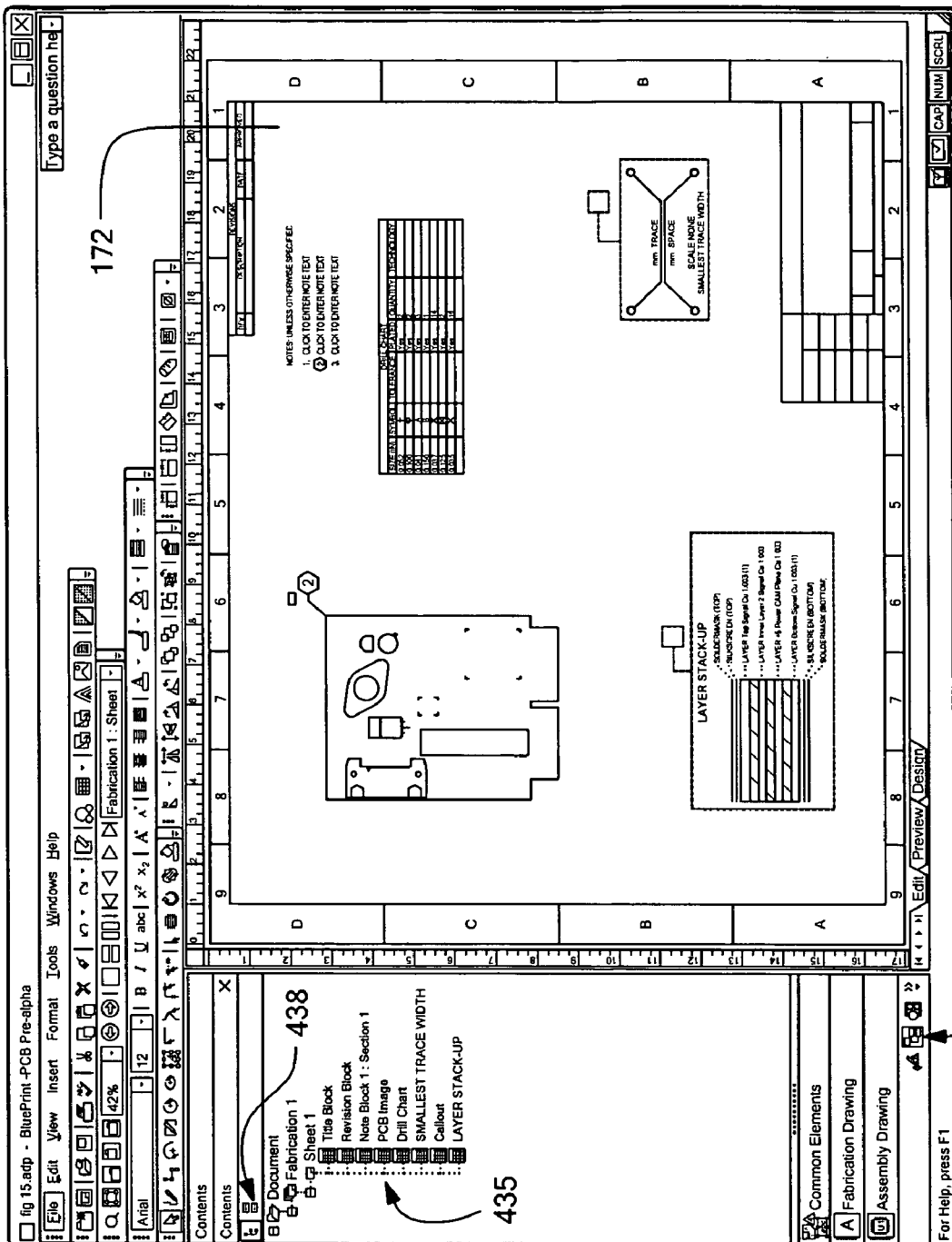
FIG. 27 is a view showing the selection of the contents button and the tree view button to generate a hierarchical tree of the various drawing elements that were created on the fabrication drawing sheet.
Figure 28:
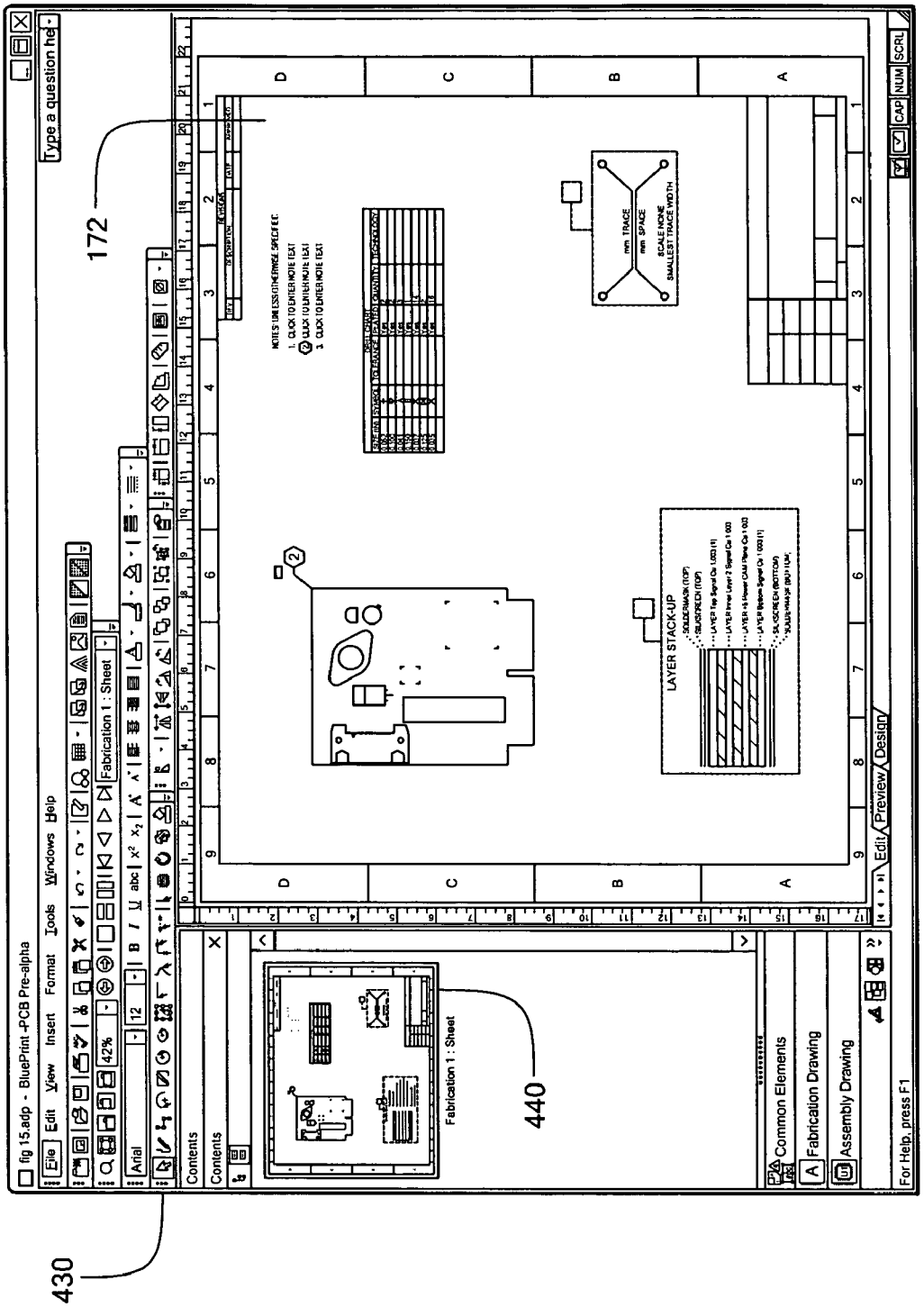
FIG. 28 is a view showing the selection of a thumbnail view button to display a thumbnail view of the fabrication drawing sheet.

FIG. 27 shows view 430 that depicts the selection of contents button 436 to generate a hierarchical view 435 of the various types of drawing elements that have been created on fabrication drawing sheet 172. The selection of thumbnail view button 438 generates thumbnail view 440, FIG. 28, of fabrication drawing sheet 172.

Figure 29:
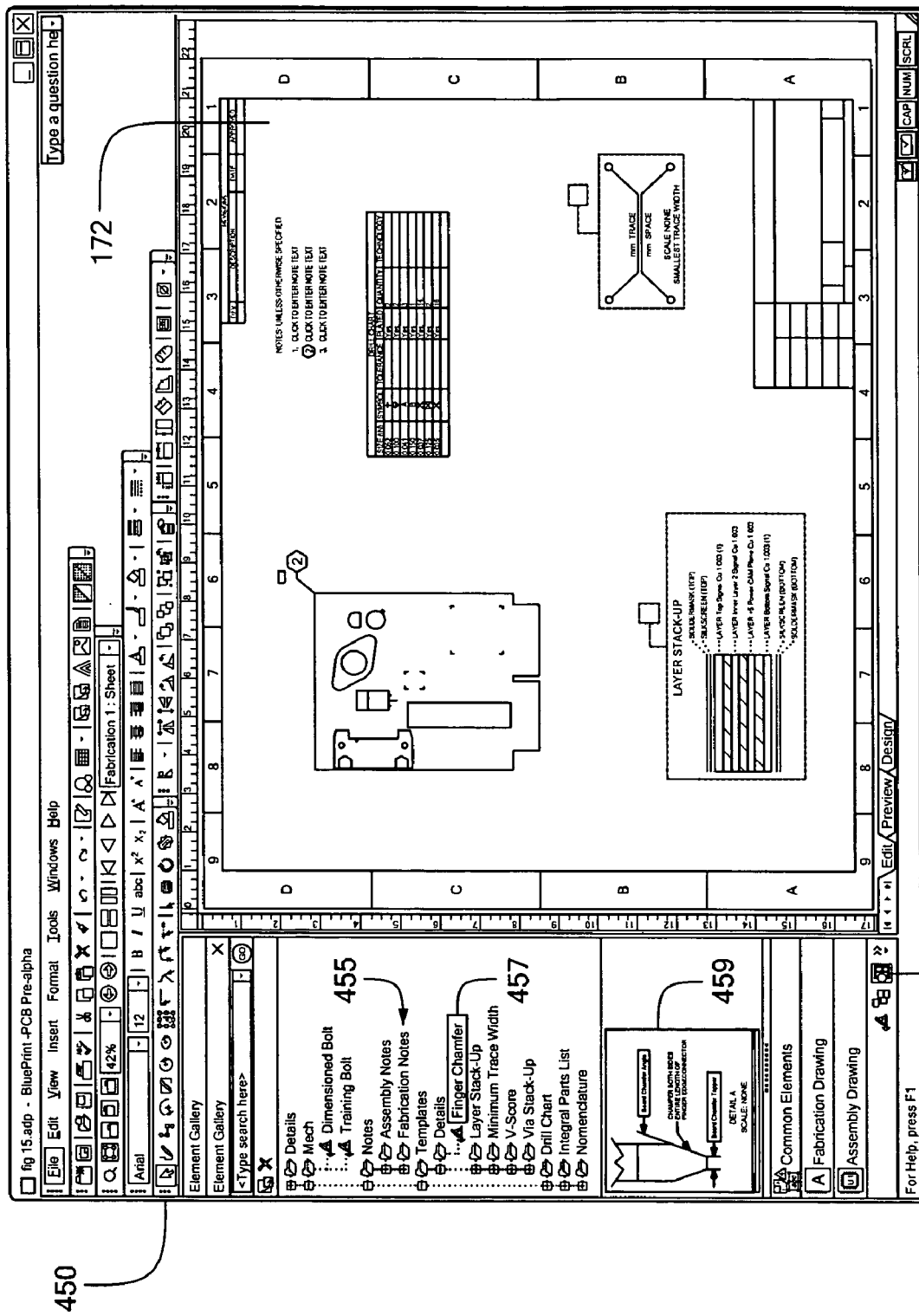
FIG. 29 is a view showing the selection of the element gallery button to display the custom drawing elements and template elements that have been previously saved by a user.

View 450, FIG. 29, shows the selection of element gallery button 452 to display various user-defined drawing elements 454 and template elements indicated generally by arrow 455 that were saved in a session of creating a manufacturing documentation release package, e.g., assembly notes, fabrication notes, templates, drill charts, integrated parts list, and the like. In this example, a finger chamfer template element is selected, as indicated at 457 to display thumbnail view 459 of the template. The saved user-defined drawing elements can be reloaded on fabrication drawing sheet 172 as needed.

Figure 30:
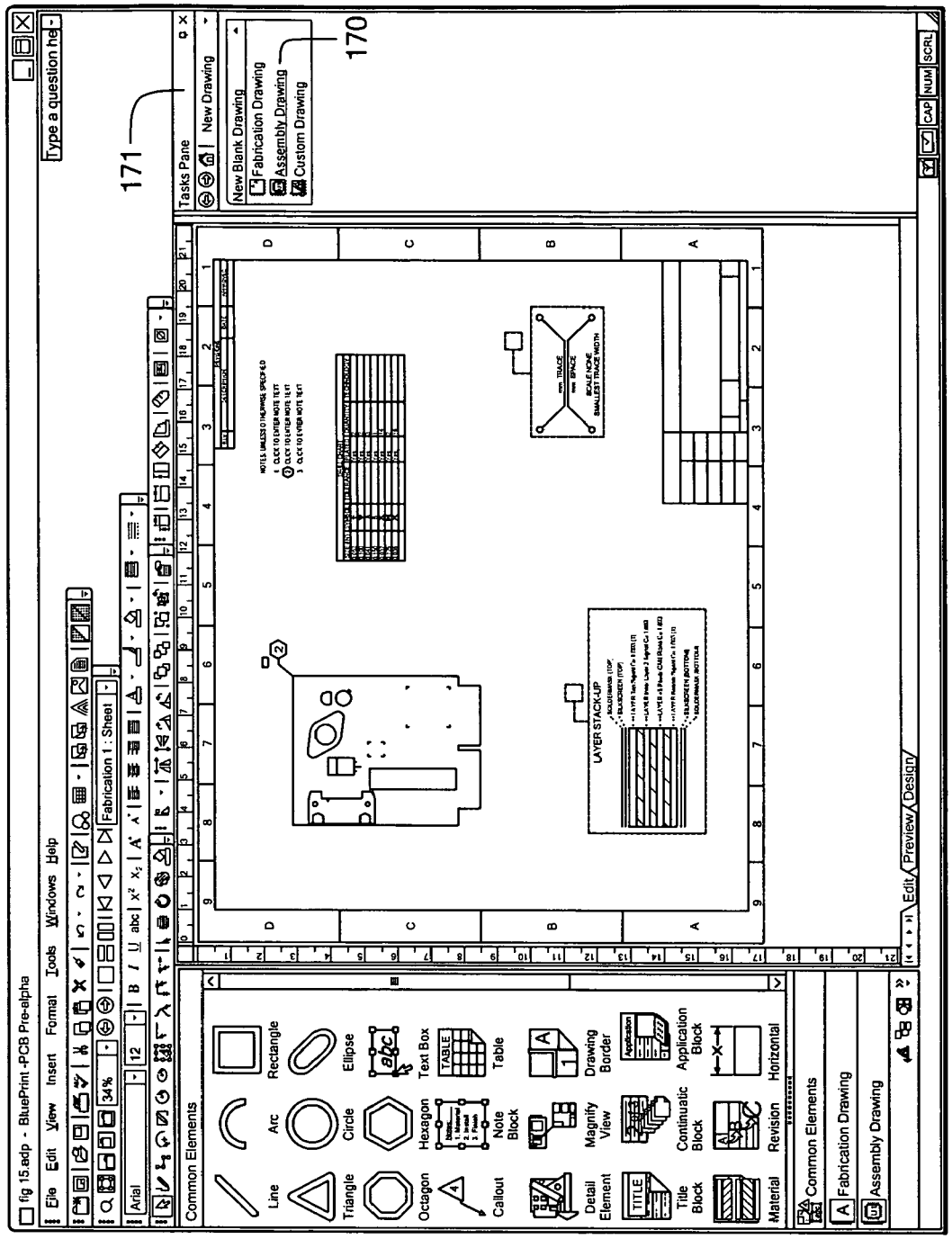
FIG. 30 is a view showing the selection of the assembly drawing button to create an assembly drawing with one blank sheet.
Figure 31:
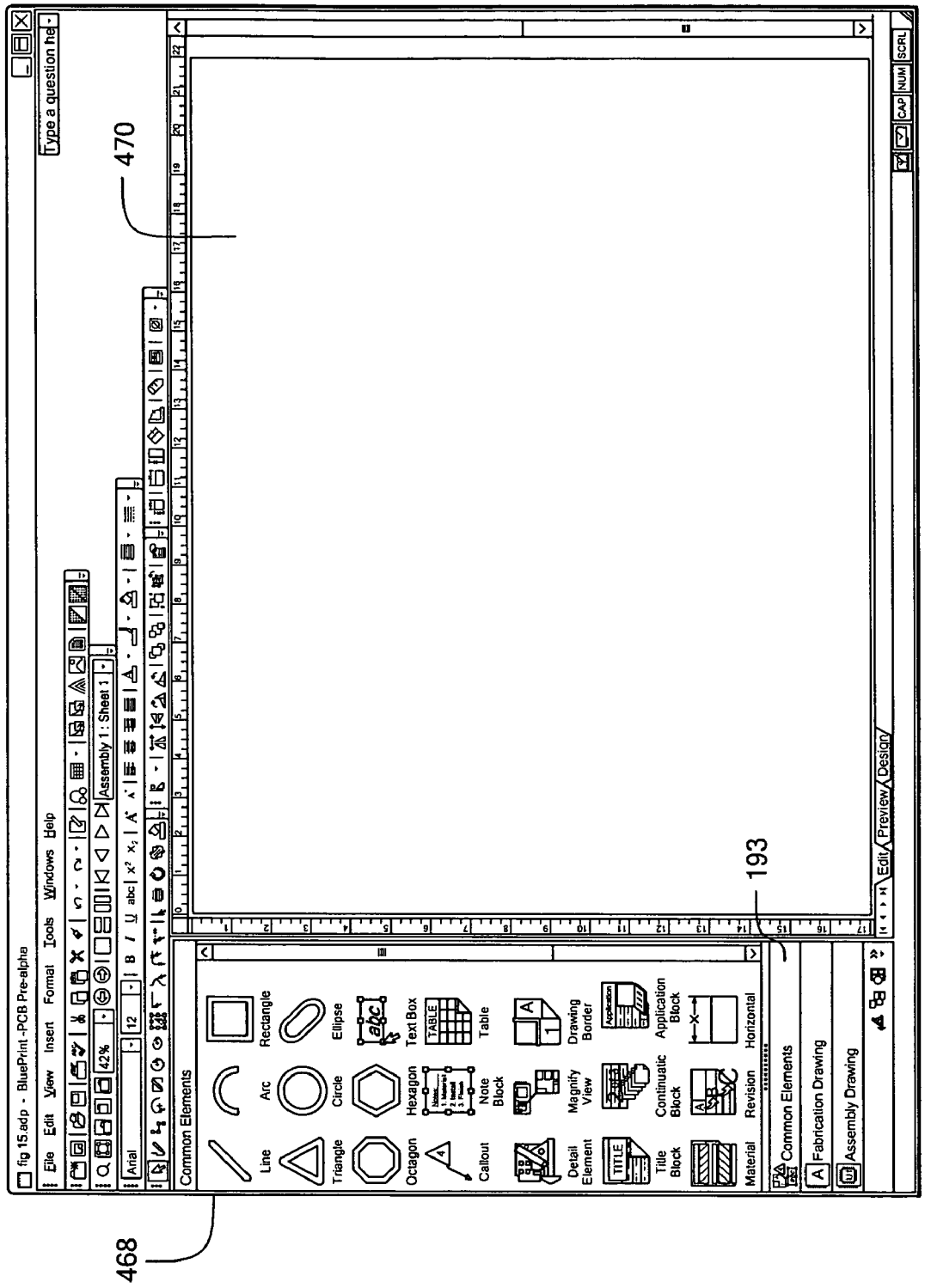
FIG. 31 is a view showing the blank assembly drawing sheet created in FIG. 30.
Figure 32:
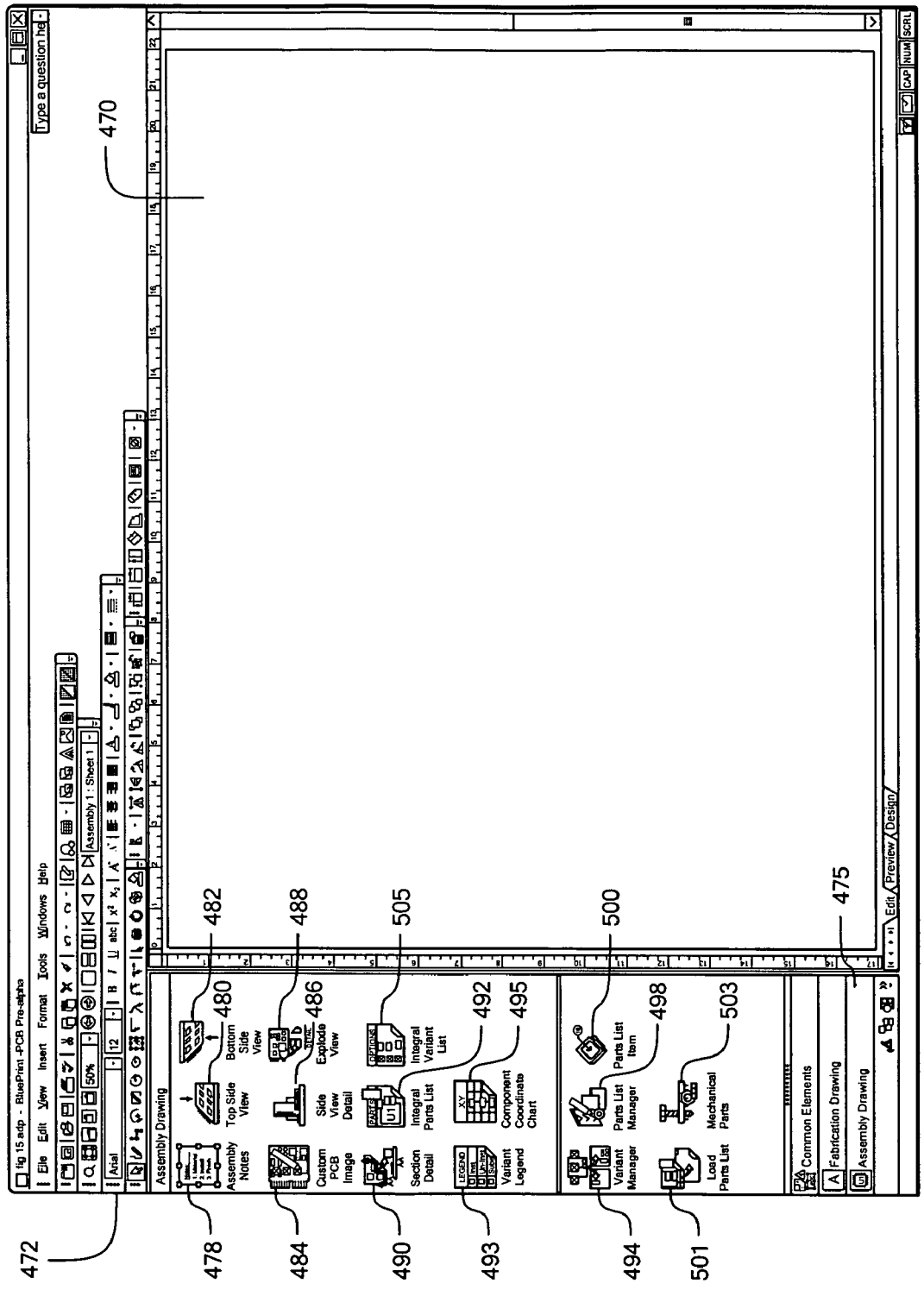
FIG. 32 is a view showing the selection of the assembly drawing button to display the associated assembly drawing element icons.

Selecting assembly drawing button 170, FIG. 30, in tasks pane 171 generates view 468, FIG. 31, that includes newly created assembly drawing sheet 470 and the associated drawing element icons that are displayed when common elements button 193 is selected, as discussed above. View 472, FIG. 32, shows the selection of assembly drawing button 475 to generate the various assembly drawing element icons that may be used to create drawing elements on assembly drawing sheet 470. The assembly drawing element icons include, inter alia, assembly notes element icon 478, top-side view drawing element icon 480, bottom-side view drawing element icon 482, custom PCB image drawing element icon 484, side view detail drawing element icon 486, explode view drawing element icon 488, section drawing element icon 490, integral parts list drawing element icon 492, integral variant list drawing element icon 505, variant legend drawing element icon 493, component coordinate chart drawing element icon 495, variant manager drawing tool icon 494, parts list manager drawing tool icon 498, parts list item drawing tool icon 500, load parts list drawing tool icon 501 and mechanical parts drawing tool icon 503, that can be used to generate the associated drawing elements on assembly drawing sheet 470.

Figure 33:
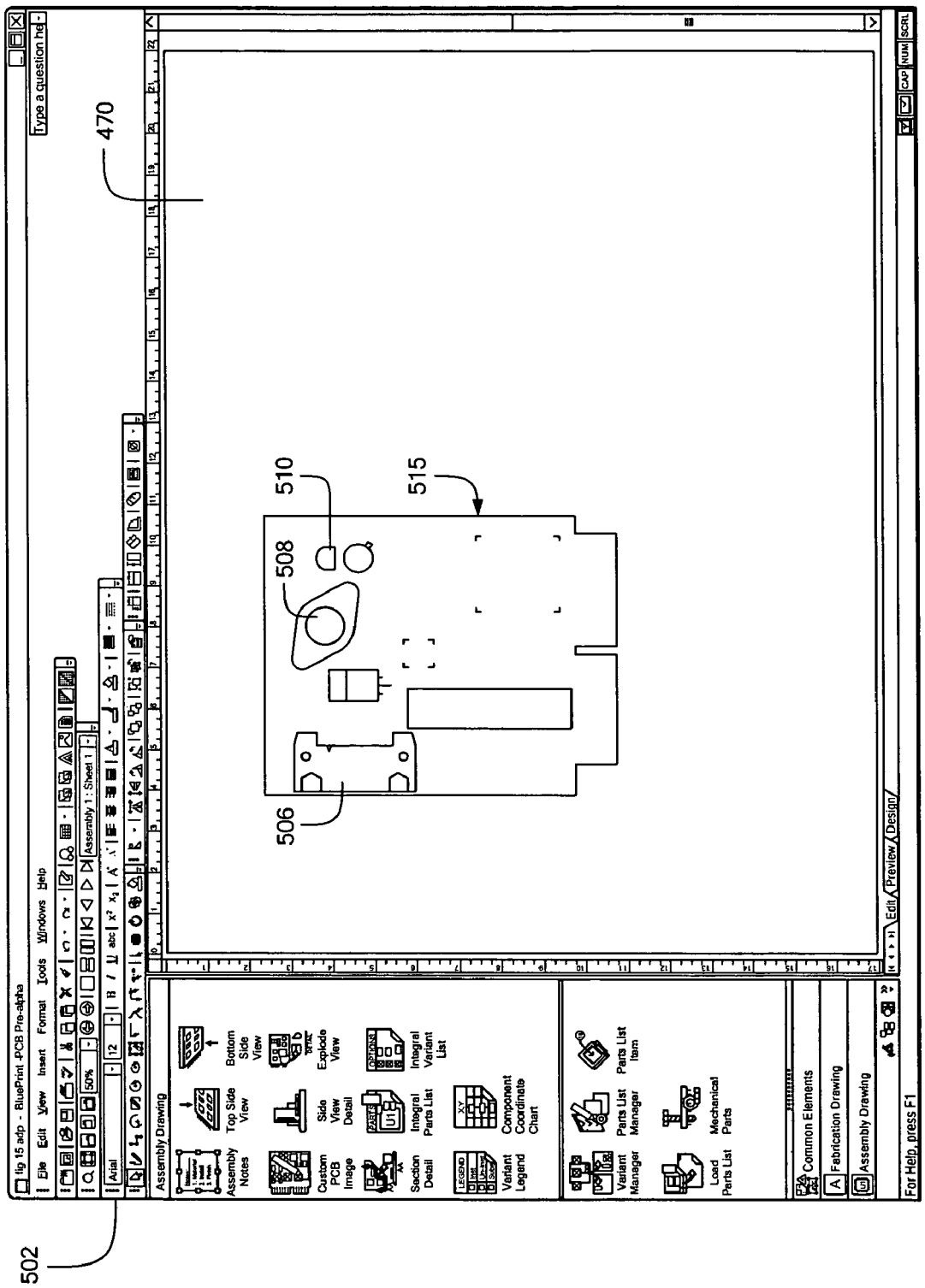
FIG. 33 is a view showing the selection of the top-side view drawing element icon to create a top-side view drawing element on the assembly drawing sheet.
Figure 34:
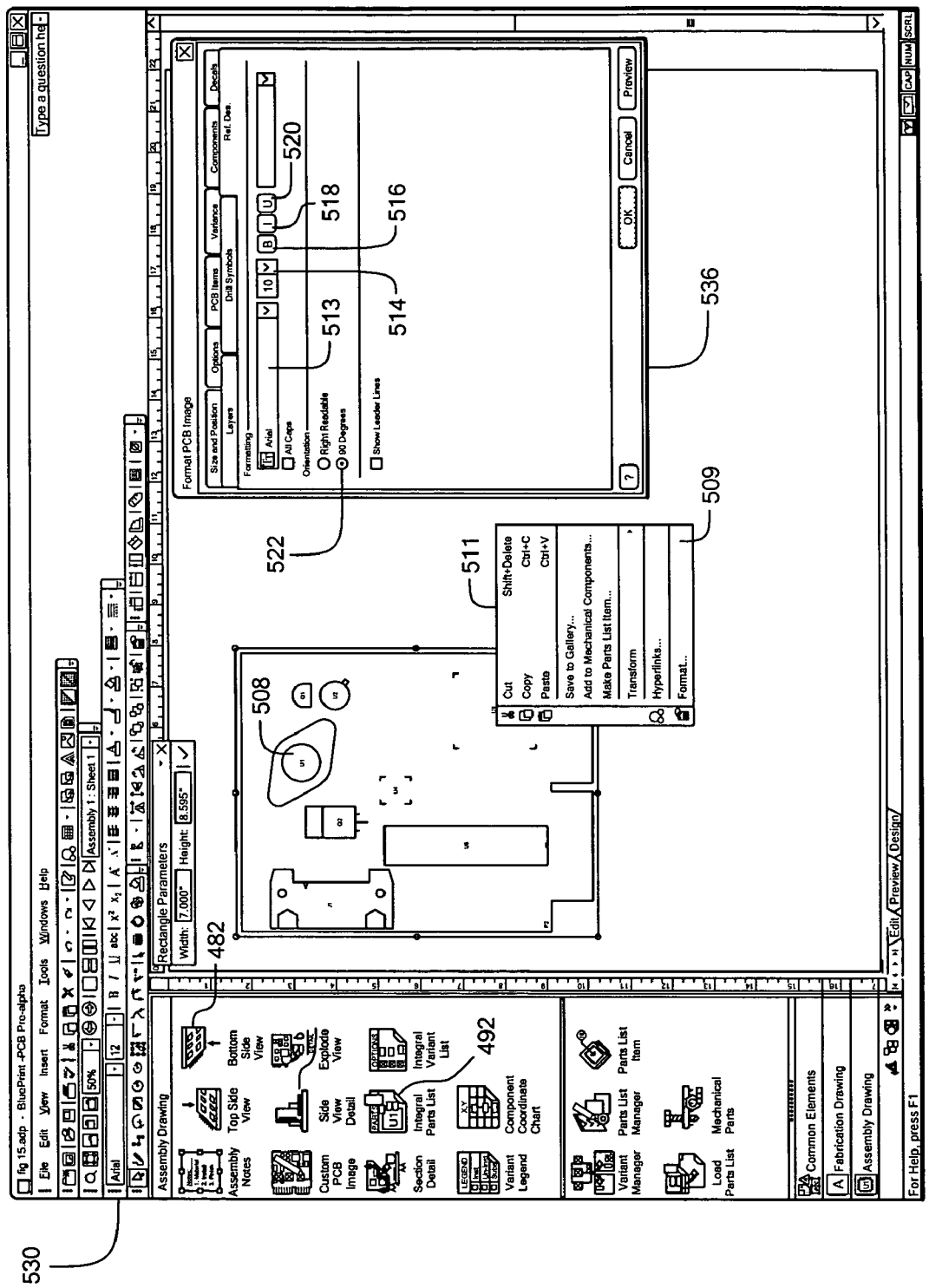
FIG. 34 is a view showing a context menu and a format PCB image properties dialog box that displays the properties associated with reference designators for the top-side view drawing element shown in FIG. 33.
Figure 35:
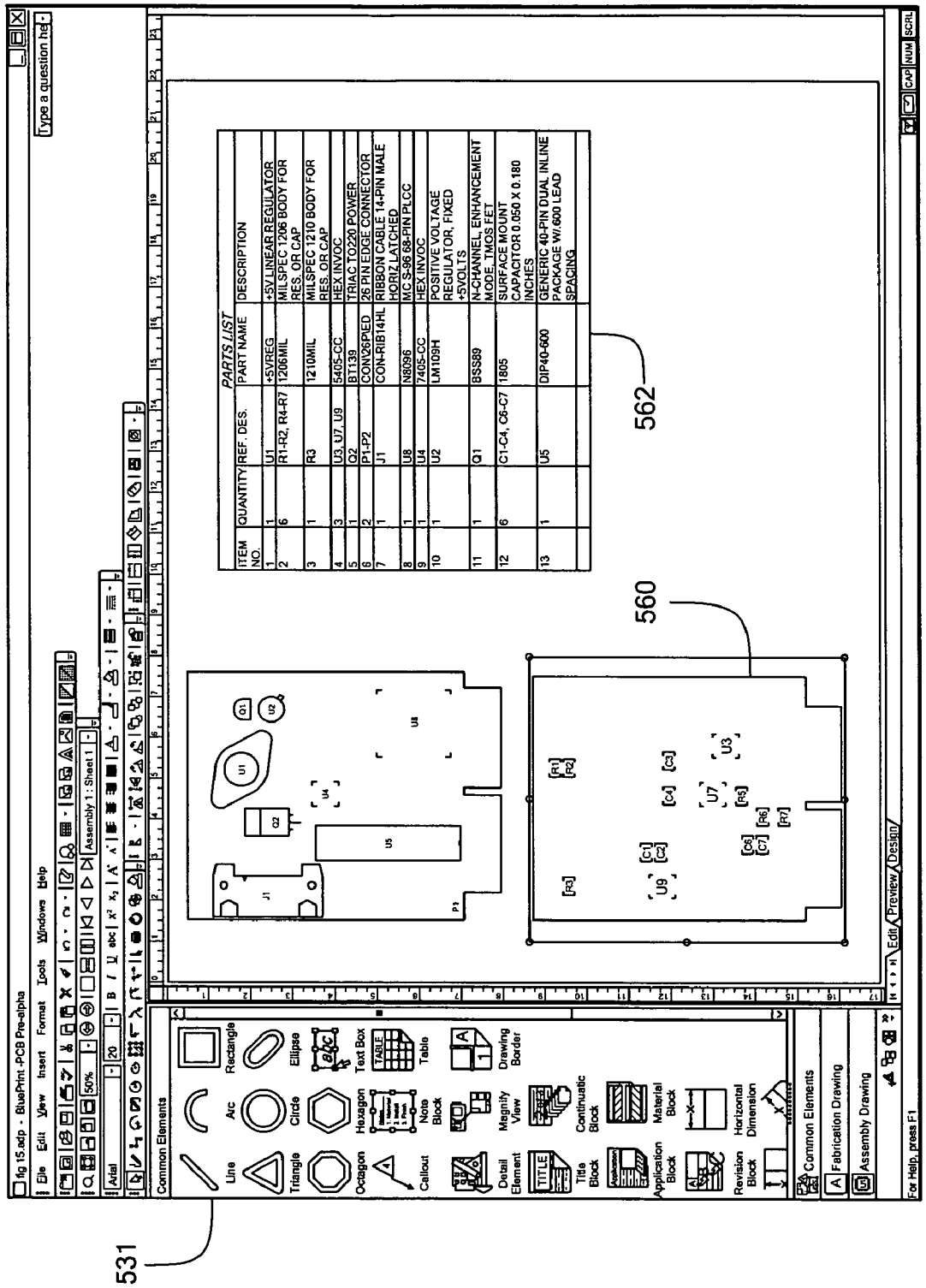
FIG. 35 is a view showing an example of the selection of a top-side view drawing element icon, a bottom-side view drawing element icon, an integral parts list drawing element icon to create the associated drawing elements created on the assembly drawing sheet.

View 502, FIG. 33, shows top-side view drawing element icon 480 is selected to generate top-side view drawing element 515 on assembly drawing sheet 470. In this example, top-side view drawing element 515 includes examples of the reference designators of the PCB design, e.g., reference designator J1, indicated at 506, reference designator U1, indicated at 508, and reference designator Q1, indicated at 510. View 530, FIG. 34, shows the properties associated all reference designators, e.g., reference designator 508, that may be modified by right clicking on the reference designator and selecting format menu item 509 in context menu 511 to generate format PCB image dialog box 536. The properties of reference designator 508 that may be modified include, for example, the font type, indicated by drop-down box 513, the font size, indicated by drop-down box 514, and whether to bold, italicize, or underline reference designators, e.g., reference designator 508, indicated by buttons 516, 518 and 520, respectively, and the orientation of reference designator 508, indicated by radio button 522. View 531, FIG. 35, shows the selection of the bottom-side view drawing element icon 482, FIG. 34, to generate bottom-side view drawing element 560, FIG. 35. Selecting integral parts list drawing element icon 492, FIG. 34, generates integral parts list drawing element 562, FIG. 35.

Figure 36:
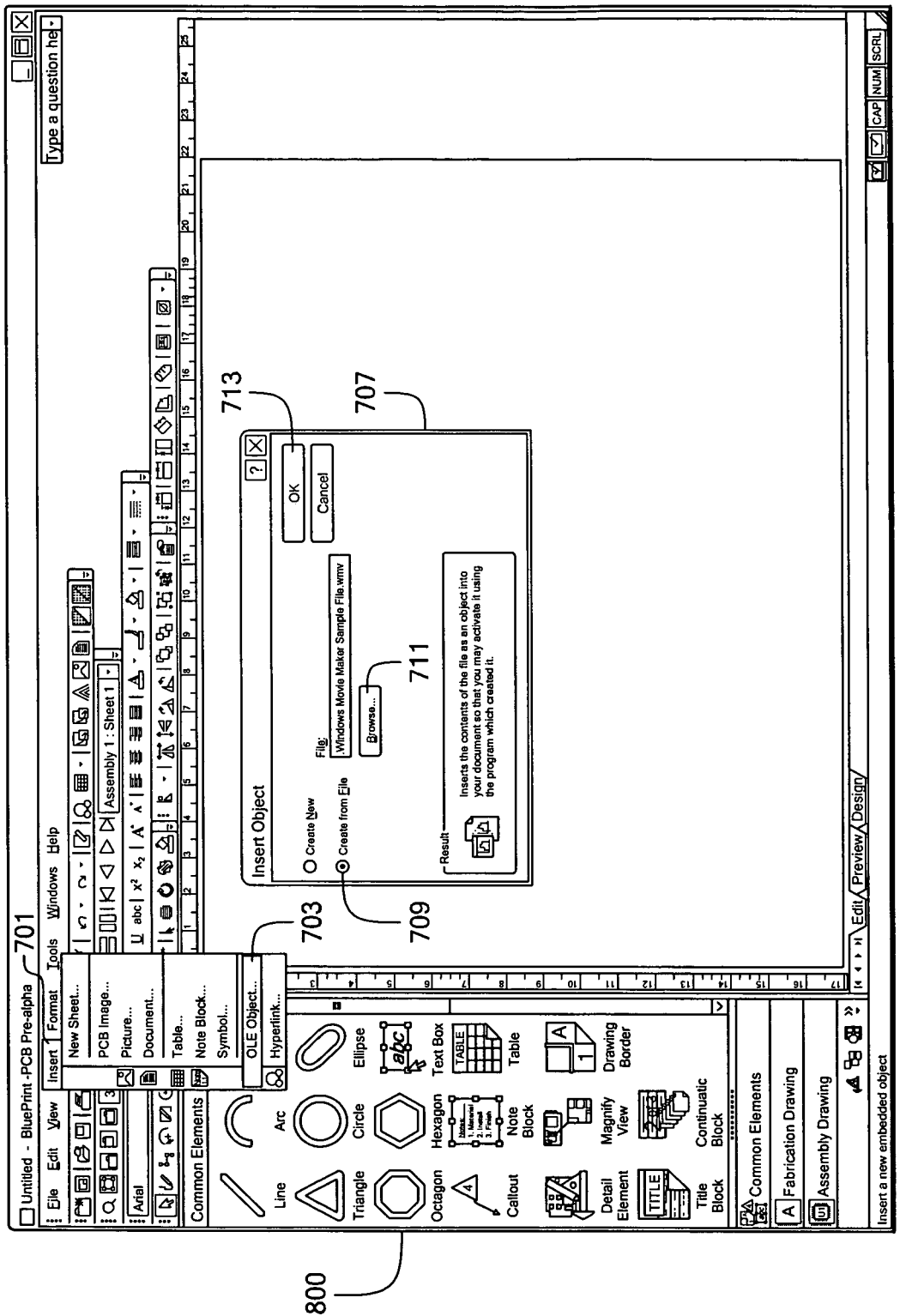
FIG. 36 is a view showing the selection of an OLE object menu item to generate an insert object dialog box used to create a hyperlink to a movie file.
Figure 37:
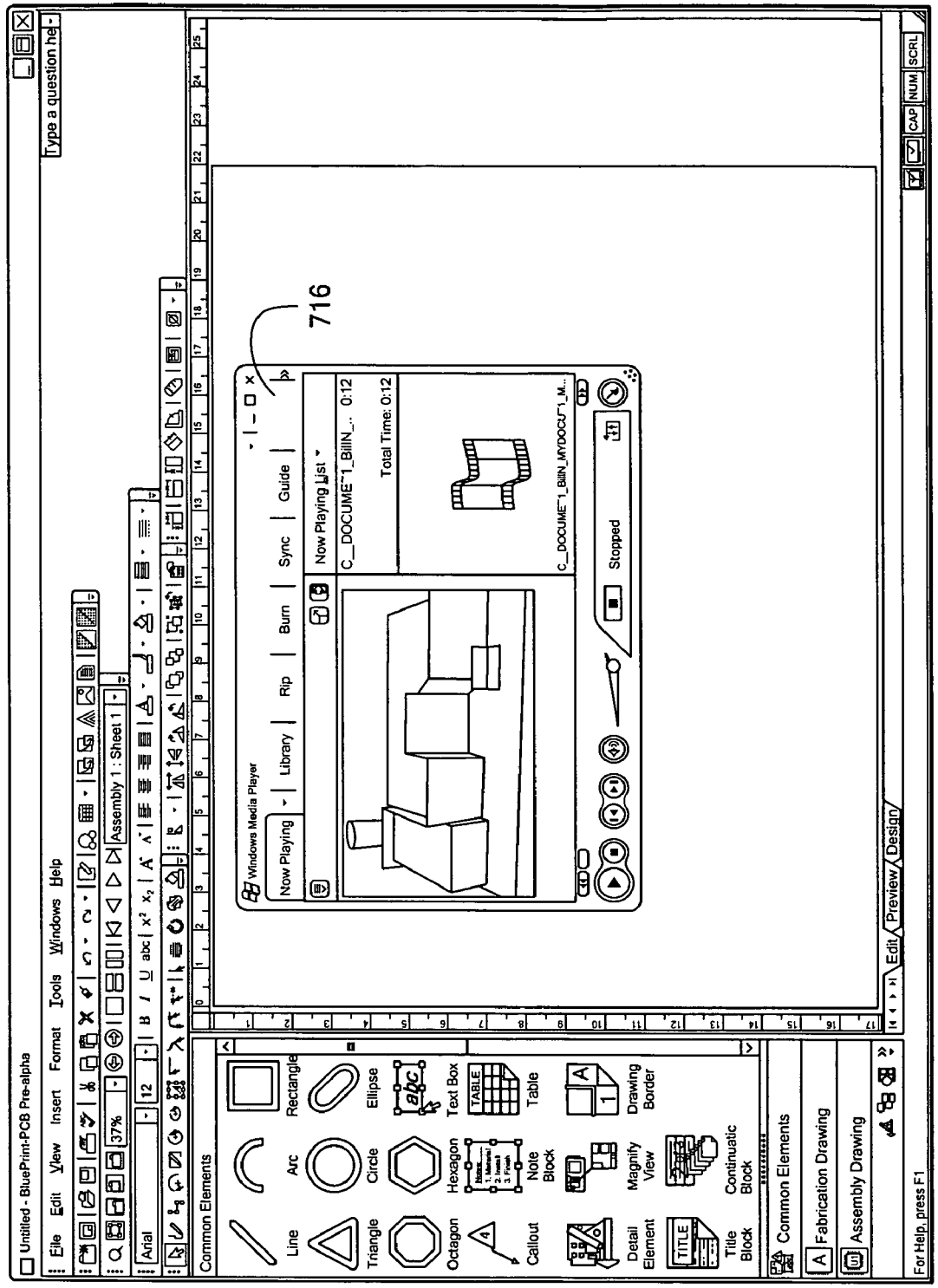
FIG. 37 is a view showing the playing of the movie file hyperlinked in FIG. 36.

View 800, FIG. 36, shows an example of the hypertext linking feature of the manufacturing documentation release package system of this invention. In this example a hypertext link is made to a movie file (e.g., Windows® Movie Maker Sample File.wmv.). Insert menu item 701 is selected and then OLE object item 703 is selected to insert object dialog box 707. Create from file radio button 709 is selected and a movie file is selected using browse button 711. OK button 713 is selected and the associated hypertext movie is displayed, in this example by Windows® Media Player 716, FIG. 37. Although in this example a movie file is hyperlinked from the fabrication drawing sheet, any type of file or object known to those skilled in the art may be linked to any of the various fabrication or assembly drawing sheets, drawing elements, or template elements described supra.

As shown above, the automated PCB documentation release package system and method of this invention efficiently and easily creates a complete manufacturing documentation release package by interactively creating and modifying various reconfigurable drawing elements and user-defined template elements on the one or more fabrication and assembly drawing sheets in one or more documents. The drawing elements are simultaneously displayed on the screen as a view of the PCB data in the PCB database on the various drawing sheets. The reconfigurable drawing elements can be interactively added, modified, re-positioned, re-sized, and the like, on the screen. The authoring tools module also provides increased authoring functionality to the documentation process. The customized templates save time and money because frequently used templates can be saved and re-used. After the documentation is complete, it can be saved as a complete manufacturing documentation release package. The result is a robust automated PCB manufacturing documentation release package system and method that is easy to use and saves time and money. Moreover, as described above, if the design of the PCB changes, the saved manufacturing documentation release package can be reloaded and linked to the new PCB CAD file, thus eliminating the need to manually re-enter the manufacturing documentation which further saves time and money.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rational underlying the amendment may bear no more than a tangential relation to many equivalents, and/or there are many other reasons the applicant can not be expected to describe certain insubstantial substitutes for any claim element amended.

What is claimed is:

1. An automated PCB manufacturing documentation release package system comprising:
   a PCB database including PCB CAD data associated with a CAD file of a PCB design;
   a shape engine configured to read the PCB CAD data and display simultaneous views of a given PCB from the PCB database including different views of the PCB and configured to create reconfigurable objects displayed simultaneously in the forms of different views of the PCB such that any change in the design of the PCB is reflected in the different views; and
   an authoring tools module interfaced with said shape engine for interactively adding and modifying said reconfigurable objects to create a manufacturing documentation release package such that any change in the design of the PCB is reflected in said manufacturing documentation release package.

2. The system of claim 1 in which said reconfigurable objects include one or more drawing elements chosen from the group consisting of: a title block, a revision block, a note block, a top view, a bottom view, a side view, a board outline, assembly components, component placement on a view, callout for said components, notes for said components, a drill pattern, a drill chart, a layer stack-up, a v-score, a finger chamfer, reference designators for said components, a parts list, assembly instructions, mechanical components, a variant list, parts list items, an integral parts list, hyperlinks between drawings, and hyperlinks to external resources.

3. The system of claim 2 further including a number of template elements for defining how the data in the PCB database may be represented in drawing elements.

4. The system of claim 3 in which said authoring tools module interfaces with said shape engine to provide for interactively adding and modifying said template elements.

5. The system of claim 3 in which said number of template elements are linked to the PCB database.

6. The system of claim 5 in which the PCB database includes one or more data tables.

7. The system of claim 5 in which the template elements are populated with the PCB CAD data in the PCB database.

8. The system of claim 2 in which said manufacturing documentation release package includes one or more documents each including one or more drawing sheets that include one or more of said drawing elements.

9. The system of claim 8 in which said one or more drawing elements can be re-positioned, re-sized, re-oriented, and annotations added thereto on said one or more drawing sheets.

10. The system of claim 8 in which said one or more drawing sheets include one or more fabrication drawing sheets.

11. The system of claim 8 in which said one or more drawing sheets include one or more assembly drawing sheets.

12. The system of claim 2 in which said PCB database includes shape data of said drawing elements, OLE objects, externally imported files, and/or ancillary data tables.

13. The system of claim 2 further including an element gallery module for storing user-defined documentation for a desired drawing element.

14. The system of claim 2 further including a graphical user interface framework interfaced with said authoring tools module, an import module, an export module, and a mechanical components gallery module.

15. The system of claim 14 in which said framework includes a main window, a taskbars and menus window, a task pane, and a workspace window.

16. The system of claim 14 in which said framework includes a plurality of selectable drawing element icons for generating said one or more drawing elements.

17. The system of claim 14 in which said framework includes a plurality of buttons for selecting a common elements pane and the associated drawing element icons for said common elements predetermined by said selectable drawing element icons to generate said one or more drawing elements.

18. The system of claim 14 in which said framework includes a plurality of buttons for selecting a fabrication drawing sheet and the associated drawing element icons for said common elements predetermined by said selectable drawing element icons to generate said one or more drawing elements.

19. The system of claim 14 in which said framework includes a plurality of buttons for selecting an assembly drawing sheet and the associated drawing element icons for said common elements predetermined by said selectable drawing element icons to generate said one or more drawing elements.

20. The system of claim 2 in which said one or more drawing elements and/or one or more template elements are included on one or more fabrication drawing sheets and/or one or more custom drawing sheets of said manufacturing documentation release package.

21. The system of claim 1 in which said shape engine links said different views and said manufacturing documentation release package to said PCB database.

22. The system of claim 1 in which said manufacturing documentation release package is stored as a file.

23. The system of claim 22 in which said file includes an ADP file.

24. The system of claim 1 in which said manufacturing documentation release package is exported in the form of a file chosen from the group consisting of DXF®, PDF®, XML®, and HTML.

25. The system of claim 1 in which said manufacturing documentation release package and said different views include views chosen from the group consisting of: a title block, a revision block, a note block, a top view, a bottom view, a side view, a board outline, assembly components, component placement on a view, callout for said components, notes for said components, a drill pattern, a drill chart, a layer stack-up, a v-score, a finger chamfer, reference designators for said components, a parts list, assembly instructions, mechanical components, a variant list, parts list items, an integral parts list, hyperlinks between drawings, and hyperlinks to external resources.

26. The system of claim 1 further including an export module for exporting said manufacturing documentation release package.

27. The system of claim 1 in which said different views and said manufacturing documentation release package include fabrication and assembly views of a PCB design.

28. The system of claim 1 further including an import module for importing said CAD file.

29. An automated PCB manufacturing documentation release package system comprising:
a GUI framework module for providing graphical interface;
an import module for importing a CAD file of a PCB design into a PCB database; and
a shape engine configured to read said PCB database and generate a hierarchy of objects including methods which interface with an authoring tools module to provide reconfigurable drawing elements displayed simultaneously in the form of different views of the PCB wherein said reconfigurable drawing elements are interactively added and modified to create a manufacturing documentation release package such that any change in the design of the PCB is reflected in said manufacturing documentation release package; and
an authoring tools module interfaced with said shape engine for interactively adding and modifying said reconfigurable objects to create a manufacturing documentation release package such that any change in the design of the PCB is reflected in said manufacturing documentation release package.

30. An automated PCB manufacturing documentation release package system comprising:
a PCB database including PCB CAD data associated with a CAD file of a PCB design; and
a shape engine configured to read the PCB CAD data and display simultaneous views of a given PCB from the PCB database including different views of the PCB and configured to create reconfigurable drawing elements displayed simultaneously in the forms of different views of the PCB such that any change in the design of the PCB is reflected in the different views; and
an authoring tools module interfaced with said shape engine for interactively adding and modifying said reconfigurable objects to create a manufacturing documentation release package such that any change in the design of the PCB is reflected in said manufacturing documentation release package.

31. The system of claim 30 further including an authoring tools module interfaced with said shape engine for interactively adding and modifying said reconfigurable drawing elements to create a manufacturing documentation release package such that any change in the design of the PCB is reflected in said manufacturing documentation release package.

32. The system of claim 30 in which said reconfigurable drawing elements include a drawing element chosen from the group consisting of: a title block, a revision block, a note block, a top view, a bottom view, a side view, a board outline, assembly components, component placement on a view, callout for said components, notes for said components, a drill pattern, a drill chart, a layer stack-up, a v-score, a finger chamfer, reference designators for said components, a parts list, assembly instructions, mechanical components, a variant list, parts list items, an integral parts list, hyperlinks between drawings, and hyperlinks to external resources.

33. An automated PCB manufacturing documentation release package system comprising:
- a PCB database including PCB CAD data associated with a CAD file of a PCB design; and
- a shape engine configured to retrieve the PCB CAD data in the PCB database to create reconfigurable objects displayable simultaneously in the forms of different views of the PCB wherein said reconfigurable objects are modified and annotated to create a manufacturing documentation release package linked to said PCB CAD data such that a change in the design of the PCB is reflected in the said manufacturing documentation release package and said different views; and
- an authoring tools module interfaced with said shape engine for interactively adding and modifying said reconfigurable objects to create a manufacturing documentation release package such that any change in the design of the PCB is reflected in said manufacturing documentation release package.

34. A method for providing automated PCB documentation and a release package, the method comprising the steps of:
- importing a CAD file of a PCB design into a PCB database;
- displaying simultaneous views of a given PCB from said PCB database including different views of the PCB;
- retrieving the data in said PCB database; and
- generating reconfigurable objects displayed simultaneously in said different views of said PCB such that any changes in the design of the PCB are reflected in the different views; and
- interactively modifying and annotating said reconfigurable objects to create a manufacturing documentation release package such that any change in the design of the PCB is reflected in said manufacturing documentation release package.

* * * * *